US010728669B2

(12) United States Patent
Choi et al.

(10) Patent No.: US 10,728,669 B2
(45) Date of Patent: Jul. 28, 2020

(54) DISPLAY APPARATUS

(71) Applicant: LG Display Co., Ltd., Seoul (KR)

(72) Inventors: YeongRak Choi, Paju-si (KR); KwanHo Park, Incheon (KR); Sungtae Lee, Incheon (KR)

(73) Assignee: LG Display Co., Ltd, Seoul (KR)

( * ) Notice: Subject to any disclaimer, the term of this patent is extended or adjusted under 35 U.S.C. 154(b) by 19 days.

(21) Appl. No.: 15/964,822

(22) Filed: Apr. 27, 2018

(65) Prior Publication Data

US 2018/0317011 A1 Nov. 1, 2018

(30) Foreign Application Priority Data

Apr. 29, 2017 (KR) ........................ 10-2017-0055814

(51) Int. Cl.

*H03G 3/00* (2006.01)
*H04R 25/00* (2006.01)
*H04R 7/04* (2006.01)
*H04R 9/02* (2006.01)
*H04R 9/06* (2006.01)
*H04R 1/02* (2006.01)
*H04R 9/04* (2006.01)

(52) U.S. Cl.

CPC ............... *H04R 7/04* (2013.01); *H04R 1/025* (2013.01); *H04R 9/025* (2013.01); *H04R 9/06* (2013.01); *H04R 9/063* (2013.01); *H04R 9/045* (2013.01); *H04R 2201/029* (2013.01); *H04R 2400/03* (2013.01); *H04R 2440/07* (2013.01); *H04R 2499/15* (2013.01)

(58) Field of Classification Search

CPC .............. H04R 1/025; H04R 2201/029; H04R 2400/03; H04R 2440/07; H04R 2499/15; H04R 7/04; H04R 9/025; H04R 9/045; H04R 9/06; H04R 9/063

USPC ......... 381/62, 152, 162, 164, 191, 403, 405, 381/407

See application file for complete search history.

(56) References Cited

U.S. PATENT DOCUMENTS 4,384,252 A * 5/1983 Kolter ..................... G01P 3/488 324/207.16
4,891,842 A * 1/1990 Green .................... H04R 1/025 181/150
5,025,474 A * 6/1991 Tanaka ................. G03B 21/565 181/148

(Continued)

FOREIGN PATENT DOCUMENTS

CN 1189078 A 7/1998
CN 1930910 A 3/2007

(Continued)

OTHER PUBLICATIONS

First Notification of Office Action dated Jan. 3, 2020, issued in corresponding Chinese Patent Office Action No. 201810400162.2.

(Continued)

*Primary Examiner* — Khai N. Nguyen
(74) *Attorney, Agent, or Firm* — Morgan, Lewis & Bockius LLP

(57) ABSTRACT

A display apparatus includes a display panel configured to display an image by emitting light, and a sound generating device on a rear surface of the display panel. The sound generating device includes a bobbin, and a protection member on the bobbin.

27 Claims, 34 Drawing Sheets

(56) References Cited

U.S. PATENT DOCUMENTS

| | | | | |
|---|---|---|---|---|
| 9,127,112 | B2* | 9/2015 | Kosaka | C08F 297/08 |
| 9,818,805 | B2* | 11/2017 | Choi | G06F 1/1637 |
| 10,009,683 | B2* | 6/2018 | Choi | G06F 1/1605 |
| 10,129,646 | B2* | 11/2018 | Choi | H04N 5/642 |
| 10,142,738 | B2* | 11/2018 | Choi | H04N 5/642 |
| 10,142,739 | B2* | 11/2018 | Choi | H04N 5/642 |
| 10,219,079 | B2* | 2/2019 | Choi | H04N 5/642 |
| 10,237,656 | B2* | 3/2019 | Lee | H04R 1/288 |
| 2005/0254682 | A1* | 11/2005 | Maekawa | H04R 9/043 381/404 |
| 2006/0009251 | A1* | 1/2006 | Noda | H01Q 1/22 455/550.1 |
| 2006/0158845 | A1* | 7/2006 | Kim | G06F 1/1601 361/679.46 |
| 2007/0206822 | A1 | 9/2007 | Whitwell et al. | |
| 2008/0304694 | A1 | 12/2008 | Hayashi | |
| 2009/0034759 | A1* | 2/2009 | Ko | H04N 5/642 381/152 |
| 2010/0303278 | A1* | 12/2010 | Sahyoun | H04R 9/043 381/398 |
| 2012/0243719 | A1* | 9/2012 | Franklin | G06F 1/1652 381/333 |
| 2014/0213728 | A1* | 7/2014 | Kosaka | C08F 297/08 525/97 |
| 2015/0078604 | A1* | 3/2015 | Seo | H04R 1/028 381/333 |
| 2015/0341714 | A1 | 11/2015 | Ahn et al. | |
| 2016/0219371 | A1 | 7/2016 | Tsutsumi et al. | |
| 2017/0055353 | A1* | 2/2017 | Park | H05K 1/0215 |
| 2017/0280234 | A1* | 9/2017 | Choi | G06F 1/1605 |
| 2017/0280246 | A1* | 9/2017 | Choi | H04N 5/642 |
| 2017/0280249 | A1* | 9/2017 | Choi | H04N 5/642 |
| 2017/0287990 | A1* | 10/2017 | Choi | G06F 1/1637 |
| 2017/0289694 | A1* | 10/2017 | Choi | G06F 1/1605 |
| 2018/0317011 | A1* | 11/2018 | Choi | H04R 1/025 |

FOREIGN PATENT DOCUMENTS

| | | | |
|---|---|---|---|
| CN | 101321410 | A | 12/2008 |
| CN | 105096778 | A | 11/2015 |
| CN | 105765995 | A | 7/2016 |
| CN | 106406432 | A | 2/2017 |
| JP | 2012-198407 | A1 | 10/2012 |
| KR | 101704517 | B1 | 2/2017 |
| WO | 98/28942 | A1 | 7/1998 |
| WO | 2009/017280 | A1 | 2/2009 |

OTHER PUBLICATIONS

A Travel to the Science Museum of Dongguan, Apr. 30, 2008 (as cited in Chinese Office Action).

Second Notification of Office Action dated May 8, 2020, issued in corresponding Chinese Patent Office Action No. 201810400162.2.

* cited by examiner

DISPLAY APPARATUS

CROSS REFERENCE TO RELATED APPLICATIONS

This application claims the benefit of the Korean Patent Application No. 10-2017-0055814 filed on Apr. 29, 2017, which is hereby incorporated by reference as if fully set forth herein.

BACKGROUND

Technical Field

The present disclosure relates to a display apparatus, and in detail, to a display apparatus for generating sound by vibrating a display panel.

Discussion of the Related Art

With the advancement of an information-oriented society, various requirements for the display field of expressing information in accordance with an electric information signal are increasing, and thus, research is being conducted on various display devices that are thin, light, and have low power consumption.

For example, the display apparatuses may be categorized into a liquid crystal display (LCD) apparatus, a field emission display (FED) apparatus, an organic light emitting display (OLED) apparatus, etc.

Among the above display apparatuses, the LCD apparatus may include an array substrate including a thin film transistor, an upper substrate including a color filter and/or black matrix, and a liquid crystal layer interposed between the array substrate and the upper substrate. An alignment state of the liquid crystal layer is controlled based on an electric field applied to two electrodes of a pixel region, whereby light transmittance is adjusted based on the alignment state of the liquid crystal layer, to thereby display an image.

The OLED apparatus, which is a self-light-emitting display device, has advantages of low power consumption, fast response speed, high light-emitting efficiency, high luminance and wide viewing angle.

Generally, a display apparatus displays an image on a display panel, and an additional speaker for supplying sound has to be provided. If the speaker is provided in the display apparatus, the sound generated in the speaker typically advances toward a lower or rear portion of the display panel instead of a front portion of the display panel. Thus, the sound does not advance toward the front portion of the display panel, that is, toward a user who watches the image displayed on the display panel, and this disrupts a user's immersion.

Furthermore, as the sound generated in the speaker advances toward the lower or rear portion of the display panel, sound quality is deteriorated due to interference with sound reflected on the wall or floor.

Furthermore, when a speaker is included in a set apparatus such as a television, the speaker occupies a space that may impose a restriction on design and a spatial disposition of the set apparatus.

SUMMARY

Accordingly, embodiments of the present disclosure are directed to a display apparatus that substantially obviates one or more problems due to limitations and disadvantages of the related art.

Through various experiments, a display apparatus has been researched that facilitates the output of sound to a front direction of a display panel, that is, toward a user who watches an image displayed on the display panel, and with improved sound quality.

An object of embodiments of the present disclosure is to provide a display apparatus including a sound generating device capable of outputting sound to a front direction of a display panel.

Another object of embodiments of the present disclosure is to provide a sound generating device with a structure capable of improving an adhesive strength between a sound generating device and a display panel.

Additional advantages and features of the disclosure will be set forth in part in the description that follows, and in part will be apparent from the disclosure, or may be learned by practice of embodiments of the disclosure. The objectives and other advantages of embodiments of the disclosure may be realized and attained by the structure particularly pointed out in the written description and claims hereof as well as the appended drawings.

To achieve these and other advantages and in accordance with embodiments of the disclosure, as embodied and broadly described herein, a display apparatus may comprise a display panel configured to display an image by emitting light, and a sound generating device on a rear surface of the display panel, wherein the sound generating device includes a bobbin and a protection member on the bobbin.

In another aspect of an embodiment of the present disclosure, there is provided a display apparatus that may comprise a display panel configured to display an image by emitting light, the display panel having a first area and a second area, at least one sound generator including a sound generating device and a protection member on the sound generating device, and at least one partition between the first and second areas, wherein a first of the at least one sound generators is in one of the first and second areas of the display panel.

In another aspect of an embodiment of the present disclosure, a display apparatus may comprise a display panel configured to display an image by emitting light, the display panel having first, second, and third areas, a sound generating device in each of the first and second areas of the display panel and configured to vibrate the display panel to generate sound, a protection member on the sound generating device, at least one first partition between the first area and the third area, and at least one second partition between the second area and the third area.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this disclosure, illustrate embodiment(s) of the disclosure and together with the description serve to explain the principle of the disclosure. In the drawings.

DETAILED DESCRIPTION

Figure 1A:
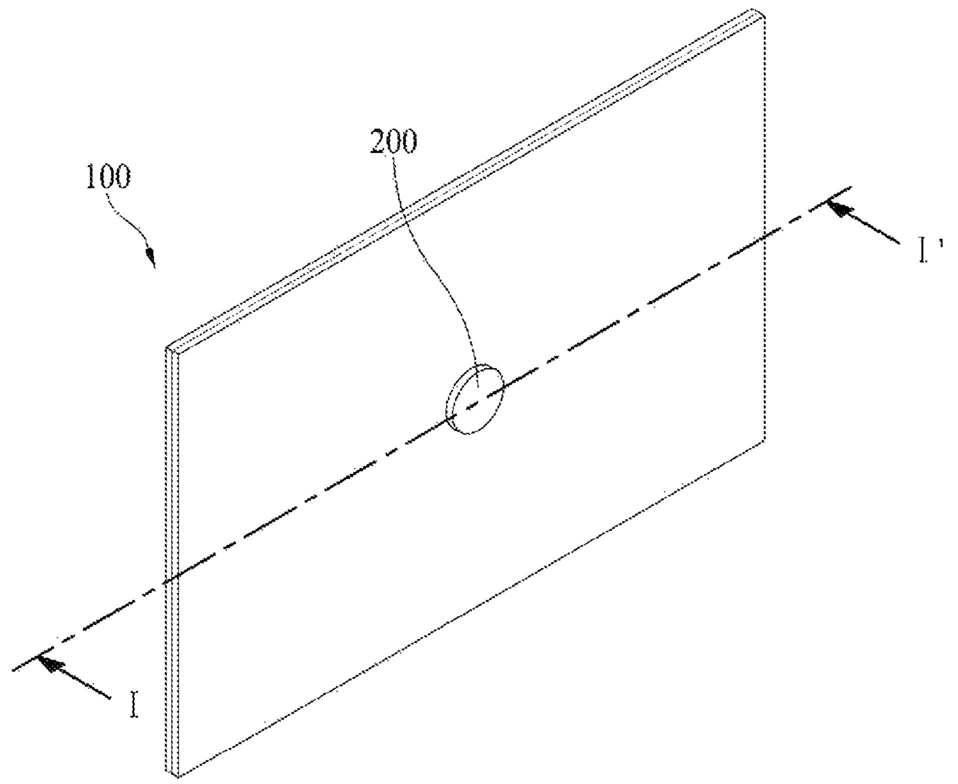
FIG. 1A illustrates a display apparatus including a sound generating device according to an example embodiment of the present disclosure.

Reference will now be made in detail to some embodiments of the present disclosure, examples of which are illustrated in the accompanying drawings. Where possible, the same reference numbers may be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of the claims.

A shape, a size, a ratio, an angle, and a number disclosed in the drawings for describing embodiments of the present disclosure are merely an example, and thus, the present disclosure is not limited to the illustrated details. In the following description, when the detailed description of the relevant known function or configuration is determined to unnecessarily obscure the important point of the present disclosure, the detailed description will be omitted. In a case where ‘comprise’, ‘have’, and ‘include’ described in the present disclosure are used, another part may be added unless ‘only~’ is used. The terms of a singular form may include plural forms unless referred to the contrary.

In construing an element, the element is construed as including an error region although there is no explicit description.

In describing a position relationship, for example, when the positional order is described as ‘on~’, ‘above~’, ‘below~’, and ‘next~’, a case which is not contact may be included unless ‘just’ or ‘direct’ is used.

In describing a time relationship, for example, when the temporal order is described as ‘after~’, ‘subsequent~’, ‘next~’, and ‘before~’, a case which is not continuous may be included unless ‘just’ or ‘direct’ is used.

In description of the present disclosure, the terms “first”, “second”, “A”, “B”, “(a)”, “(b)”, and etc. may be used herein to describe various elements. These terms are only used to distinguish one element from another. That is, the essence, order, sequence, or number of the corresponding elements is not limited by these terms. For example, a first element could be termed a second element, and, similarly, a second element could be termed a first element, without departing from the scope of the present disclosure. In description of embodiments of the present disclosure, when one structure is described as being “connected”, “combined”, or “contact” with another structure, this description should be construed as including a case where the structures contact each other and moreover, a case where a third structure is disposed therebetween.

In description of embodiments of the present disclosure, the display apparatus may be a liquid crystal module (LCM) or an organic light emitting display (OLED) module that includes a display panel and a driving unit for driving the display panel. And, the display apparatus according to the present disclosure may further include equipment displays including complete products or final products having LCM or OLED modules, for example, a notebook computer or a laptop computer, a television, a computer monitor, an automotive display, a vehicle display (or an equipment display) for a vehicle other than an automobile, and set electronic devices or set devices (set apparatus) such as a mobile electronic device (e.g., a smart phone or an electronic pad).

Accordingly, the display apparatus according to the present disclosure may include application products or set apparatuses such as final products including the LCM and OLED modules, as well as display apparatuses such as LCM and OLED modules.

The LCM and OLED modules comprised of a display panel and a driving unit thereof may in some examples be referred to as "display apparatus," and the electronic device of the final product including the LCM and OLED modules may be differently referred to as "set apparatus" or "set device." For example, the display apparatus may include a liquid crystal display (LCD) panel or an organic light emitting diode (OLED) display panel and a source PCB as a controller for driving the same, and the set device may further include a set PCB that is a controller set to be electrically connected to the source PCB and to control the overall operations of the set device or the set apparatus.

The display panel used for the embodiment of the present disclosure may be all types of display panels, for example, a liquid crystal display panel, an organic light emitting display panel, an electroluminescent display panel, etc., but is not limited to these types. For example, the display panel of the present disclosure may be any panel capable of generating sound in accordance with a vibration by a sound generating device. And, the display panel used for example embodiments of the present disclosure is not limited in its shape or size.

In an example with a liquid crystal display panel, the liquid crystal display panel may include a plurality of gate lines, a plurality of data lines, and a plurality of pixels provided in respective intersections of the gate and data lines. Also, the liquid crystal display panel may include an array substrate including a thin film transistor corresponding to a switching device for controlling a light transmittance for each pixel, an upper substrate including a color filter and/or black matrix, and a liquid crystal layer formed between the array substrate and the upper substrate.

In an example with an organic light emitting display panel, the organic light emitting display panel may include a plurality of gate lines, a plurality of data lines, and a plurality of pixels provided in respective intersections of the gate and data lines. Also, the organic light emitting display panel may include an array substrate including a thin film transistor corresponding to a device for selectively applying a voltage to each pixel, an organic light emitting device layer on the array substrate, and an encapsulation substrate disposed on the array substrate so as to cover the organic light emitting device layer. The encapsulation substrate protects the thin film transistor and the organic light emitting device layer from an external shock, and prevents moisture or oxygen from being permeated into the organic light emitting device layer. Also, the organic light emitting device layer provided on the array substrate may be changed to an inorganic light emitting layer, for example, nano-sized material layer or quantum dot material layer.

The display panel may further include a backing such as a metal plate attached to a rear surface of the display panel, but is not limited to the metal plate, and other structure may be included.

The display panel including the sound generating device according to an example embodiment of the present disclosure may be implemented at a user interface module in a vehicle, such as the central control panel area in an automobile. For example, such a display panel may be configured between two front seat occupants such that sounds due to vibrations of the display panel propagate towards the interior of the vehicle. As such, the audio experience within a vehicle may be improved when compared to having speakers only at the interior sides in the vehicle.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display apparatus according to example embodiments of the present disclosure will be described in detail with reference to the accompanying drawings.

FIG. 1A illustrates a display apparatus including a sound generating device according to an example embodiment of the present disclosure.

With reference to FIG. 1A, the display apparatus includes a display panel 100, and a sound generating device 200 for generating sound by vibrating the display panel 100. The sound generating device 200 may be referred to as an actuator, exciter, or transducer.

Figure 1B:
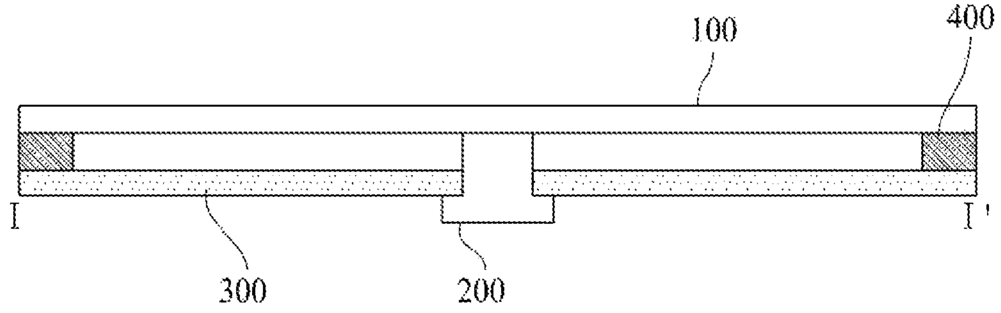
FIG. 1B is a cross-sectional view taken along I-I' of FIG. 1A.

FIG. 1B is a cross-sectional view taken along I-I' of FIG. 1A. With reference to FIG. 1B, the display apparatus may include the sound generating device 200 and a supporting member 300.

The supporting member 300 may support at least one of rear and side (lateral) surfaces of the display panel 100. The sound generating device 200 may be fixed to the supporting member 300.

In this disclosure, for example, the supporting member 300 may be a cover bottom. And, the supporting member 300 may include a middle cabinet provided to surround a lateral surface of the display panel 100, connected with the cover bottom, and to accommodate one periphery of the display panel 100 so as to support the display panel 100. For example, the middle cabinet may have "┤"-shaped cross section. The supporting member 300 may include the cover bottom, or may include the cover bottom and the middle cabinet, but is not limited to this structure. The supporting member 300 may include any structure capable of supporting the rear surface or lateral surface of the display panel 100.

The supporting member 300 may be a plate-shaped member formed over a rear surface or entire surface of the display panel 100.

The supporting member 300 according to the present disclosure may be referred to as a cover bottom, a plate bottom, a back cover, a base frame, a metal frame, a metal chassis, a chassis base, or an m-chassis. Thus, the supporting member 300 may be embodied in all types of frames or plate-shape structures which are used as a supporter for supporting the display panel 100, and are disposed at the rear surface of the display apparatus.

And, an adhesion member 400 is disposed in the periphery of the supporting member 300 and the display panel 100. The adhesion member 400 is provided to adhere the display panel 100 and the supporting member 300 to each other, and the adhesion member 400 may be a double-sided tape, but is not limited thereto.

Figure 2A:
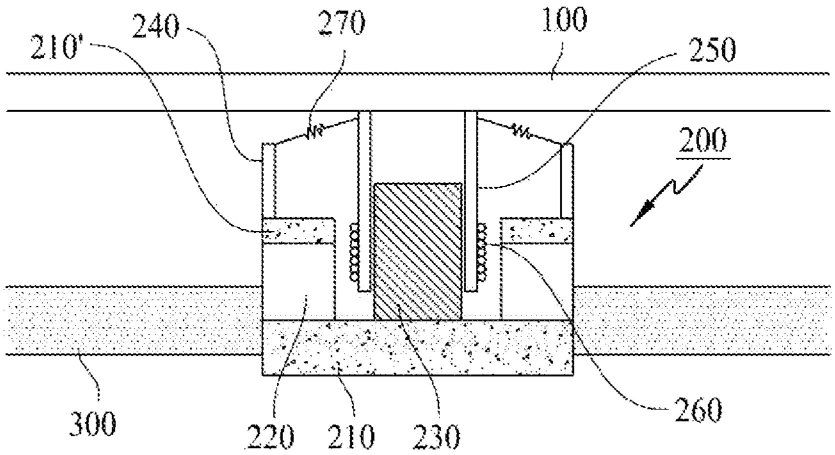
FIGS. 2A and 2B are cross-sectional views illustrating the sound generating device according to the example embodiment of the present disclosure.
Figure 2B:
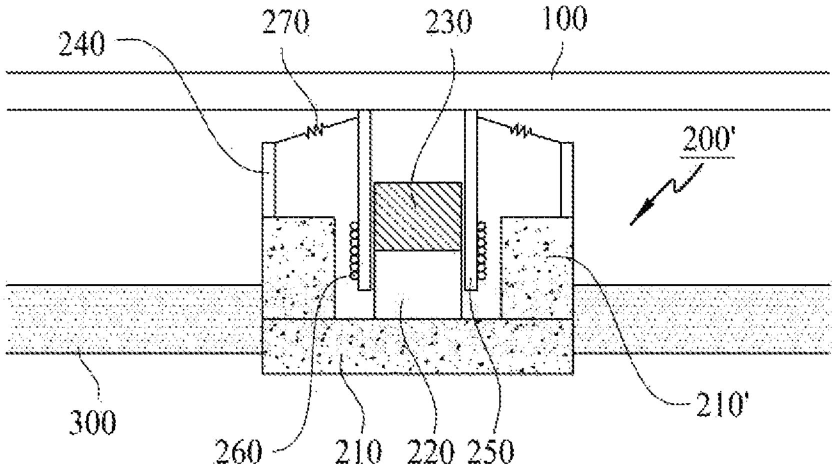

FIGS. 2A and 2B are cross-sectional views illustrating the sound generating device according to the example embodiment of the present disclosure.

The sound generating device may be categorized into a first structure corresponding to an external magnetic type where a magnet is disposed at an external side of a coil, and a second structure corresponding to an internal magnetic type where a magnet is disposed at an internal side of a coil. The first structure may be expressed as a dynamic type or external magnetic type, and the second structure may be expressed as a micro type or internal magnetic type.

FIG. 2A illustrates the first structure, and FIG. 2B illustrates the second structure.

With reference to FIG. 2A, the sound generating device 200 may include plates 210 and 210', a magnet 220 on the plate 210, a center pole 230 on the plate 210, a bobbin 250 disposed around the center pole 230, and a coil 260 wound on an outer surface of the bobbin 250.

In detail, the magnet 220 is disposed on the first plate 210, and the second plate 210' is disposed on the magnet 220. The first plate 210 and the second plate 210' support the magnet 220 and fix the sound generating device 200 to the supporting member 300. Accordingly, the first plate 210 may be fixed to a supporting hole formed in the supporting member 300, and the magnet 220 may be fixedly supported between the first plate 210 and the second plate 210'.

At least one of the first plate 210 and the second plate 210' may be formed of a magnetic material such as iron (Fe). The first plate 210 and the second plate 210' are not limited to these terms, and they may be referred to as yokes.

The magnet 220 may use a sintered magnet of barium ferrite, and the magnet 220 may be formed of ferric oxide ($Fe2O_3$), barium carbonate ($BaCO_3$), neodymium (Nd) magnet, strontium ferrite with improved magnetic component, aluminum (Al), nickel (Ni), or alloy-casting magnet of cobalt (Co), but is not limited to these materials. For example, the neodymium magnet may be neodymium-iron-boron (Nd—Fe—B).

Then, a frame 240 is disposed on the second plate 210' along the periphery of the first plate 210. The center pole 230 is disposed on the center of the first plate 210. The center pole 230 and the first plate 210 may be formed as one body. The center pole 230 may be referred to as pole pieces. Also, pole pieces may be additionally provided on the center pole 230.

The bobbin 250 is disposed to surround the center pole 230. The coil 260 is wound on a lower outer area, for example, a lower outer surface of the bobbin 250, and a current or a voice signal for generating sound is applied to the coil 260.

The bobbin 250 may be a ring-shaped structure of paper or aluminum sheet, and the coil 260 may be wound on some area of the lower portion of the bobbin 250. The bobbin 250 and the coil 260 may be referred to as a voice coil.

A damper 270 may be disposed between some area of an upper portion of the bobbin 250 and the frame 240, and the damper 270 may be expressed by other terms such as an edge.

FIG. 2B illustrates the second structure where a magnet is disposed at an internal side of a coil.

With reference to FIG. 2B, the sound generating device 200' of the second structure includes a magnet 220 on a first plate 210, a center pole 230 on the magnet 220, a bobbin 250 disposed around the magnet 220 and the center pole 230, and a coil 260 wound on an outer surface of the bobbin 250.

In detail, the first plate 210 may be fixed to a supporting hole formed in the supporting member 300. The magnet 220 is disposed on the first plate 210, and the center pole 230 is disposed on the magnet 220. The center pole 230 may be referred to as pole pieces. Also, pole pieces may be additionally provided on the center pole 230.

The bobbin 250 is disposed to surround the magnet 220 and the center pole 230, and the coil 260 is wound on the outer surface of the bobbin 250.

A second plate 210' is disposed around the outer periphery of the first plate 210, and a frame 240 is disposed outside the periphery of the second plate 210'. Also, a damper 270 is disposed between the frame 240 and the bobbin 250.

In comparison to the first structure where the magnet is disposed at the external side of the coil, the second structure has advantages of small leakage magnetic flux and decreased entire size of the sound generating device.

The sound generating device used for the display apparatus according to the example embodiment of the present disclosure is not limited to the structures of FIGS. 2A and 2B. It may be possible to use any sound generating device capable of generating the sound by vibrating the display panel.

Figure 3A:
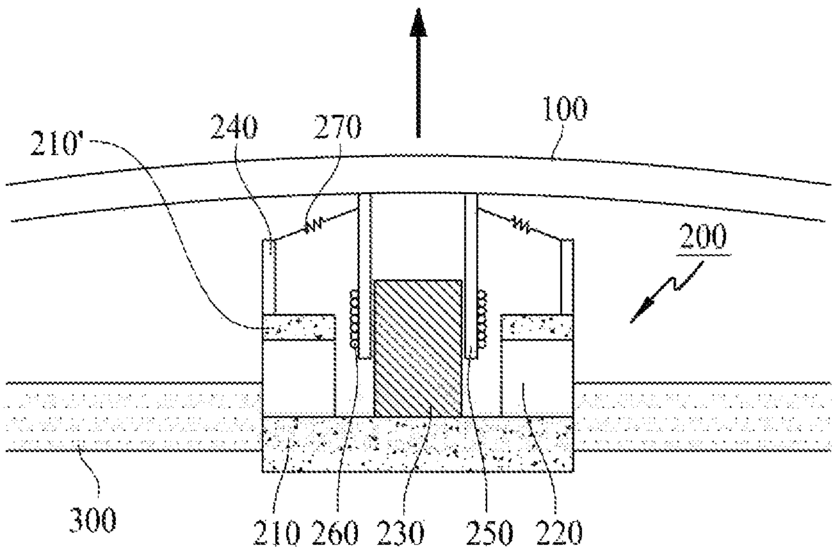
FIGS. 3A and 3B illustrate a sound generating method of the sound generating device with a first structure according to the example embodiment of the present disclosure.
Figure 3B:
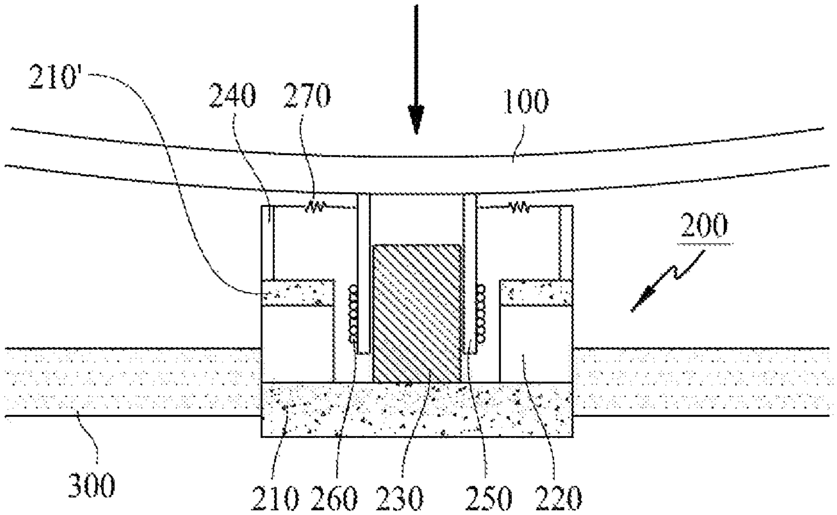

FIGS. 3A and 3B illustrate a sound generating method of the sound generating device with the first structure according to the example embodiment of the present disclosure.

FIG. 3A shows a state which a current is applied. The center pole 230 connected with a lower surface of the magnet 220 becomes the N pole, and the second plate 210' connected with an upper surface of the magnet 220 becomes the S pole, whereby an external magnetic field is generated between the coil 260.

In this state, if the current for generating sound is applied to the coil 260, an applied magnetic field is formed around the coil 260, whereby a force for upwardly moving the bobbin 250 is generated by the applied magnetic field and the external magnetic field. In detail, if the current is applied to the coil 260, the magnetic field is generated around the coil 260, and the external magnetic field is generated by the magnet 220, whereby the entire bobbin 250 is guided and moved upward by the center pole 230 based on Fleming's law.

As one surface of the bobbin 250 is in contact with the rear surface of the display panel 100, the display panel 100 is vibrated in an upper direction (indicated by an arrow) according to whether or not the current is applied to the coil 260, and a sound wave (or sound) is generated by the vibration of the display panel 100.

In this state, if the current is stopped or a current is applied in the opposite direction, as shown in FIG. 3B, a force of downwardly moving the bobbin 250 is generated based on the principles of FIG. 3A, whereby the display panel 100 is vibrated in a lower direction (indicated by an arrow).

The damper 270 is disposed between the frame 240 and the upper portion of the bobbin 250. The damper 270 is formed in a wrinkled structure having elasticity, whereby the damper 270 controls the up-and-down vibration of the bobbin 250 by contraction and relaxation movements in accordance with the up-and-down movement of the bobbin 250. That is, the damper 270 is connected with the bobbin 250 and the frame 240, whereby the up-and-down vibration of the bobbin 250 may be controlled by a restoring force of the damper 270. In detail, if the bobbin 250 vibrates to be higher or lower than a predetermined height, the bobbin 250 may be restored to its original position by the restoring force of the damper 270.

According to the direction and level of the current applied to the coil 260, the display panel 100 may be vibrated in the up-and-down direction so that it is possible to generate the sound wave by the vibration.

Figure 4A:
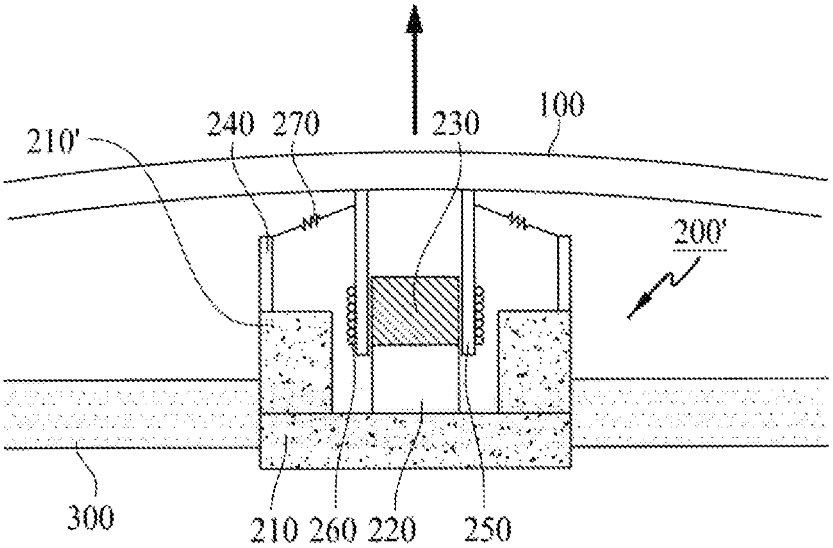
FIGS. 4A and 4B illustrate a sound generating method of the sound generating device with a second structure according to the example embodiment of the present disclosure.
Figure 4B:
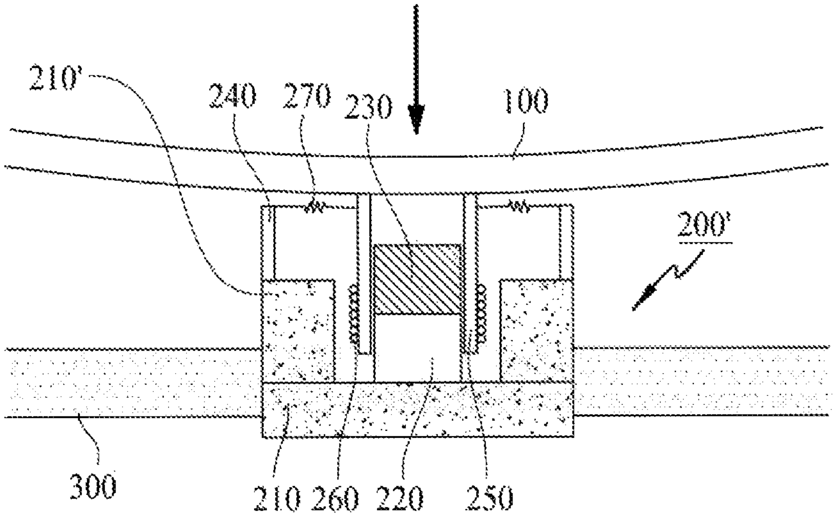

FIGS. 4A and 4B illustrate a sound generating method of the sound generating device with the second structure according to the example embodiment of the present disclosure.

FIG. 4A shows a state in which a current is applied. The second plate 210' becomes the S pole, and the center pole 230 connected with an upper surface of the magnet 220 becomes the N pole, whereby an external magnetic field is generated between the coil 260. These may be opposite polarities to those described above. It may be possible to realize the same operation by changing a winding direction of the coil 260. In this case, if the current for generating sound is applied to the coil 260, an applied magnetic field is formed around the coil 260, whereby a force for upwardly moving the bobbin 250 is generated by the applied magnetic field and the external magnetic field. In detail, if the current is applied to the coil 260, the magnetic field is generated around the coil 260, and the external magnetic field is generated by the magnet 220, whereby the entire bobbin 250 is guided and moved upward by the center pole 230 based on Fleming's law.

As one surface of the bobbin 250 is in contact with the rear surface of the display panel 100, the display panel 100 is vibrated in an upper direction (indicated by an arrow) according to whether or not the current is applied to the coil 260, and a sound wave (or sound) is generated by the vibration of the display panel 100.

In this state, if the current is stopped or a current is applied in the opposite direction, as shown in FIG. 4B, a force of downwardly moving the bobbin 250 is generated based on the principles of FIG. 4A, whereby the display panel 100 is vibrated in a lower direction (indicated by an arrow).

The damper 270 is disposed between the frame 240 and some portion of the upper portion of the bobbin 250. The damper 270 is formed in a wrinkled structure having elasticity, whereby the damper 270 controls the up-and-down vibration of the bobbin 250 by contraction and relaxation movements in accordance with the up-and-down movement of the bobbin 250. That is, the damper 270 is connected with the bobbin 250 and the frame 240, whereby the up-and-down vibration of the bobbin 250 may be controlled by a restoring force of the damper 270. In detail, if the bobbin 250 vibrates to be higher or lower than a predetermined height, the bobbin 250 may be restored to its original position by the restoring force of the damper 270.

Accordingly, the display panel 100 may be vibrated in the up-and-down direction in accordance with the direction and level of the current applied to the coil 260, to thereby generate the sound wave by the vibration.

Figure 5A:
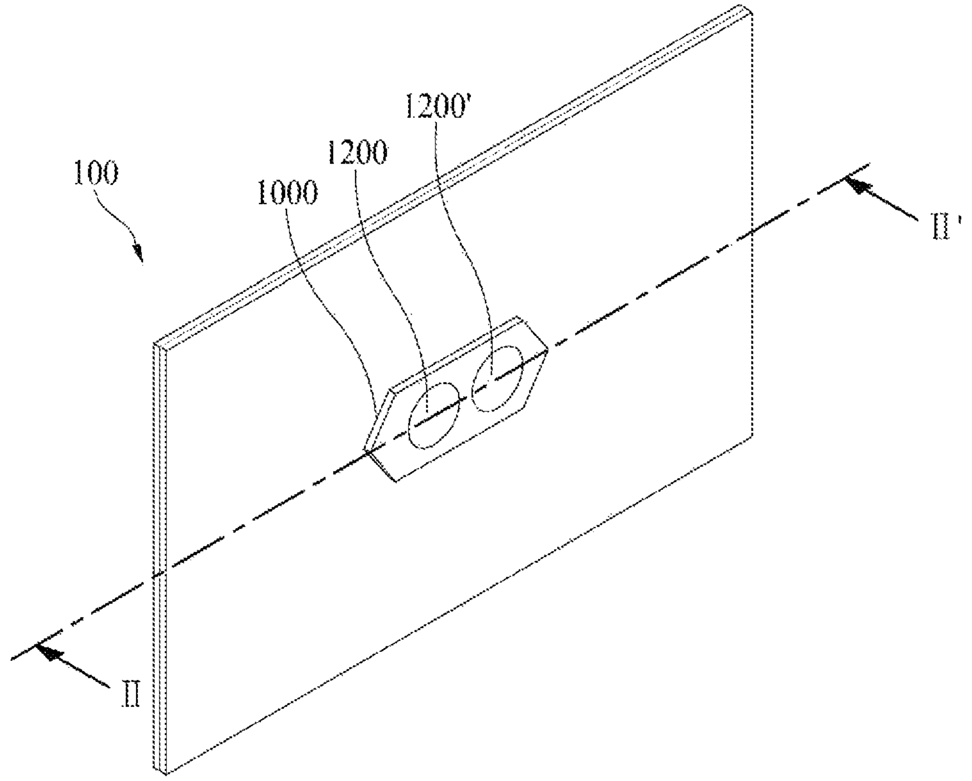
FIG. 5A illustrates a sound generating device according to another example embodiment of the present disclosure.
Figure 5B:
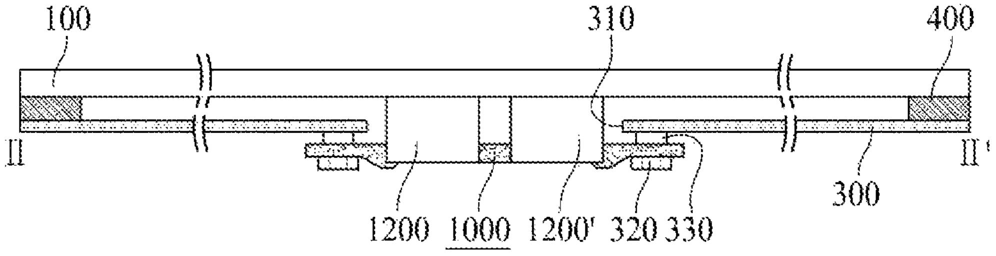
FIG. 5B is a cross-sectional view taken along II-II' of FIG. 5A.

FIG. 5A is a plane view illustrating a sound generating device according to another example embodiment of the present disclosure, and FIG. 5B is a cross-sectional view taken along II-II' of FIG. 5A.

With reference to FIG. 5A, a display apparatus may include a display panel 100, and first and second sound generating devices 1200 and 1200' for generating sound by vibrating the display panel 100.

The first sound generating device 1200 and the second sound generating device 1200' are disposed adjacent to each other. If providing the plurality of sound generating devices spaced apart from each other, it may be difficult to maintain uniformity of the contact properties between the sound generating devices and the display panel, which might cause deterioration of sound quality by an interference or delay phenomenon of the sound wave generated in the sound generating devices. In comparison to the plurality of sound generating devices spaced apart from each other, e.g., provided at fixed intervals, the sound generating devices disposed adjacent to each other may reduce interference or delay phenomenon of the sound wave generated in the sound generating devices, to thereby improve the sound output characteristics. This will be described in detail with reference to FIG. 7.

The first sound generating device 1200 and the second sound generating device 1200' may be applied with the aforementioned first or second structure described with reference to FIGS. 2A and 2B.

The display apparatus may include a fixing device 1000 for fixing the first sound generating device 1200 and the second sound generating device 1200'. The fixing device 1000 may be a mold structure manufactured by a molding process using a plastic material, but is not limited thereto. The fixing device 1000 will be described with reference to FIG. 6.

With reference to FIG. 5B, the display apparatus may include the first sound generating device 1200, the second sound generating device 1200', and a supporting member 300.

The supporting member 300 may support at least one of rear and side surfaces of the display panel 100. The supporting member 300 may be a plate-shaped member of a metal or plastic material over a rear surface or an entire surface of the display panel 100.

The sound generating device 1200 and 1200' may be accommodated in a supporting hole 310 provided to the supporting member 300. If the sound generating device 1200 and 1200' is inserted into and fixed to the supporting hole 310, it may be possible to decrease a height of the sound generating device 1200 and 1200' disposed between a rear surface of the display panel 100 and an inner surface of the supporting member 300, to thereby realize a small space or area for generating the sound.

And, the display apparatus may include a nut 330 fixed to the supporting member 300. The fixing device 1000 may be fixed to the nut 330 by the use of screw 320 inserted into a hole of the fixing device 1000. And, a screw through hole is formed inside the nut 330. Thus, after aligning the hole of the fixing device 1000 and the screw through hole of the nut 330, the screw 320 is tightened up so that the fixing device 1000 is fixed to the supporting member 300.

For example, the nut 330 may be a self-clinching nut. One example of the self-clinching nut may be a PEM® nut. If using the self-clinching nut, the vibration generated in the sound generating device is partially absorbed in the self-clinching nut so that it may be possible to reduce the vibration transferred to the supporting member 300.

In the display apparatus according to the present disclosure, the supporting member and the sound generating device may be fixed to each other by the use of a nut and a screw included in the supporting member so that it may be possible to reduce a thickness of the display panel 100.

And, an adhesion member 400 may be disposed in the periphery of the supporting member 300 and the display panel 100, to thereby adhere the display panel 100 and the supporting member 300 to each other. The adhesion member 400 may be a double-sided tape.

Figure 6:
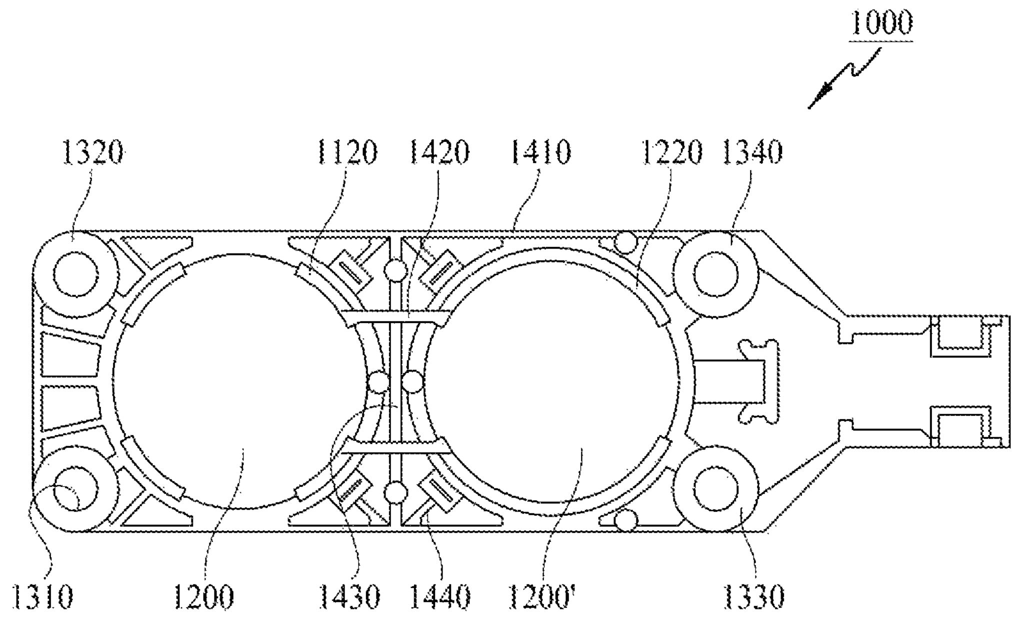
FIG. 6 illustrates a fixing device of the sound generating device according to another example embodiment of the present disclosure.

FIG. 6 illustrates another example embodiment of the fixing device in the sound generating device according to the present disclosure.

With reference to FIG. 6, the fixing device 1000 of the sound generating device may be an integrated type fixing device for supporting and fixing the first sound generating device 1200 and the second sound generating device 1200' that are adjacent to each other. Thus, the first sound generating device 1200 and the second sound generating device 1200' fixed using fixing device 1000 may be a pair of sound generating devices, which will be referred to as a pair of sound generating devices.

The fixing device 1000 of the sound generating device may include a supporting portion for supporting the sound generating devices 1200 and 1200', a plurality of rib portions disposed in the periphery of the sound generating devices 1200 and 1200', and a plurality of mounting holes for fixing the fixing device 1000 and the supporting portion to each other.

In detail, the supporting portion may include a first supporting portion 1120 for supporting the first sound generating device 1200, and a second supporting portion 1220 for supporting the second sound generating device 1200'. The first supporting portion 1120 supports predetermined portions of lateral and rear surfaces of the first sound generating device 1200, and the first supporting portion 1120 may have a cylinder shape. The second supporting portion 1220 supports predetermined portions of lateral and rear surfaces of the second sound generating device 1200', and the second supporting portion 1220 may have a cylinder shape.

The first supporting portion 1120 and the second supporting portion 1220 may further include protrusions having two or four circular-arc shape. Herein, one surface of each of the protrusions is bent toward the inside of each sound generating device 1200 and 1200' so that it may be possible to support a predetermined portion of a rear surface of each sound generating device 1200 and 1200', to thereby prevent the sound generating devices 1200 and 1200' from being separated from the fixing device 1000.

The plurality of rib portions may be disposed in the periphery of the first supporting portion 1120 and the second supporting portion 1220, thereby maintaining hardness of the fixing device 1000 and preventing a deformation of the fixing device 1000 of the sound generating device even in a case of long-time use.

In more detail, the rib portion may include a first rib portion 1410 extending in a horizontal direction at the outer surface of the first supporting portion 1120 and the second supporting portion 1220, a second rib portion 1420 for connecting the first supporting portion 1120 and the second supporting portion 1220 with each other in the horizontal direction, and a third rib portion 1430 connected with the first rib portion 1410 in a vertical direction. Herein, the horizontal direction is a direction of a long side along which the two sound generating devices are disposed, and the vertical direction is a direction which is perpendicular to the horizontal direction. For example, the horizontal direction may be referred to as a landscape direction of the display panel, and the vertical direction may be referred to as a portrait direction of the display panel.

The first rib portion 1410 extends from the outer surface of the first supporting portion 1120 and the second supporting portion 1220 in the horizontal direction, to thereby form a horizontal-direction external structure of the fixing device 1000 of the sound generating device.

A central area of the first rib portion 1410, that is, the central area between the first supporting portion 1120 and the second supporting portion 1220 may be relatively higher or thicker than each of both side areas of the first rib portion 1410. Accordingly, even though the two sound generating devices are vibrated for a long time period, it may be possible to prevent the fixing device 1000 of the sound generating device from being deformed, and to reduce a change in the relative position between the display panel and the two sound generating devices.

The at least one second rib portion 1420 may be disposed inside the first rib portion 1410, and the second rib portion 1420 may be connected with the first supporting portion 1120 and the second supporting portion 1220, and formed as one body with the first supporting portion 1120 and the second supporting portion 1220.

In FIG. 6, two of the second rib portions 1420 are shown, but embodiments are not limited thereto. For example, one or three or more of the second rib portion 1420 may be provided.

At least one third rib portion 1430 may be disposed between two of the second rib portions 1420 or two of the first rib portion s1410, and the third rib portion 1430 may be extended in the transverse direction, and integrally connected to the first rib portion 1410 and the second rib portion 1420.

In FIG. 6, one of the third rib portions 1430 is included, and the third rib portion 1430 may extend lengthwise between two of the first rib portions 1410, but embodiments are not limited thereto. For example, the third rib portion 1430 may extend a shorter length between two of the second rib portions 1420.

The rib portion may further include at least one fourth rib portion 1440 disposed between the first supporting portion 1120 and the first rib portion 1410, or between the second supporting portion 1220 and the first rib portion 1410, and the at least one fourth rib portion 1440 may be obliquely extended to prevent the fixing device 1000 of the sound generating device from being bent and deformed by heat generated during a long-time use.

Accordingly, the display apparatus according to an example embodiment of the present disclosure includes the fixing device 1000 for fixing a pair of sound generating devices, and the plurality of rib portions in the periphery of the sound generating device so that it may be possible to maintain hardness of the sound generating device, and to reduce the change of sound output characteristics even in a case of long-time use.

A distance between the first supporting portion 1120 and the second supporting portion 1220 may be larger than a minimum threshold value for forming the rib portion, and may be smaller than a maximum threshold value corresponding to a diameter of each of the first sound generating device 1200 and the second sound generating device 1200'. If the distance between the first supporting portion 1120 and the second supporting portion 1220 is greater than the maximum threshold value, the sound quality may be deteriorated. Thus, the distance between the first supporting portion 1120 and the second supporting portion 1220 is smaller than the diameter of each of the first sound generating device 1200 and the second sound generating device 1200', to thereby prevent deterioration of the sound quality. For example, if the sound generating device has size (diameter) 'D', the distance between the first supporting portion 1120 and the second supporting portion 1220 is set to be a value which is larger than about 7 mm corresponding to the minimum threshold value, and is smaller than the size 'D' of the sound generating device. If the size 'D' of the sound generating device is about 28 mm, in case of about 0.85D (about 23.6 mm), there is only a slight difference in the sound output characteristics.

A plurality of mounting holes 1310, 1320, 1330 and 1340 are included for fixing the fixing device 1000 and the supporting member 300 to each other. The screw through hole is formed in the inner surface of the nut 330 shown in FIG. 5B. Thus, after aligning the mounting hole 1310, 1320, 1330 and 1340 of the fixing device 1000 and the screw through hole of the nut 330, the screw 320 is tightened up so that the fixing device 1000 is fixed to the supporting member 300.

Figure 7:
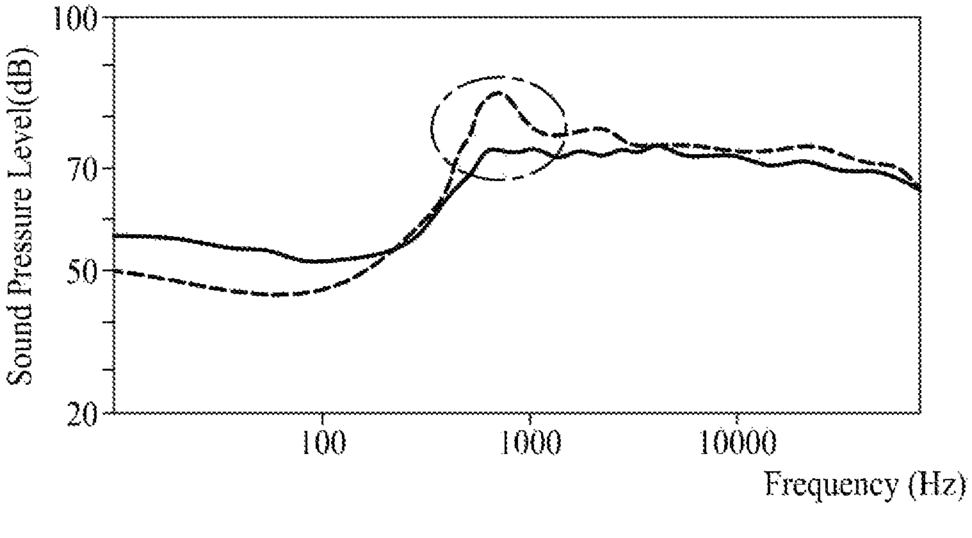
FIG. 7 illustrates the sound output characteristics in the sound generating device according to another example embodiment of the present disclosure.

FIG. 7 illustrates the sound output characteristics of another example embodiment in the sound generating device according to the present disclosure.

In FIG. 7, a dotted line indicates a case where the two sound generating devices are provided at a predetermined interval from each other, and are separately fixed. In this case, a dip phenomenon (indicated by a circle) may occur by a sudden rise in sound pressure level in the 800~900 Hz range.

Due to the dip phenomenon, a strong sound pressure may be generated in a specific frequency by interference or delay of the sound wave generated in the two sound generating devices which are provided at a predetermined interval from each other and are fixed separately, which might cause deterioration of sound quality.

In FIG. 7, a solid line indicates a case where the fixing device 1000 of the sound generating device is used to fix the two sound generating devices to each other. In comparison to the dotted line of FIG. 7, the solid line of FIG. 7 shows that the dip phenomenon caused by the abnormally-increased sound pressure level in the specific frequency is removed significantly.

If applying the fixing device 1000 of the sound generating device according to another example embodiment of the present disclosure, it may be possible to maintain uniform sound pressure in the entire frequency range, to thereby improve the sound output characteristics.

Figure 8:
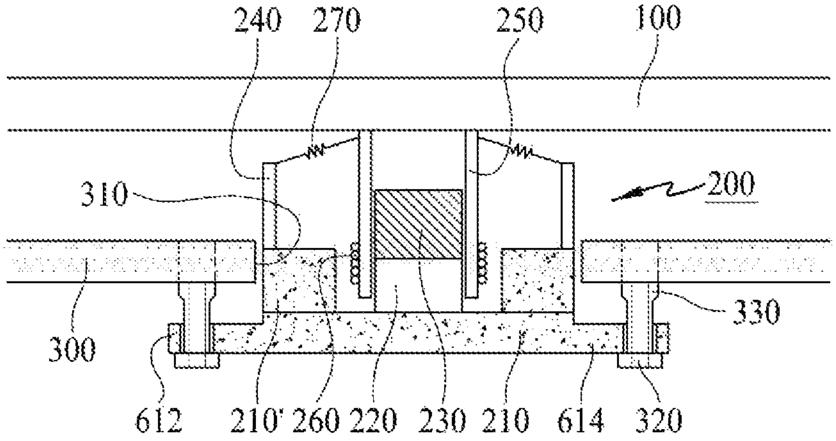
FIG. 8 illustrates a connection structure between the sound generating device and a supporting member according to the example embodiment of the present disclosure.

FIG. 8 illustrates a connection structure between the sound generating device and the supporting member according to another example embodiment of the present disclosure.

The example embodiment of the present disclosure may be applied to both the first and second structures of the sound generating device. Hereinafter, an example of the second structure of the sound generating device will be described in detail.

With reference to FIG. 8, the sound generating device 200 may include a diameter expanding portion 614, and the diameter expanding portion 614 is formed as one body with the first plate 210 of the sound generating device 200. The first plate 210 of the sound generating device 200 is not a cylinder shape. Herein, one portion of the first plate 210 has a protrusion portion which is larger than a diameter of the remaining area of the first plate 210. The protrusion portion with a relatively-large diameter may be referred to as the diameter expanding portion 614. The diameter expanding portion 614 has a ring shape, and an extension portion 612 for fixation of the sound generating device 200 is formed in a predetermined portion of the diameter expanding portion 614.

In the extension portion 612, there are a screw 320 and a nut 330. By the use of nut 330 fixed to the supporting member 300, the sound generating device 200 is connected with the supporting member 300 by the screw 320. For example, the nut 330 may be a self-clinching nut. One example of the self-clinching nut may be a PEM® nut.

If using the self-clinching nut, the vibration generated in the sound generating device 1200 may be partially absorbed in the nut so that it may be possible to reduce the vibration transferred to the supporting member 300.

Also as shown in FIG. 8, the bobbin 250 of the sound generating device 200 is attached to the display panel 100.

Figure 9:
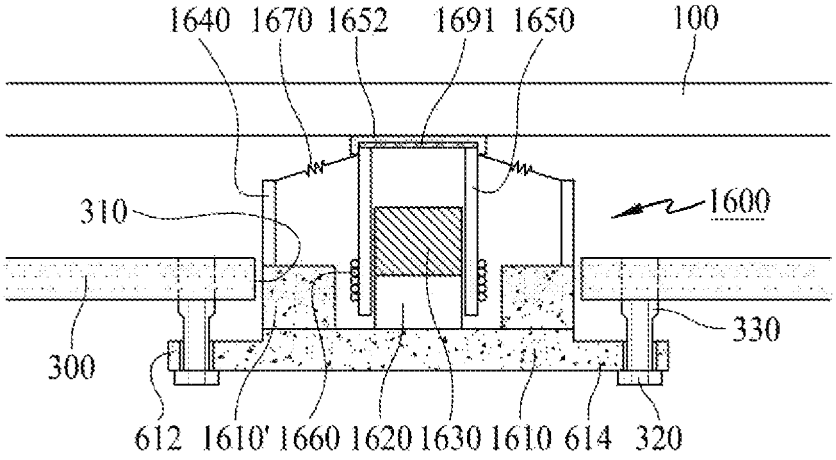
FIG. 9 illustrates a sound generating device according to another example embodiment of the present disclosure.

FIG. 9 illustrates another embodiment of the sound generating device according to the present disclosure. With reference to FIG. 9, the sound generating device 1600 may include plates 1610 and 1610', a magnet 1620 on the plate, a center pole 1630 on the plate, a bobbin 1650 disposed around the center pole 1630, and a coil 1660 wound on an outer surface of the bobbin 1650.

In detail, the first plate 1610 may be fixed to a supporting hole of the supporting member 300, the magnet 1620 may be disposed on the first plate 1610, and the center pole 1630 may be disposed on the magnet 1620.

The bobbin 1650 is disposed to surround the magnet 1620 and the center pole 1630, and the coil 1660 is wound on an outer surface of the bobbin 1650.

The second plate 1610' is disposed at the outer periphery of the first plate 1610, and a frame 1640 is disposed at the outside side of the second plate 1610'. A damper 1670 is disposed between the frame 1640 and the bobbin 1650. The bobbin 250 may be a ring-shaped structure of paper or aluminum sheet.

As described in FIGS. 3 and 4, the sound generating device 1600 is attached onto the display panel 100, and one surface of the bobbin 1650 is attached to the display panel 100. Because the bobbin 1650 has a small thickness, it may have a problem related to a small adhesion area with the display panel 100. Due to the small contact area, the bobbin 1650 is attached to the display panel 100 by the use of resin formed onto the bobbin 1650. However, it may require the processes of setting resin coating amount and drying time, which may cause difficulties in the manufacturing process. Furthermore, because the bobbin 1650 of the paper material is exposed to the outside, the bobbin 1650 may be deformed by an external shock.

Through various experiments, a sound generating device according to an example embodiment may facilitate the increase of the adhesion area between the bobbin 1650 of the sound generating device 1600 and the display panel 100, realize an easy attachment process between the sound generating device 1600 and the display panel 100, and protect the bobbin 1650.

With reference to FIG. 9, the sound generating device 1600 may further include a protection member 1652 further disposed on the bobbin 1650. The protection member 1652 is formed in a ring-shaped structure, which may be capable of increasing an adhesion area with the display panel 100. As the protection member 1652 is provided to cover and protect the bobbin 1650, it may be possible to prevent the sound generating device 1600 from being deformed by an external shock. The protection member 1652 may be manufactured by an injection molding product or metal molding product.

The protection member 1652 may be formed of fiber reinforced materials, complex resin including fiber reinforced materials, or metal material, which may prevent heat caused by the driving of the sound generating device 1600. For example, the fiber reinforced materials may be one among carbon fiber reinforced plastics (CFRP), glass fiber reinforced plastics (GFRP), and graphite fiver reinforced plastics (GFRP), or their combination, but is not limited to these materials. Among the aforementioned materials, the carbon fiber has a small thermal expansion coefficient so that it has good stability. Furthermore, the carbon fiber has good electro-conductivity, high corrosion resistance, good vibration attenuation properties, and good radiotransparent properties. The glass fiber has lightness in weight, good durability, good shock resistance, and good durability of abrasion. Furthermore, the glass fiber is anti-rust, has a low coefficient of heat conduction, and has easy processability. In an example, the metal material may be aluminum (Al), but is not limited thereto.

The sound generating device 1600 may further include a first adhesion member 1691 disposed between the bobbin 1650 and the protection member 1652. The first adhesion member 1691 may be formed of resin, for example, epoxy resin or acryl resin, but is not limited to these materials.

As the protection member 1652 is provided on the bobbin 1650, it may be possible to increase the adhesion area between the sound generating device 1600 and the display panel 100, and to realize the easy attachment process between the sound generating device 1600 and the display panel 100. Furthermore, the protection member 1652 is provided on the bobbin 1650 so that it may be possible to prevent the bobbin 1650 from being deformed by an external shock. The protection member 1652 is formed of fiber reinforced materials, complex resin including fiber reinforced materials, metal material, or their combinations, to thereby reduce heat generated by the sound generating device 1600.

The display apparatus may further include another adhesion member to adhere the display panel 100 and one surface of the bobbin 1650 to each other, which will be described with reference to FIG. 10.

Figure 10:
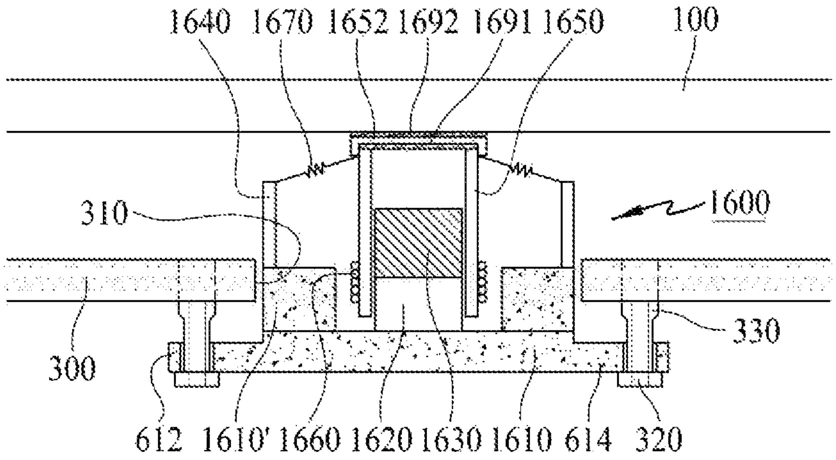
FIG. 10 illustrates a connection structure between the sound generating device and a supporting member in the sound generating device according to another example embodiment of the present disclosure.

FIG. 10 illustrates a connection structure between the sound generating device and a supporting member according to another example embodiment of the present disclosure.

The sound generating device and the supporting member may be connected with each other by the same method as described in FIG. 8, whereby a detailed description for the connection method will be omitted.

With reference to FIG. 10, a second adhesion member 1692 may be further provided to adhere the display panel 100 and one surface of the bobbin 1650 to each other. The second adhesion member 1692 may be a double-sided tape. In case of the second adhesion member 1692 of the double-sided tape, if there is a defect in adhesion between the display panel 100 and the sound generating device 1600, it may facilitate rework. Furthermore, if the display panel 100 and the bobbin 1650 are adhered each other by using the double-sided tape, its adhesion process may be easier in comparison to the case using the resin.

Figure 11:
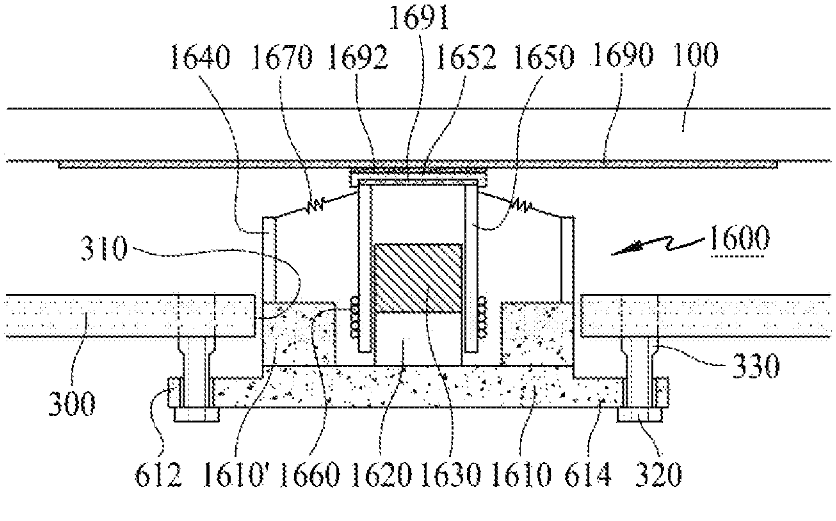
FIG. 11 illustrates another example embodiment of the present disclosure.

FIG. 11 illustrates another example embodiment of the present disclosure. With reference to FIG. 11, the display apparatus may further include a heat-dissipation member 1690 disposed on the sound generating device 1600 so that the heat generated by the vibration of the sound generating device 1600 may be dissipated. The heat-dissipation member 1690 is disposed between the display panel 100 and the second adhesion member 1692 on the protection member 1652. The heat-dissipation member 1690 prevents the heat from being transmitted from the sound generating device 1600 to the display panel 100. The heat generated in the sound generating device 1600 may be diffused to the wide area or whole area by the heat-dissipation member 1690 so that it may be possible to prevent deterioration of picture quality in the display panel 100 caused by a sudden temperature change in a local area of the display panel 100 overlapped with the sound generating device 1600.

The heat-dissipation member 1690 may be embodied in a polygonal or circular plate shape having a uniform thickness, and a size of the heat-dissipation member 1690 is relatively larger than a size of the sound generating device 1600. The heat-dissipation member 1690 may be provided on the entire rear surface of the display panel 100. For example, the heat-dissipation member 1690 may be embodied in a heat-dissipation sheet or heat-dissipation tape of a metal material with high thermal conductivity, for example, aluminum (Al), copper (Cu), silver (Ag), and their alloys.

FIG. 12 illustrates the sound generating device and partition in the display apparatus according to another example embodiment of the present disclosure.

Figure 12A:
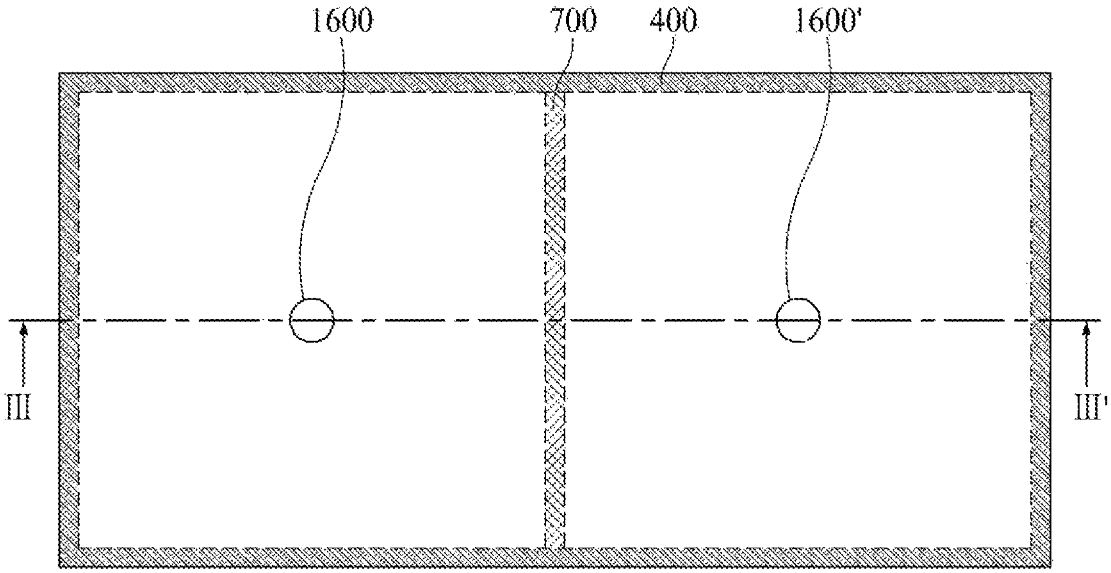
FIGS. 12A to 12C illustrate an example embodiment of the sound generating device and partition in the display apparatus according to the present disclosure.

With reference to FIG. 12A, the display panel 100 includes first and second areas, where the first area corresponds to a left area of the display panel 100, and the second area corresponds to a right area of the display panel 100. The first sound generating device 1600 is disposed in the first area of the display panel 100, and the second sound generating device 1600' is disposed in the second area of the display panel 100. The first sound generating device 1600 and the second sound generating device 1600' may output a middle-high-pitched sound band with different levels so that it may be possible to output stereo sound by the left and right sound separation.

The display apparatus may further include a partition 700 disposed between the first sound generating device 1600 and the second sound generating device 1600'. The partition 700 provides an air gap or space for generating sound when the display panel 100 is vibrated by the sound generating device 1600. The partition 700 may be the space or air gap for generating sound or transferring sound. The partition 700 may be an enclosure or a baffle, but is not limited to these terms. The partition 700 may be an entire area of four outer sides of the display panel 100. The partition 700 may be formed in a sealed structure or unsealed structure.

The partition 700 may separate the left and right sound generated in the first sound generating device 1600 and the second sound generating device 1600'. The partition 700 attenuates or absorbs the vibration of the display panel 100 in the center of the display panel 100 so that it may be possible to prevent the left-side sound from being transferred to the area for the right-side sound, and to prevent the right-side sound from being transferred to the area for the left-side sound. Accordingly, the partition 700 separates the left-side sound and the right-side sound from each other, and improves the sound output characteristics.

The first sound generating device 1600 and the second sound generating device 1600' may output the middle-high-pitched sound band. Herein, the middle-high-pitched sound band may be the sound between 200 Hz and 3 kHz, and the high-pitched sound band may be the sound of 3 kHz or more than 3 kHz, but these bands are not limited to these ranges.

The partition 700 may be formed of polyurethane or polyolefin, but is not limited to these materials. The partition 700 may be formed of single-sided tape or double-sided tape, or may be formed of a material with elasticity, which is capable of being compressed to some extent.

Accordingly, the middle-high-pitched sound band may be output from the two sound generating devices 1600 and 1600'. And, the partition 700 is disposed between the two sound generating devices 1600 and 1600' so that it may be possible to separate the left-side sound and the right-side sound from each other, to thereby improve the sound stereo characteristics.

Figure 12B:
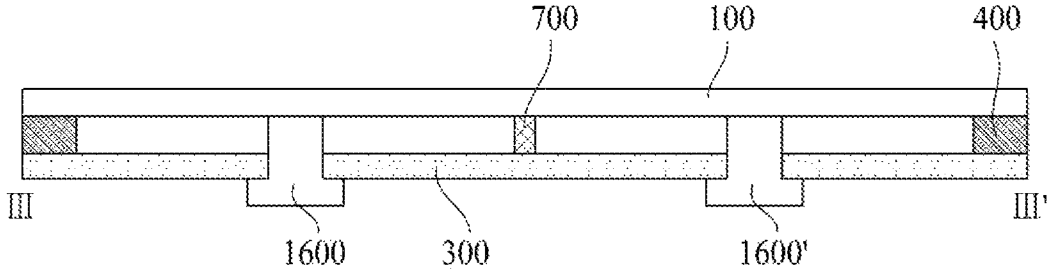

FIG. 12B is a cross-sectional view taken along III-III' of FIG. 12A. With reference to FIG. 12B, the display apparatus may include the sound generating devices 1600 and 1600', the partition 700, and the supporting member 300. The supporting member 300 may support at least one of the rear and side (lateral) surfaces of the display panel 100. The sound generating devices 1600 and 1600' may be fixed to the supporting member 300. The connection structure between the sound generating device 1600 and 1600' and the supporting member 300 may be the same as the aforementioned connection structure shown in FIG. 8.

The adhesion member 400 may be disposed between the periphery of the display panel 100 and the periphery of the supporting member 300, to thereby adhere the display panel 100 and the supporting member 300 to each other. The adhesion member 400 may be a double-sided tape, but is not limited thereto.

Figure 12C:
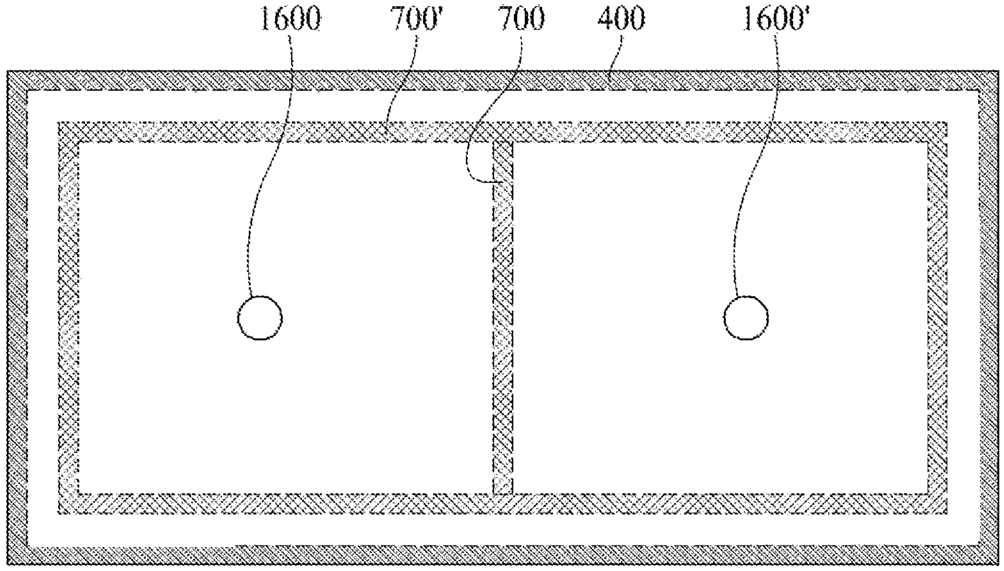

FIG. 12C illustrates another example embodiment of the sound generating device and partition in the display apparatus according to the present disclosure. With reference to FIG. 12C, the partition 700 is disposed between the first sound generating device 1600 and the second sound generating device 1600' in order to separate the left and right sound generated in the first sound generating device 1600 and the second sound generating device 1600'. And, a second partition 700' may be provided along four outer sides of the display panel 100. The second partition 700' may prevent the sound from leaking in each lateral surface of the display panel 100 so that the sound is output only to the front direction of the display panel 100, to thereby improve the sound output characteristics.

If the adhesion member 400 is formed of a foam pad, it may serve as the second partition 700'. In this case, it may be possible to not provide the second partition 700'.

Figure 13A:
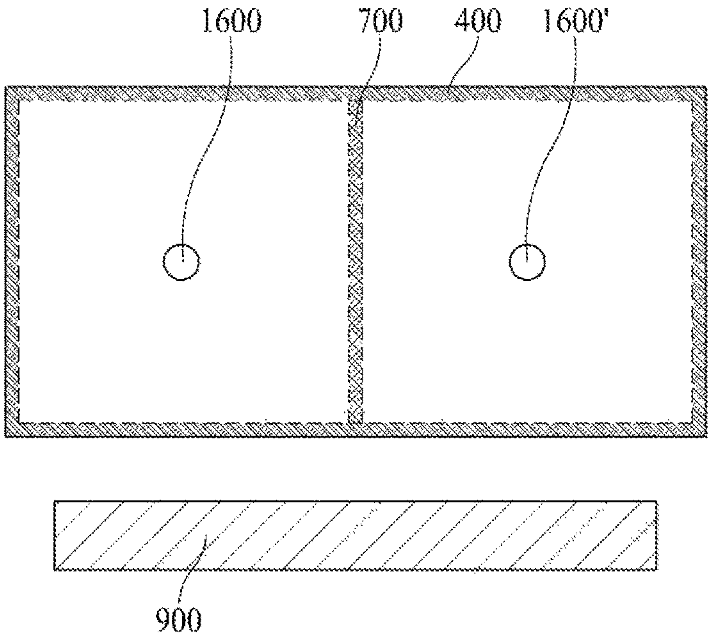
FIGS. 13A and 13B illustrate one example of the sound generating device and low sound generating device in the display apparatus according to the present disclosure.
Figure 13B:
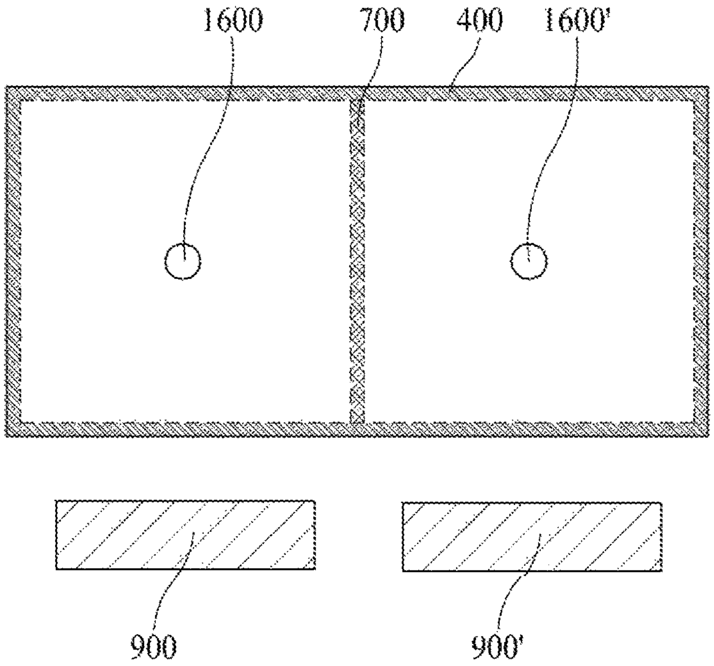

FIGS. 13A and 13B illustrate the sound generating device and low sound generating device in the display apparatus according to an example embodiment of the present disclosure.

With reference to FIGS. 13A and 13B, the display apparatus may further include a low-pitched sound generating device 900 provided in the outer portion of the display panel 100 in order to improve the low-pitched sound band. The low sound generating device 900 may be formed of a general speaker, for example, a woofer speaker capable of generating sound in the range of several kHz or less than several kHz, but is not limited thereto.

FIG. 13A illustrates an example embodiment of one low-pitched sound generating device without separation of left and right sides. It may be possible to provide two or more low sound generating devices for separation of the left and right areas of low-pitched sound band. In this case, the low-pitched sound band corresponds to the sound of 200 Hz or less than 200 Hz, but is not limited to this range.

With reference to FIG. 13B, the left-side low sound generating device 900 is disposed at a lower portion of the left-side sound generating device 1600, and the right-side low sound generating device 900' is disposed at a lower portion of the right-side sound generating device 1600'. Accordingly, the display apparatus according to this example embodiment of the present disclosure includes the left-side and right-side sound generating devices 1600 and 1600' for generating the middle-high-pitched sound band by vibrating the display panel 100, and the low sound generating devices 900 and 900' provided to generate the low-pitched sound band so that it may be possible to improve the sound output characteristics for all ranges of the sound.

In FIGS. 13A and 13B, the adhesion member for adhering the display panel and the supporting member to each other may be provided between the periphery of the display panel and the periphery of the supporting member, as explained in FIG. 12.

FIGS. 14A to 14E illustrate another example embodiment of the sound generating device and partition in the display apparatus according to the present disclosure.

Figure 14A:
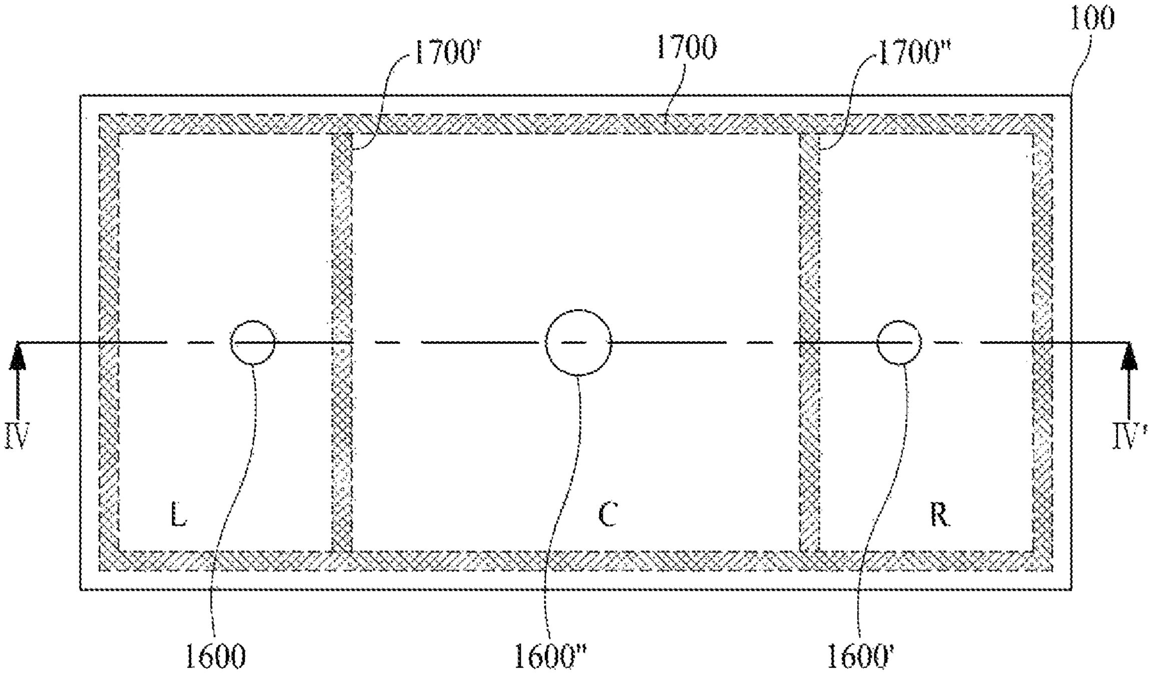
FIGS. 14A to 14E illustrate another example embodiment of the sound generating device and partition in the display apparatus according to the present disclosure.

With reference to FIG. 14A, the display panel 100 includes first, second, and third areas. The first area corresponds to a left area (L) of the display panel 100, the second area corresponds to a right area (R) of the display panel 100, and the third area corresponds to a central area (C) between the left area (L) and the a right area (R) of the display panel 100. A first sound generating device 1600 may be disposed in the first area of the display panel 100, a second sound generating device 1600' may be disposed in the second area of the display panel 100, and a third sound generating device 1600" may be disposed in the third area of the display panel 100.

The first sound generating device 1600 and the second sound generating device 1600' may output a middle-high-pitched sound band, and the third sound generating device 1600" may output a low-pitched sound band. Accordingly, the third sound generating device 1600" may be a woofer speaker capable of outputting the low-pitched sound, and the first sound generating device 1600 and the second sound generating device 1600' enable the stereo sound output, whereby the display apparatus according to the present disclosure may have the sound output characteristics of 2.1 channel type.

And, in case of the third area whose size is larger than a size of the first area and the second area, as shown in FIG. 14A, even though the first, second, and third sound generating devices 1600, 1600', and 1600" have the same sound output, it may be possible to stably output the low-pitched sound due to the relatively-large size of the third sound generating device 1600" for generating the low-pitched sound band.

A partition enables a separation of the middle-high-pitched sound band in the first and second areas, and enables a separation of the low-pitched sound band in the third area. The partition may include a first partition 1700' disposed between the first area and the third area, a second partition 1700" disposed between the third area and the second area, and a third partition 1700 disposed in the periphery of the display panel 100. Accordingly, the first partition 1700' may prevent the vibration of the first area of the display panel 100 from being transferred to the third area of the display panel 100, and the second partition 1700" may prevent the vibration of the second area of the display panel 100 from being transferred to the third area of the display panel 100.

The first partition 1700', the second partition 1700", and the third partition 1700 may be formed of a double-sided tape or single-sided tape of polyurethane or polyolefin having a uniform thickness (or height) and width, but is not limited thereto. The first partition 1700', the second partition 1700", and the third partition 1700 may be formed of a material with elasticity, which is capable of being compressed to some extent, and the first partition 1700', the second partition 1700", and the third partition 1700 may be referred to as a foam pad.

Figure 14B:
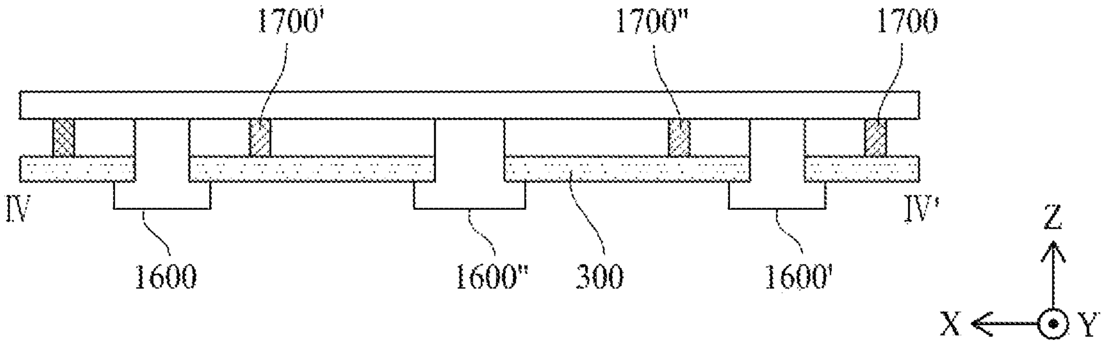

FIG. 14B is a cross-sectional view taken along IV-IV' of FIG. 14A. With reference to FIG. 14B, the display apparatus may include the sound generating devices 1600, 1600' and 1600", the partitions 1700 1700', and 1700", and a supporting member 300. The supporting member 300 may support at least one of rear and side surfaces (lateral surfaces) of the display panel 100. The sound generating devices 1600, 1600' and 1600" may be fixed to the supporting member 300. The connection structure between the sound generating device 1600, 1600' and 1600" and the supporting member 300 may be the same as the aforementioned connection structure shown in FIG. 8.

Figure 14C:
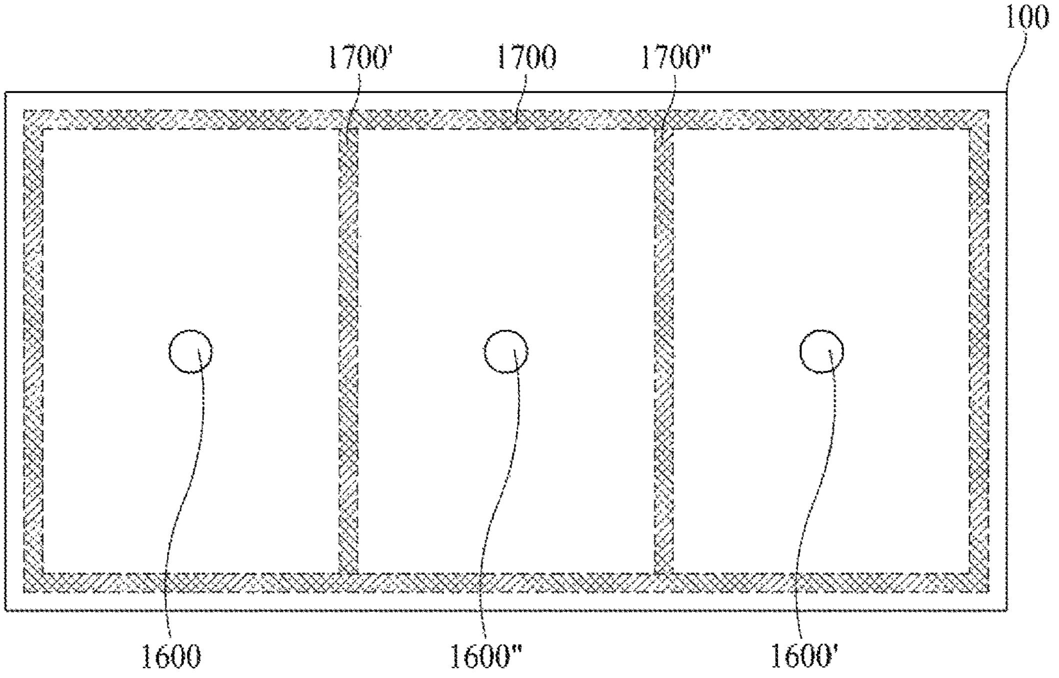
Figure 14D:
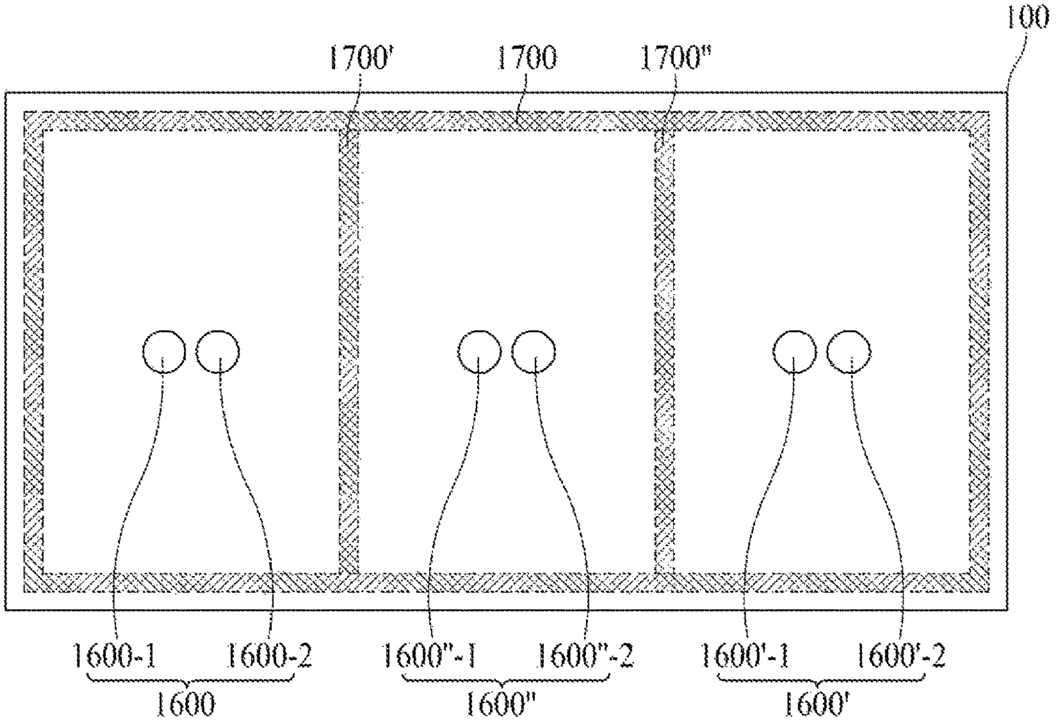
Figure 14E:
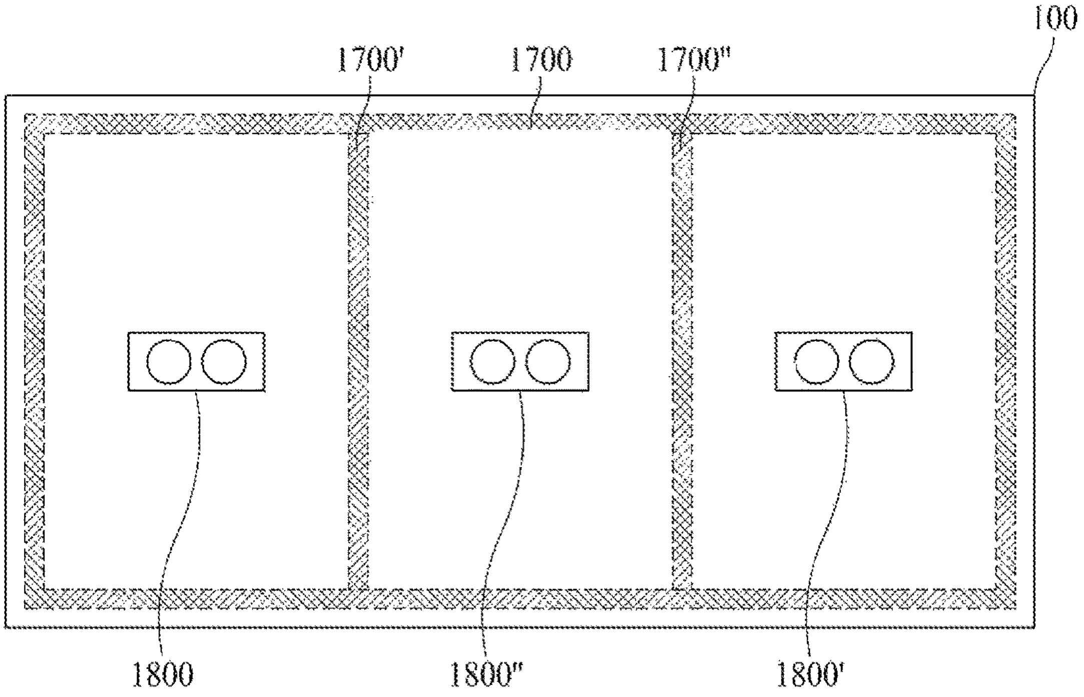

FIGS. 14C to 14E illustrate another example embodiment of the sound generating device and partition in the display apparatus according to the present disclosure. In order to realize good sound output characteristics both in the middle-high-pitched sound band and the low-pitched sound band, the first to the third area may have the same size. Thus, as shown in FIG. 14C, the display panel 100 may include the first area, the second area, and the third area having the same size. The first sound generating device 1600 is disposed in the first area of the display panel 100, the second sound generating device 1600' is disposed in the second area of the display panel 100, and the third sound generating device 1600" is disposed in the third area of the display panel 100. The first sound generating device 1600 and the second sound generating device 1600' may generate the middle-high-pitched sound band, and the third sound generating device 1600" may generate the low-pitched sound band. Thus, even though the first area, the second area, and the third area of the display panel 100 have the same size, the display apparatus is capable of outputting the stereo sound.

The first partition 1700' is disposed between the first sound generating device 1600 and the third sound generating device 1600", the second partition 1700" is disposed between the second sound generating device 1600' and the third sound generating device 1600", and the third partition is disposed in the periphery of the display panel 100.

With reference to FIG. 14D, the two sound generating devices are disposed in each of the first, second, and third areas. The first sound generating device 1600 including two sub sound generating devices 1600-1 and 1600-2 is disposed in the first area corresponding to the left area of the display panel 100. The second sound generating device 1600' including two sub sound generating devices 1600'-1 and 1600'-2 is disposed in the second area corresponding to the right area of the display panel 100. And, the third sound generating device 1600" including two sub sound generating devices 1600"-1 and 1600"-2 is disposed in the third area corresponding to the central area of the display panel 100. The first sound generating device 1600 and the second sound generating device 1600' may generate the middle-high-pitched sound band, and the third sound generating device 1600" may generate the low-pitched sound band. Accordingly, the sound generating device including the two sub sound generating devices is provided in each of the first, second, and third areas of the display panel 100, whereby the two sub sound generating devices for each area may output the sound of the same sound band, to thereby increase the sound pressure level.

And, the first partition 1700' is disposed between the first sound generating device 1600 and the third sound generating device 1600", the second partition 1700" is disposed between the second sound generating device 1600' and the third sound generating device 1600", and the third partition is disposed in the periphery of the display panel 100.

With reference to FIG. 14E, a pair of sound generating devices may be disposed in each of the first, second, and third areas. A pair of first sound generating device 1800 is disposed in the first area corresponding to the left area of the display panel 100, and a pair of second sound generating device 1800' is disposed in the second area corresponding to the right area of the display panel 100. And, a pair of third sound generating device 1800" is disposed in the third area corresponding to the central area of the display panel 100. The first sound generating device 1800' and the second sound generating device 1800' may generate the middle-high-pitched sound band, and the third sound generating device 1800" may generate the low-pitched sound band. Accordingly, a pair of sound generating device is provided in each of the first, second, and third areas of the display panel 100, whereby it may be possible to maintain the uniform sound output characteristics and to further improve the sound pressure level.

The first partition 1700' is disposed between the first sound generating device 1800 and the third sound generating device 1800", the second partition 1700" is disposed between the second sound generating device 1800' and the third sound generating device 1800", and the third partition 1700 is disposed in the periphery of the display panel 100.

In FIGS. 14A to 14E, the adhesion member for adhering the display panel and the supporting member to each other may be disposed between the periphery of the display panel and the periphery of the supporting member, as explained in FIG. 12.

Furthermore, the sound generating device disposed in each of the first, second, and third areas of the display panel shown in FIGS. 14A to 14E may be the sound generating device disposed in each of the first, second, and third areas to be explained with reference to FIGS. 20 and 21.

Figure 15A:
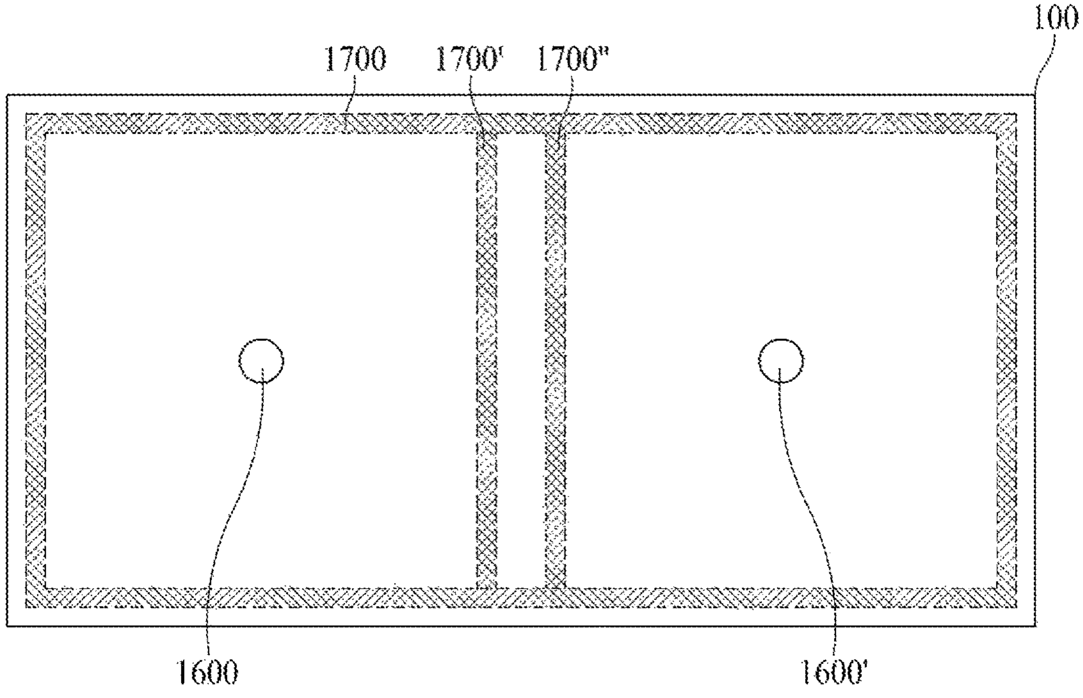
FIGS. 15A to 15K illustrate another example embodiment of the sound generating device and partition in the display apparatus according to the present disclosure.

FIGS. 15A to 15K illustrate another example embodiment of the sound generating device and partition in the display apparatus according to the present disclosure. With reference to FIGS. 15A to 15K, there is illustrated a dual-structure partition including two or more partitions. For a mono sound of outputting the same sound in the left and right areas, the left and right areas of the display panel 100 have the same vibration characteristics, whereby it may cause a problem related with the reduction of sound pressure by maximized resonant phenomenon and interference phenomenon in a specific frequency band. In order to decrease an influence of the sound characteristics caused by the difference of resonant frequency between the middle-high-pitched sound band generated in the first sound generating device of the first area corresponding to the left area and the middle-high-pitched sound band generated in the second sound generating device of the second area corresponding to the right area, the display apparatus may have a structure including two or more partitions. FIG. 15A shows the dual-structure partition, but embodiments are not limited to this structure. For example, three or more partitions may be provided. If there are three or more partitions, even though the sound interference may become serious in the left and right areas, it may be possible to prevent the reduction of sound pressure, thereby preventing discontinuity of the sound output characteristics.

The first and second sound generating devices may output the different sound levels of the middle-high-pitched sound band so that it may be possible to output the stereo sound by the separation of the left and right areas. Also, the first sound generating device of the first area corresponding to the left area and the second sound generating device of the second area corresponding to the right area are provided, and the sound generating device is not provided in the third area corresponding to the central area, whereby it may be possible to further improve the sound output characteristics of the middle-high-pitched sound band in the left and right areas of the display panel 100.

With reference to FIG. 15A, the first sound generating device 1600 is disposed in the first area corresponding to the left area of the display panel 100, and the second sound generating device 1600' is disposed in the second area corresponding to the right area of the display panel 100. At least two partitions including the first partition 1700' and the second partition 1700" may be disposed between the first sound generating device 1600 and the second sound generating device 1600', or the first partition 1700' with at least two sub partitions may be disposed between the first sound generating device 1600 and the second sound generating device 1600'. And, the third partition 1700 may be disposed in the periphery of the display panel 100. Accordingly, the two partitions are provided in the central area of the display panel 100 so that it may be possible to decrease an influence of the sound characteristics caused by the difference of resonance frequency in the middle-high-pitched sound band between the left and right areas of the display panel 100.

Figure 15B:
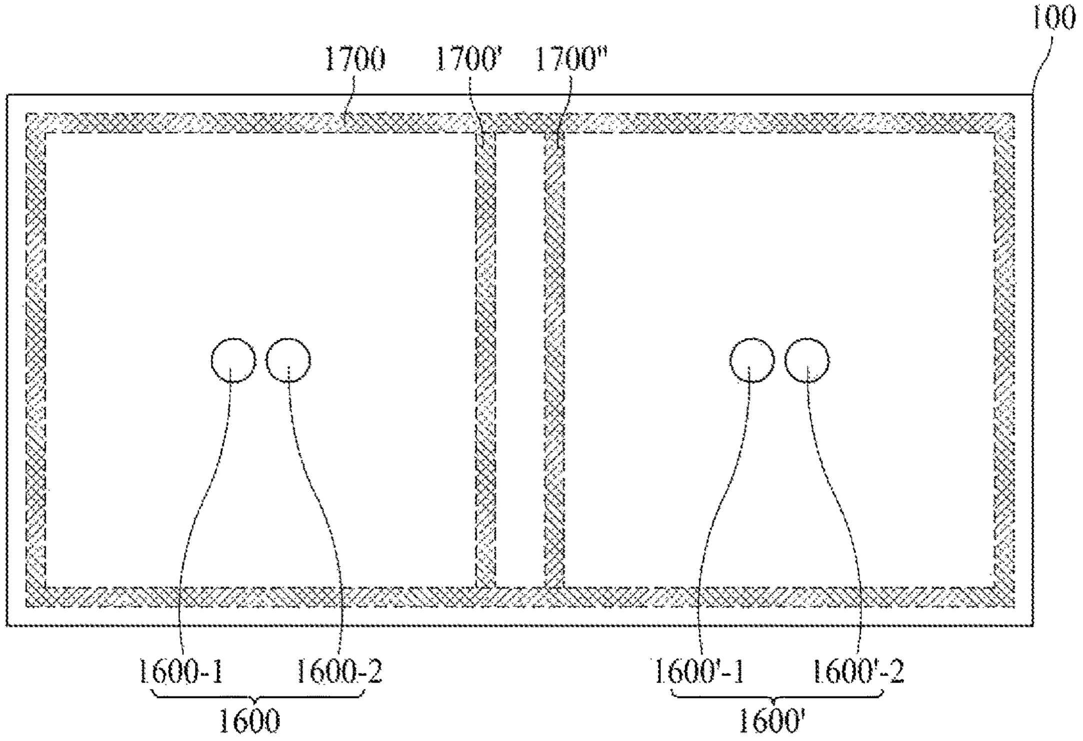

With reference to FIG. 15B, the first sound generating device 1600 including the two sub sound generating devices 1600-1 and 1600-2 is disposed in the first area corresponding to the left area of the display panel 100. The second sound generating device 1600' including the two sub sound generating devices 1600'-1 and 1600'-2 is disposed in the second area corresponding to the right area of the display panel 100. At least two partitions including the first partition 1700' and the second partition 1700" may be disposed between the first sound generating device 1600 and the second sound generating device 1600', or the first partition 1700' including the two or more sub partitions may be disposed between the first sound generating device 1600 and the second sound generating device 1600'. The third partition 1700 is disposed in the periphery of the display panel 100. Accordingly, the two partitions are provided in the central area of the display panel 100 so that it may be possible to decrease an influence of the sound characteristics caused by the difference of resonance frequency in the middle-high-pitched sound between the left and right areas of the display panel 100.

Figure 15C:
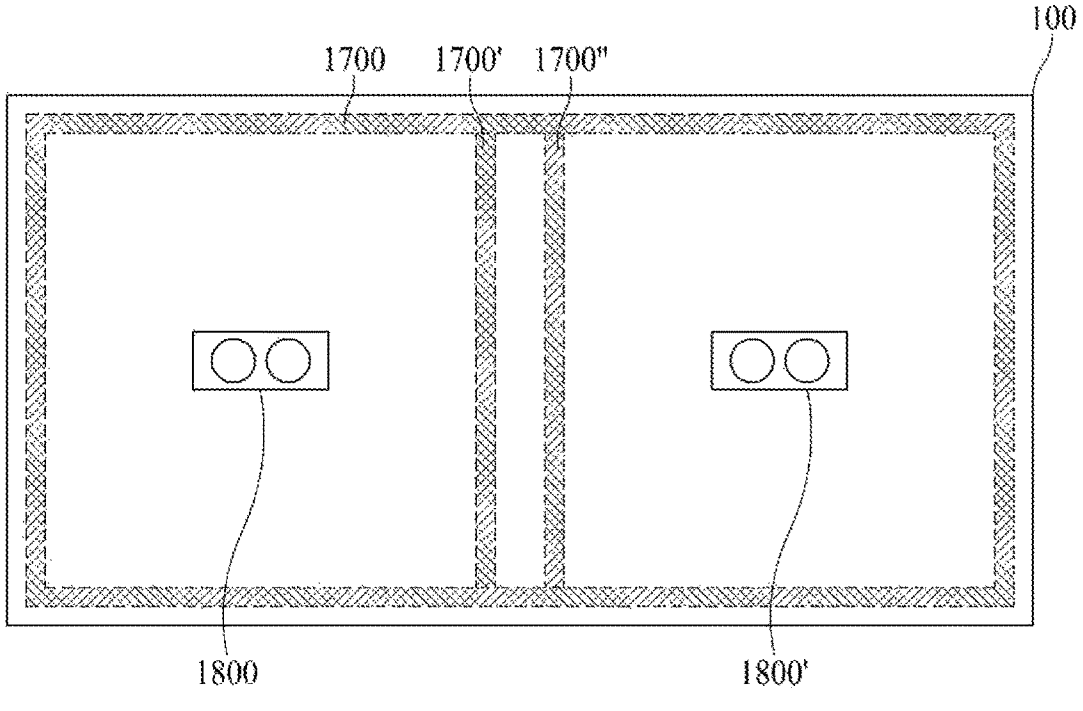

With reference to FIG. 15C, a pair of first sound generating devices 1800 is disposed in the first area corresponding to the left area of the display panel 100, and a pair of second sound generating devices 1800' is disposed in the second area corresponding to the right area of the display panel 100. If a pair of sound generating devices is provided in each of the first and second areas, it may be possible to reduce interference or delay phenomenon of the sound wave generated in the sound generating device, to thereby improve the sound output characteristics. Between the first sound generating device 1800 and the second sound generating device 1800', there are at least two partitions including the first partition 1700' and the second partition 1700", or at least two sub partitions are disposed between the first sound generating device 1800 and the second sound generating device 1800'. The third partition 1700 is disposed in the periphery of the display panel 100. Accordingly, the two partitions are provided in the central area of the display panel 100 so that it may be possible to decrease an influence of the sound characteristics caused by the difference of resonance frequency in the middle-high-pitched sound band between the left and right areas of the display panel 100.

The sound wave generated by vibrating the display panel 100 through the use of the sound generating device radially progresses from the center of the sound generating device, which is referred to as a progressive wave. If the progressive wave is reflected on one side of the partition, and progresses to an opposite direction, it is referred to as a reflected wave. If this reflected wave is overlapped and interfered with the progressive wave, it is not progressed, and it is in a standing state, which is referred to as a standing wave. The standing wave causes a reduction of sound pressure, which may thereby deteriorate the sound output characteristics. Thus, in order to prevent the reduction of sound pressure by the standing wave generated due to the interference between the progressive wave and the reflected wave, a bent portion is formed in the partition. The standing wave causing the reduction of sound pressure generates at a point having the large progressive wave and the large reflected wave. Accordingly, the bent portion may be disposed in the point having the largest sound wave approaching from the sound generating device, which will be described with reference to FIGS. 15D to 15K.

Figure 15D:
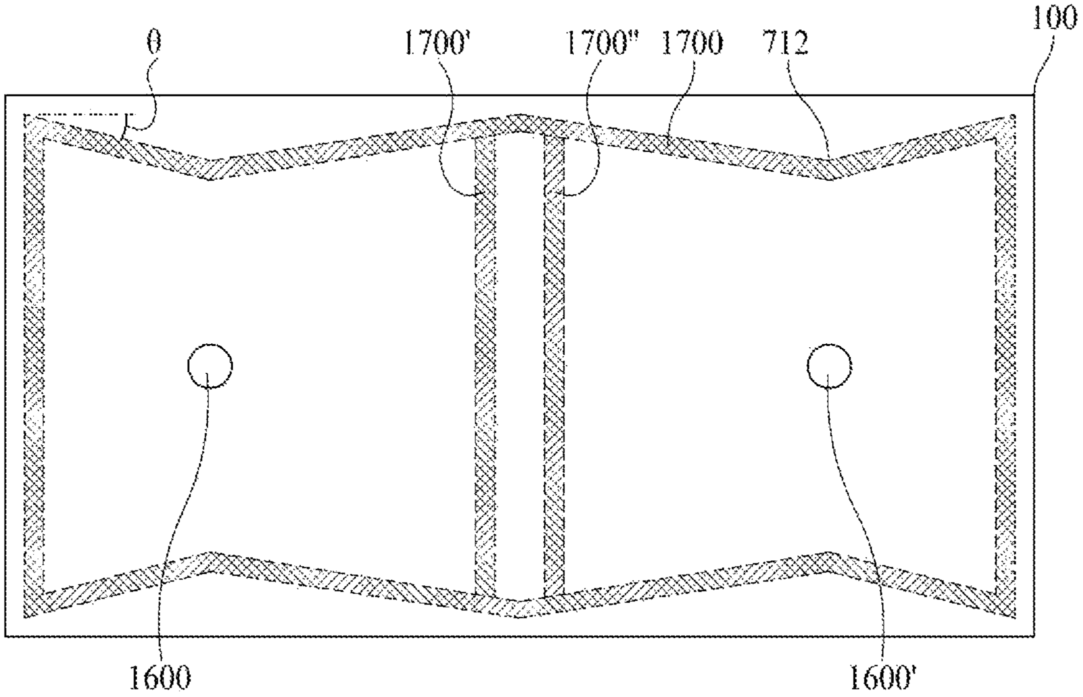
Figure 15E:
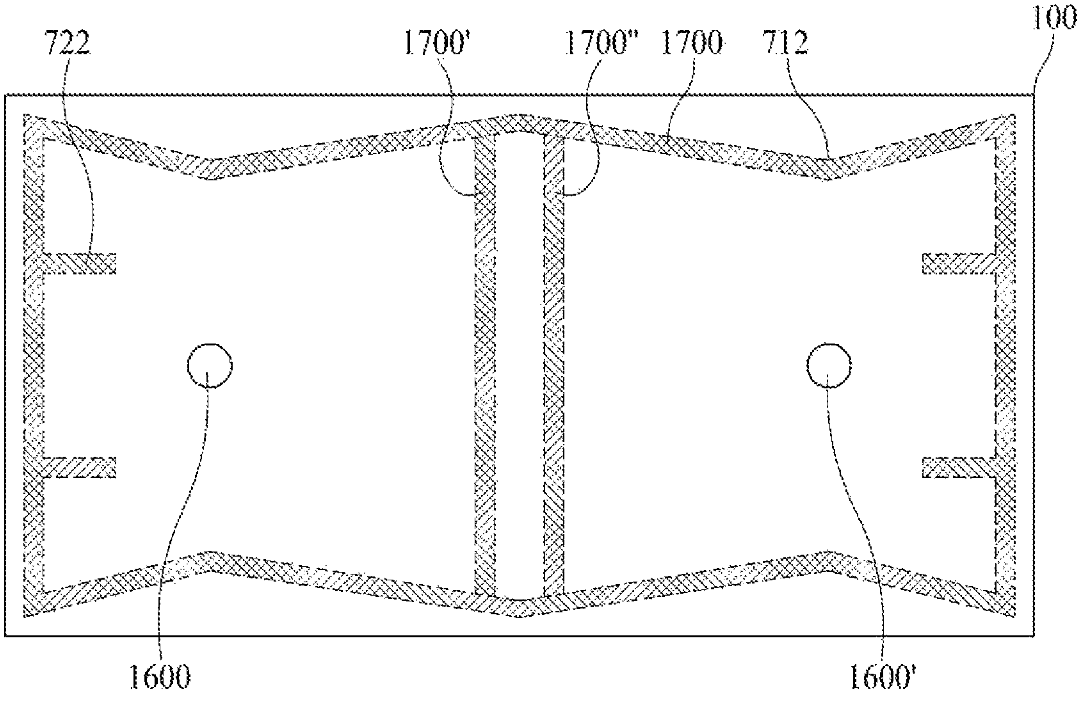

FIGS. 15D to 15K show the partition of the dual structure including the two or more partitions, where the bent portion is provided in at least one side of the partition. With reference to FIGS. 15D and 15E, the first sound generating device 1600 is disposed in the first area corresponding to the left area of the display panel 100, and the second sound generating device 1600' is disposed in the second area corresponding to the right area of the display panel 100. At least two partitions including the first partition 1700' and the second partition 1700" may be disposed between the first sound generating device 1600 and the second sound generating device 1600', or the first partition 1700' as at least two sub partitions may be disposed between the first sound generating device 1600 and the second sound generating device 1600'. The third partition 1700 may be disposed in the periphery of the display panel 100. The bend portion 712 is provided in at least one side of the third partition 1700.

The bent portion 712 is formed in at least one side, at which the largest sound wave approaches, among four sides of the third partition 1700. And the bent portion 712 is disposed toward the direction of the sound generating device 1600 and 1600'. The bent portion 712 may be disposed toward the center of the first sound generating device 1600 and the center of the second sound generating device 1600' so that it may be possible to prevent the reduction of sound pressure level by the standing wave.

The display panel 100 includes four sides, and the bent portion 712 is formed in the first side corresponding to one or more sides among the four sides. Thus, the bent portion 712 is formed in such a way that the two sides corresponding to the lower and upper sides of the four sides are provided to have a predetermined inclined angle with respect to a horizontal direction (or transverse direction) of the display panel 100. The bent portion 712 is provided with two straight-line portions, and the bent portion 712 is formed at a point where the two straight-line portions meet together. The bent portion 712 may be formed in a straight line shape, a curved line shape, or a round shape, but is not limited to these shapes.

The inclined angle (θ) of the bent portion 712 may be adjusted based on requirement for restriction of the standing wave, and the inclined angle (θ) of the bent portion 712 may be adjusted within a range from 10° to 30°. For example, in case of the sound output range for the low-pitched sound band or the large output of the sound generating device, the inclined angle (θ) of the bent portion 712 becomes large. In case of the sound output range for the high-pitched sound band or the small output of the sound generating device, the inclined angle (θ) of the bent portion 712 becomes small. In this case, the inclined angle (θ) of the bent portion 712 may be the angle obtained by one side of the third partition 1700 and the horizontal direction (or length direction or transverse direction) of the display panel 100. Herein, the horizontal direction or transverse direction corresponds to the direction of the long side of the display apparatus, and the vertical direction or longitudinal direction corresponds to the direction of the short side of the display apparatus.

Between the first partition 1700' and the second partition 1700", there is the third partition 1700 having a bent shape, and the bent shape is provided toward the display panel 100. The bent shape of the third partition 1700 disposed between the first partition 1700' and the second partition 1700" may be formed in a straight line shape, a curved line shape, or a round shape, but is not limited to these shapes.

With reference to FIG. 15E, there are illustrated both bent portion 712 and protrusion portion 722. In detail, the bent portion 712 is formed in at least one side of the third partition 1700, and at least one protrusion portion 722 is formed in the side perpendicular to the side with the bent portion 712. The protrusion portion 722 disposed in the left area of the display panel 100 is provided toward the first sound generating device 1600, and the protrusion portion 722 disposed in the right area of the display panel 100 is provided toward the second sound generating device 1600'.

The protrusion portion 722 may be capable of trapping the reflected wave, and decreasing the reduction of sound pressure level by the standing wave. At least one protrusion portion 722 may be formed in at least one side of the third partition 1700, wherein the protrusion portions 722 may be symmetrically disposed with respect to the sound generating device. FIG. 15E shows that at least one protrusion portion 722 is formed in any one side of the first side and the second side being perpendicular to the first side among the four sides of the display panel 100.

Figure 15F:
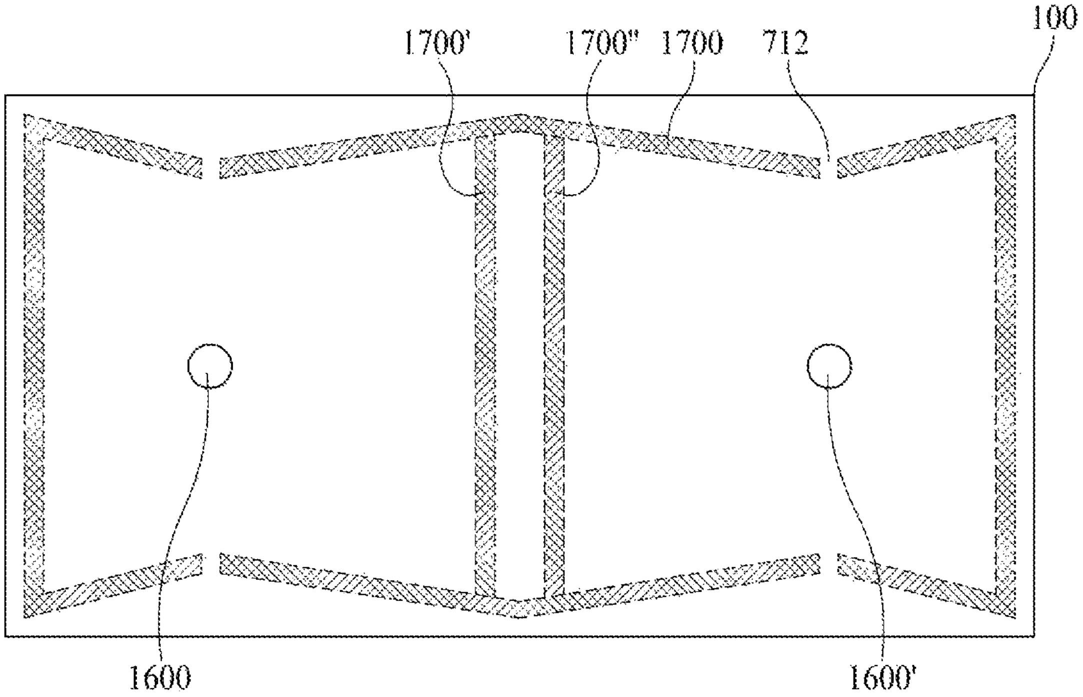
Figure 15G:
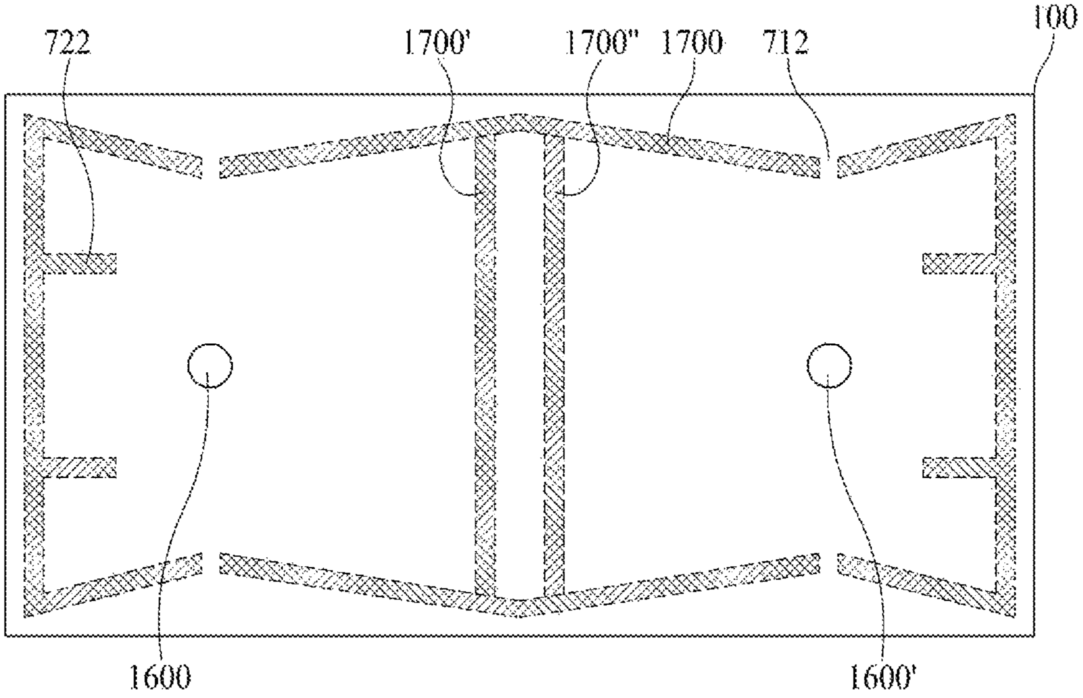

FIGS. 15D and 15E show a sealed structure of the third partition 1700, while FIGS. 15F and 15G show an unsealed structure of the third partition 1700. In detail, the third partition 1700 may be formed in the zigzag shape and sealed structure, or the third partition 1700 may be formed in the zigzag shape and unsealed structure. Also, the bent portion 712 may be formed in the sealed structure, and the bent shape disposed between the first partition 1700' and the second partition 1700" may be formed in the unsealed structure. If the third partition 1700 has the unsealed structure, a cost for the third partition 1700 may be reduced in comparison to the case of the sealed structure. There may be no difference in sound output characteristics between the third partition 1700 having the sealed structure and the third partition 1700 having the unsealed structure.

With reference to FIGS. 15F and 15G, the first sound generating device 1600 is disposed in the first area corresponding to the left area of the display panel 100, and the second sound generating device 1600' is disposed in the second area corresponding to the right area of the display panel 100. The first partition 1700' and the second partition 1700" are disposed between the first sound generating device 1600 and the second sound generating device 1600', and the third partition 1700 is disposed in the periphery of the display panel 100. The first partition 1700' including the two or more sub partitions may be disposed between the first sound generating device 1600 and the second sound generating device 1600'. The bent portion 712 is formed in at least one side of the third partition 1700, and the bent portion 712 is provided toward the central direction of the first sound generating device 1600 and the central direction of the second sound generating device 1600'. The third partition 1700 is formed in the unsealed structure. In detail, the third partition 1700 is formed in the zigzag shape and unsealed structure. The bent portion 712 may be formed in the unsealed structure, and the bent shape disposed between the first partition 1700' and the second partition 1700" is formed in the sealed structure.

FIG. 15G shows that the protrusion portion 722 is additionally provided, and the protrusion portion 722 may be the same as that of FIG. 15E.

Figure 15H:
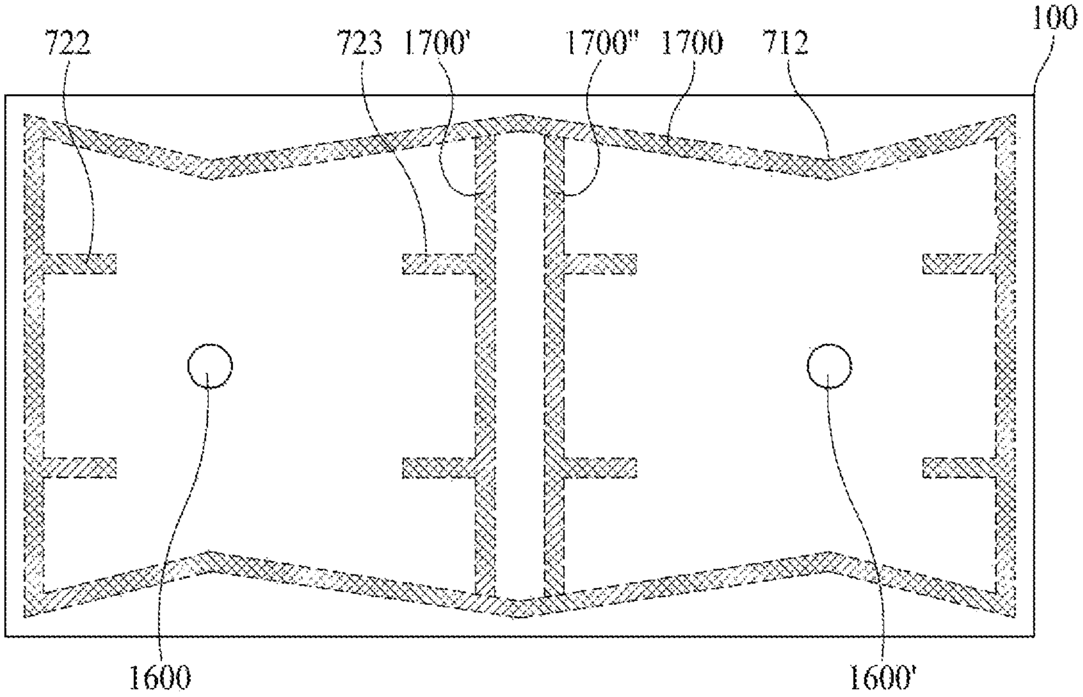
Figure 15I:
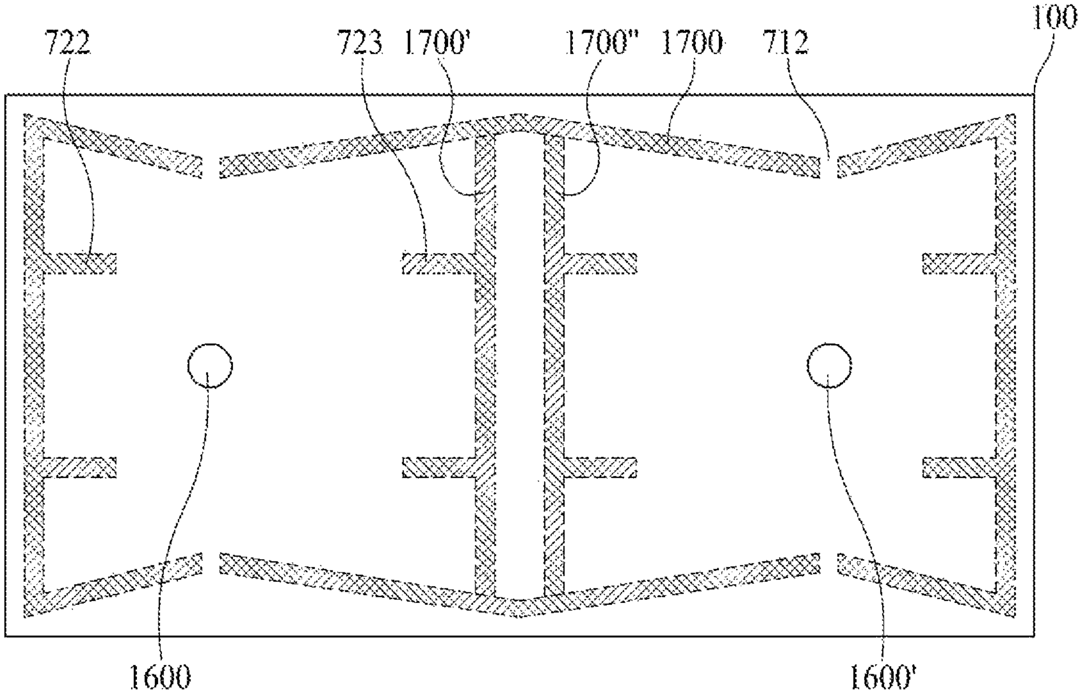

FIGS. 15H and 15I show that a protrusion portion 722 and a second protrusion portion 723 are provided. The protrusion portion 722 and the second protrusion portion 723 are formed in each of the first side of the four sides of the display panel 100, and the second side opposite to the first side. The protrusion portion 722 and the second protrusion portion 723 disposed in the left area of the display panel 100 are disposed toward the first sound generating device 1600, and the protrusion portion 722 and the second protrusion portion 723 disposed in the right area of the display panel 100 are disposed toward the second sound generating device 1600'. Due to the protrusion portion 722 and the second protrusion portion 723, it may be possible to trap the reflected wave and to decrease the reduction of sound pressure level by the standing wave.

FIG. 15H shows the sealed structure of the third partition, and FIG. 15I shows the unsealed structure of the third partition 1700. A description for the third partition 1700 may be the same as that of FIGS. 15D to 15G.

Figure 15J:
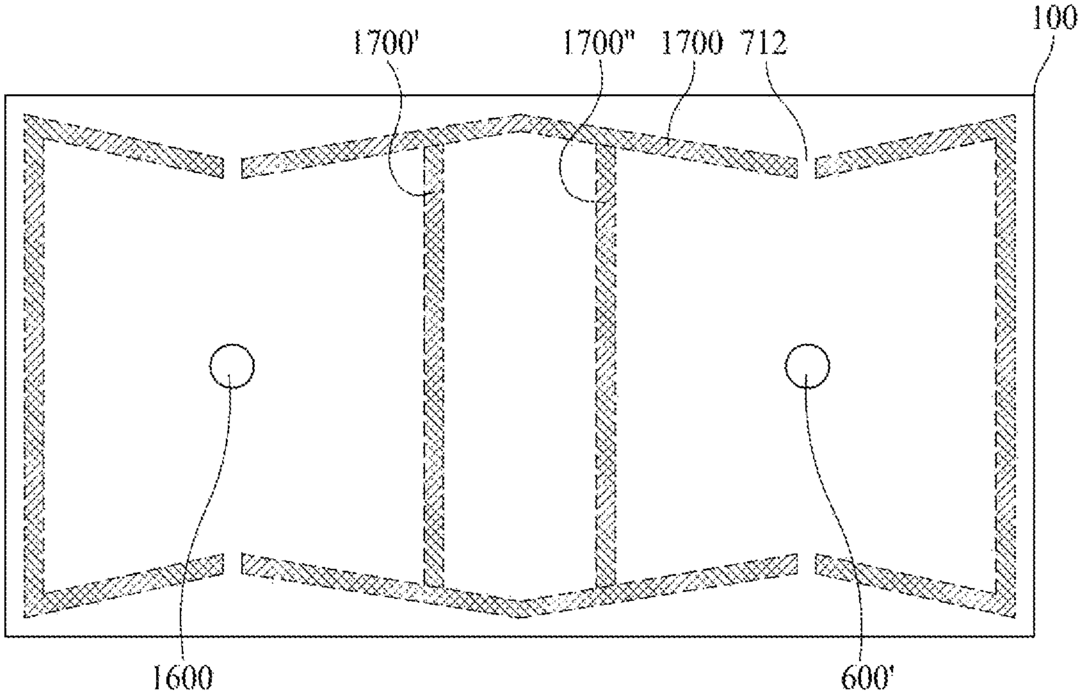
Figure 15K:
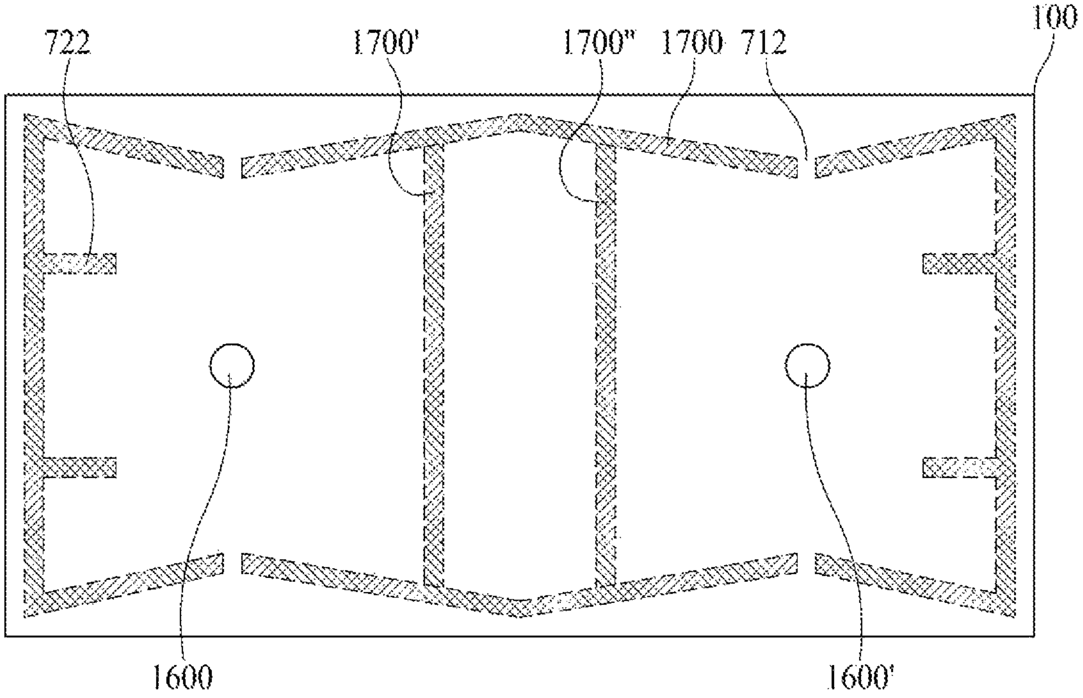

As shown in FIGS. 15J and 15K, an interval or a distance between the first partition 1700' and the second partition 1700" may be larger than that shown in FIGS. 15A to 15I. In this case, the sound output characteristics of the low-pitched sound band may be improved in comparison to the case of the first, second, and third areas having a same size.

FIG. 15K shows the protrusion portion 722 is further provided. The protrusion portion 722 may be the same as that of FIG. 15E. The structure of sound generating device and partition shown in FIGS. 15D to 15I may be identically applied to the structure shown in FIGS. 15J and 15K.

FIGS. 15D to 15K show that one sound generating device is disposed in each of the first and second areas of the display panel 100. As described in FIG. 15B, the two sound generating devices adjacent to each other may be disposed in each of the first and second areas of the display panel 100 shown in FIGS. 15D to 15K. As described in FIG. 15C, a pair of sound generating devices may be disposed in each of the first and second areas of the display panel 100 shown in FIGS. 15D to 15K.

In FIGS. 15A to 15K, the display panel 100 has the three areas, and the sound generating device is not disposed in the third area corresponding to the central area of the display panel 100. The size of the third area is relatively smaller than the size in each of the first area and the second area so that it may possible to improve the sound output characteristics of the low-pitched sound band. In order to realize good sound output characteristics both in the middle-high-pitched sound band and the low-pitched sound band, the first area, the second area, and the third area may have the same size. In order to improve the sound output characteristics of the low-pitched sound band, the size of the third area may be relatively larger than the size in each of the first area and the second area.

In FIGS. 15J and 15K, the third partition 1700 is formed in an unsealed structure. However, the third partition 1700 may be formed in a sealed structure.

In FIGS. 15A to 15K, while the sound generating device is not disposed in the center of the left area corresponding to the first area or the center of the right area corresponding to the second area in the display panel 100, but disposed more toward the left area or right area of the display panel 100, embodiments are not limited thereto. For example, the sound generating device may be disposed in the center of the left area corresponding to the first area or the center of the right area corresponding to the second area in the display panel 100. The sound generating devices may be asymmetrically disposed in the first and second areas of the display panel 100. If the sound generating device is disposed more toward the left area or right area of the display panel 100, the stereo sound characteristics may be improved in comparison to the case where the sound generating device is disposed in the center of the left area corresponding to the first area or the center of the right area corresponding to the second area in the display panel 100.

In FIGS. 15A to 15K, the adhesion member for adhering the display panel and the supporting member to each other may be provided between the periphery of the display panel and the periphery of the supporting member, as explained in FIG. 12.

The sound output characteristics of the sound generating device having the bent portion will be described with reference to FIG. 16, and the sound output characteristics of the sound generating device having the bent portion and the protrusion portion will be described with reference to FIG. 17.

Figure 16:
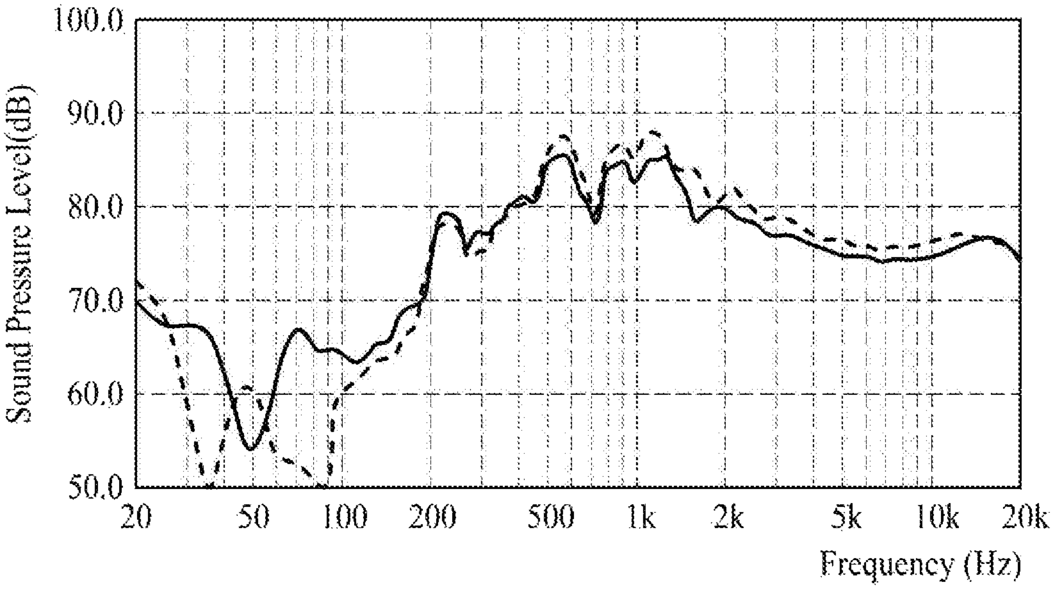
FIG. 16 illustrates the sound output characteristics in accordance with another example embodiment of the sound generating device and partition in the display apparatus according to the present disclosure.

FIG. 16 illustrates the sound output characteristics in accordance with another example embodiment of the sound generating device and partition in the display apparatus according to the present disclosure.

In FIG. 16, a dotted line indicates the sound output characteristics of FIG. 15A, and a solid line indicates the sound output characteristics of FIG. 15D. With reference to FIG. 16, in comparison to the case without the bent portion, the case with the bent portion has the improved sound output characteristics in the low-pitched sound band of about 200 Hz or less than 200 Hz.

Figure 17:
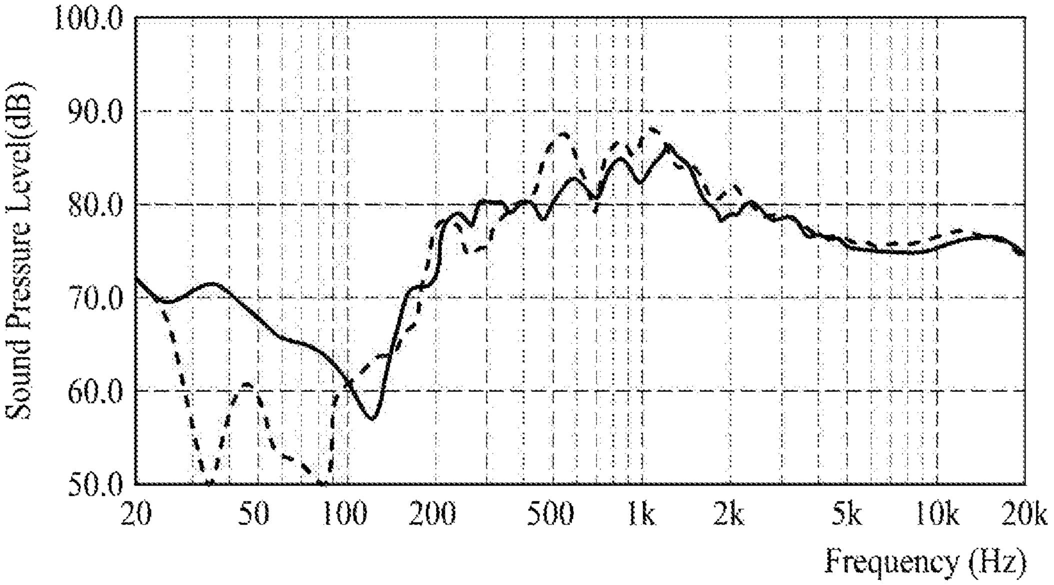
FIG. 17 illustrates the sound output characteristics in accordance with another example embodiment of the sound generating device and partition in the display apparatus according to the present disclosure.

FIG. 17 illustrates the sound output characteristics in accordance with another example embodiment of the sound generating device and partition in the display apparatus according to the present disclosure.

In FIG. 17, a dotted line indicates the sound output characteristics of FIG. 15A, and a solid line indicates the sound output characteristics of FIG. 15E. With reference to FIG. 17, in comparison to the case without the bent portion and the protrusion portion, the case with the bent portion and the protrusion portion has improved frequency characteristics in the entire sound band.

The sound output characteristics of FIGS. 16 and 17 may be measured by a sound analyzing apparatus. The sound analyzing apparatus may include a sound card for receiving sound from a control PC and transmitting sound to the control PC, an amplifier for amplifying the sound (signal) generated from the sound card and transmitting the amplified sound to the sound generating device 1600 and 1600', and a microphone for collecting the sound generated in the display panel through the sound generating device 1600 and 1600'. The sound collected in the microphone is provided to the control PC through the sound card, and then the control PC checks the provided sound, and analyzes the sound of the sound generating device 1600 and 1600'.

Figure 18A:
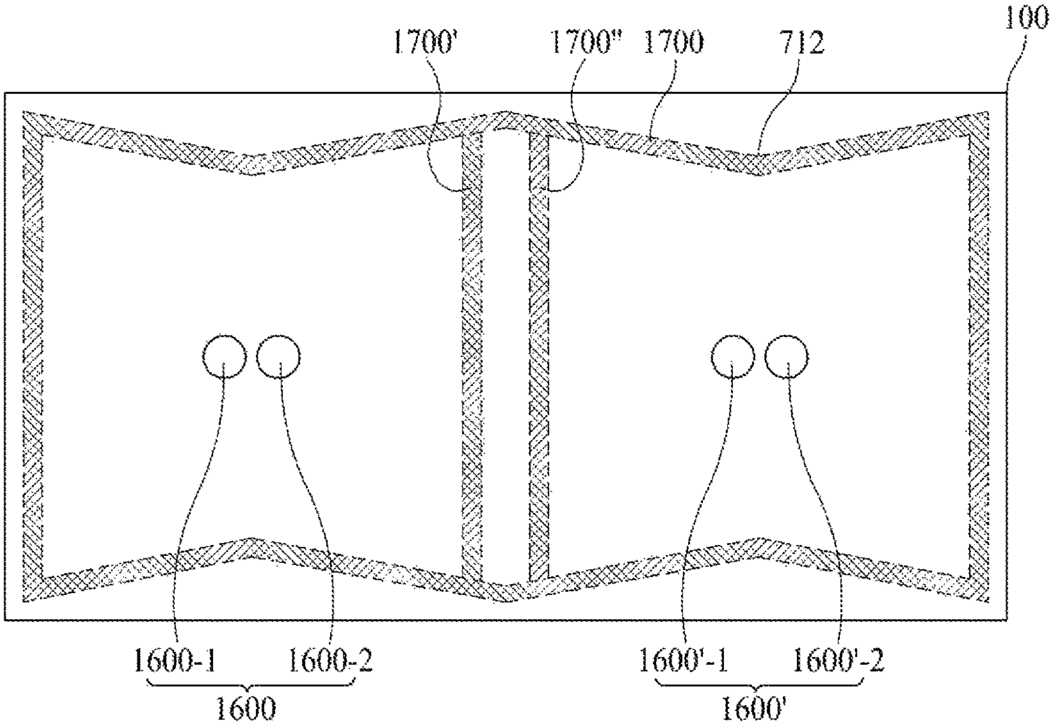
FIGS. 18A to 18D illustrate another example embodiment of the sound generating device and partition in the display apparatus according to the present disclosure.
Figure 18B:
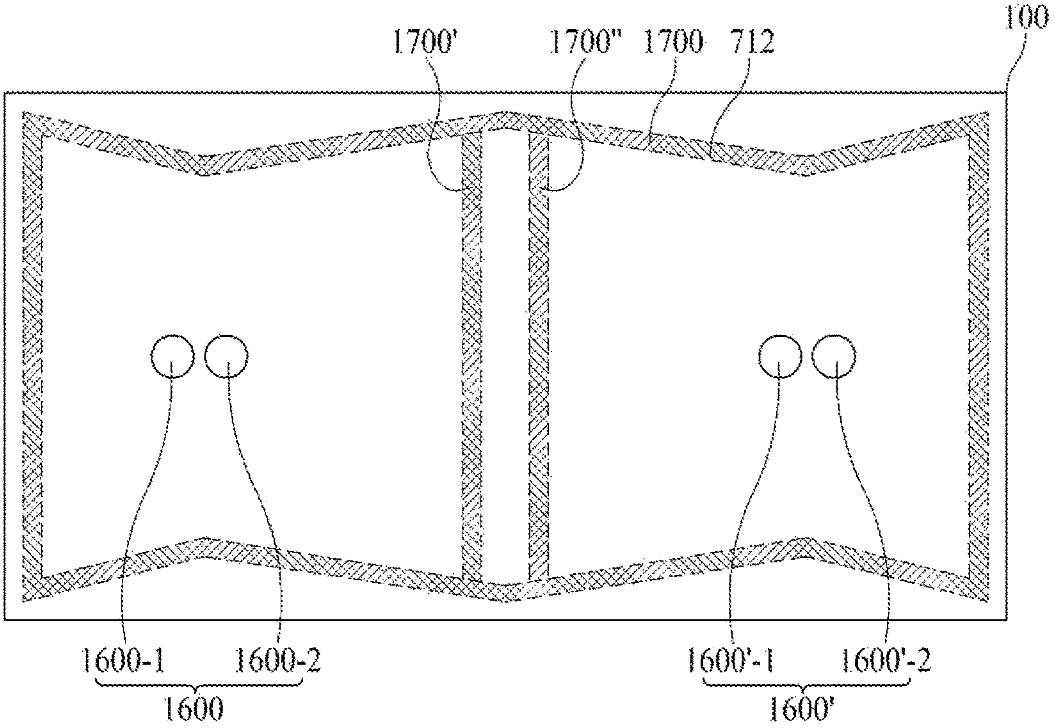
Figure 18C:
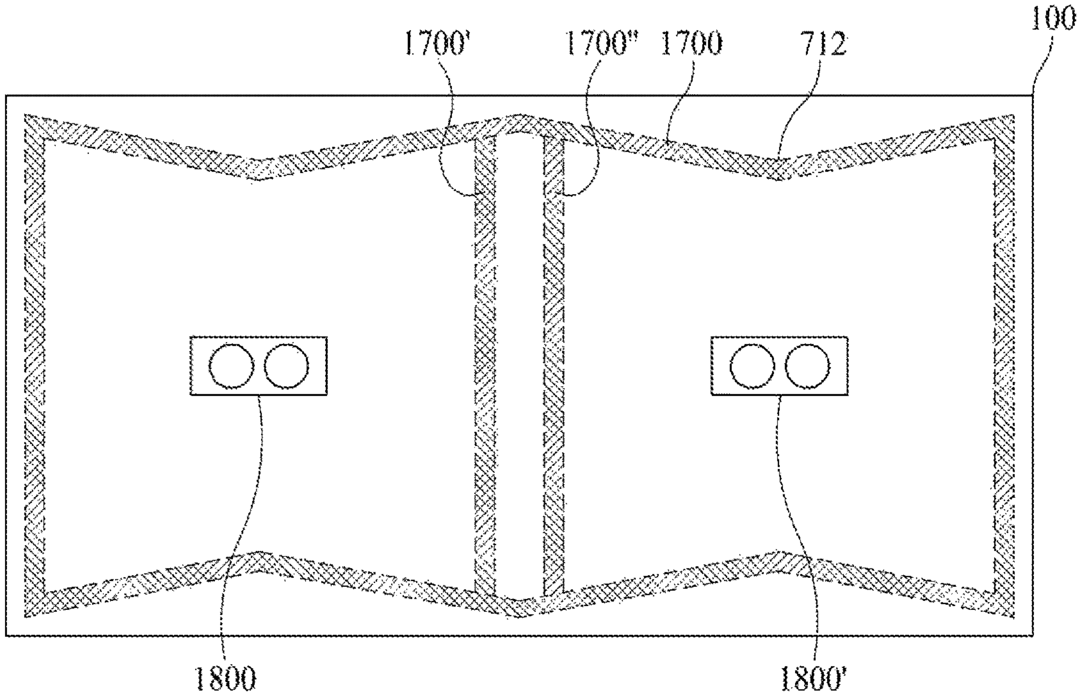
Figure 18D:
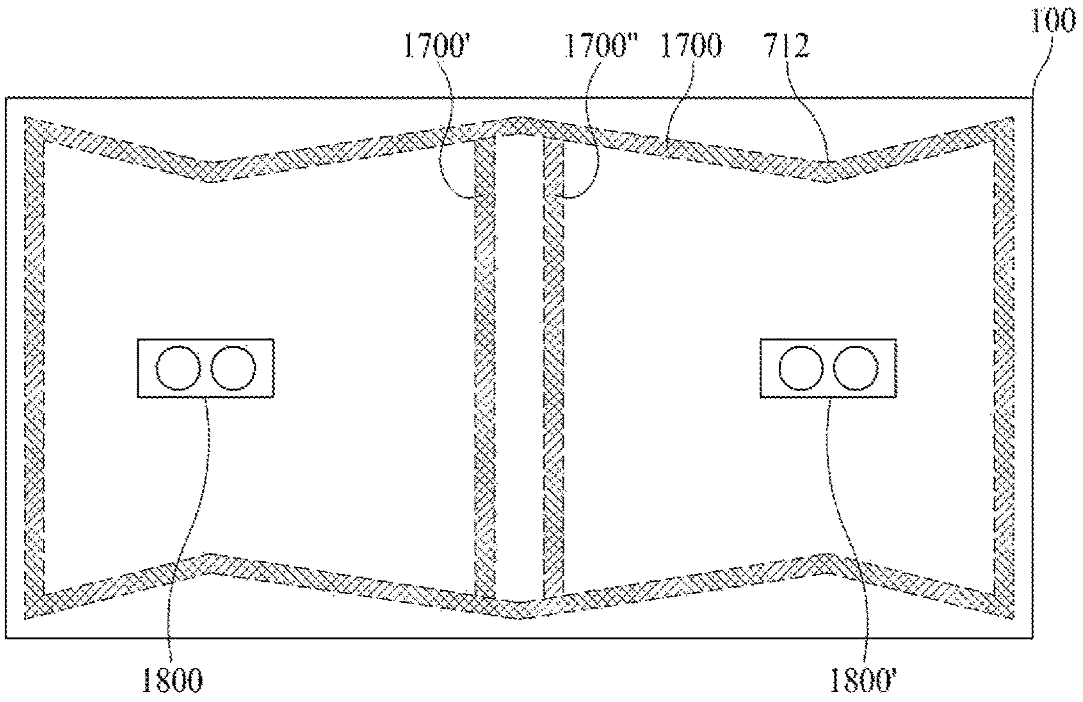

FIGS. 18A to 18D illustrate another example embodiment of the sound generating device and partition in the display apparatus according to the present disclosure. In FIGS. 18A and 18B, the two sound generating devices are provided in each of the first and second areas of the display panel. In FIGS. 18C and 18D, the two sound generating devices adjacent to each other are provided in each of the first and second areas of the display panel.

In FIGS. 18A to 18D, the third partition 1700 is formed in the sealed structure. In detail, the third partition 1700 may be formed in the zigzag shape and sealed structure. The bent portion 712 may be formed in the sealed structure, and the bent shape between the first partition 1700' and the second partition 1700" may be formed in the unsealed structure. The bent shape disposed between the first partition 1700' and the second partition 1700" may be formed in a straight line shape, a curved line shape, or a round shape, but is not limited to these shapes.

FIGS. 18A and 18C show the sound generating device is disposed in the center of the left area corresponding to the first area of the display panel 100 or the center of the right area corresponding to the second area of the display panel 100. FIGS. 18B and 18D show the sound generating devices are asymmetrically disposed. In detail, the sound generating device is disposed more toward the left area as the firs area or right area as the second area of the display panel 100.

With reference to FIGS. 18A and 18B, the first sound generating device 1600 including the two sub sound generating devices 1600-1 and 1600-2 is disposed in the first area corresponding to the left area of the display panel 100. The second sound generating device 1600' including the two sub sound generating devices 1600'-1 and 1600'-2 is disposed in the second area corresponding to the right area of the display panel 100. The first partition 1700' and the second partition 1700" are disposed between the first sound generating device 1600 and the second sound generating device 1600', and the third partition 1700 is disposed in the periphery of the display panel 100. The first partition 1700' including the two or more sub partitions may be disposed between the first sound generating device 1600 and the second sound generating device 1600'. And, the bent portion 712 is formed in at least one side of the third partition 1700, and the bent portion 712 is provided toward the center of the first sound generating device 1600 with the two sub sound generating devices 1600-1 and 1600-2 and the center of the two sub sound generating devices 1600'-1 and 1600'-2 as the second sound generating device 1600'.

As described in FIGS. 15E, 15G, and 15K, one or more protrusion portions may be further provided in the side which is perpendicular to the side with the bent portion 712, or one or more protrusion portions may be further provided in the side of the third partition 1700. As described in FIGS. 15H and 15I, one or more protrusion portions may be further provided in each of the side which is provided with the bent portion 712 and the side which is perpendicular to the side with the bent portion 712, or one or more protrusion portions may be further provided in each side of the first partition 1700', the second partition 1700", and the third partition 1700.

With reference to FIGS. 18C and 18D, a pair of first sound generating devices 1800 is disposed in the first area corresponding to the left area of the display panel 100, and a pair of second sound generating devices 1800' is disposed in the second area corresponding to the right area of the display panel 100. The first partition 1700' and the second partition 1700" may be disposed between the first sound generating device 1800 and the second sound generating device 1800'. The third partition 1700 is disposed in the periphery of the display panel 100. The first partition 1700' including the two or more sub partitions may be disposed between the first sound generating device 1800 and the second sound generating device 1800'. The bent portion 712 is formed in at least one side of the third partition 1700. The bent portion 712 may be disposed toward the center in a pair of first sound generating device 1800 and the center in a pair of the second sound generating device 1800'.

As described in FIGS. 15E, 15G, and 15K, one or more protrusion portions may be further provided in the side which is perpendicular to the side with the bent portion 712, or one or more protrusion portions may be further provided in the side of the third partition 1700.

As described in FIGS. 15H and 15I, one or more protrusion portions may be further provided in each of the side which is provided with the bent portion 712 and the side which is perpendicular to the side with the bent portion 712, or one or more protrusion portions may be further provided in each side of the first partition 1700', the second partition 1700", and the third partition 1700.

In FIGS. 18A to 18D, the adhesion member for adhering the display panel and the supporting member to each other may be disposed between the periphery of the display panel and the periphery of the supporting member, as explained in FIG. 12.

Figure 19A:
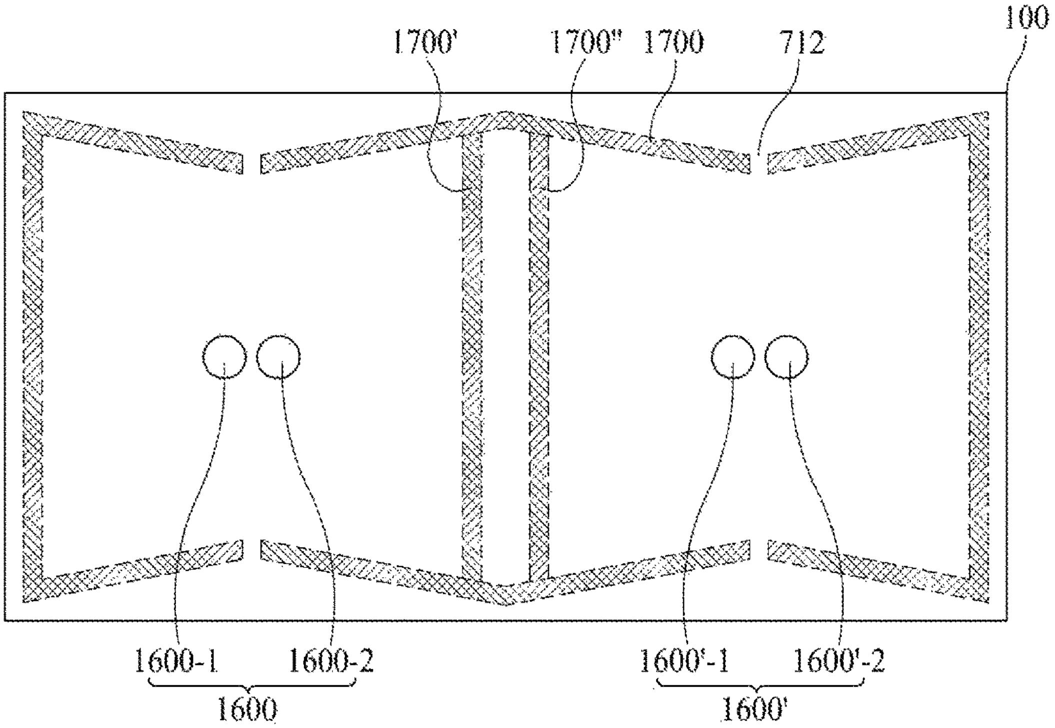
FIGS. 19A to 19D illustrate another example embodiment of the sound generating device and partition in the display apparatus according to the present disclosure.
Figure 19B:
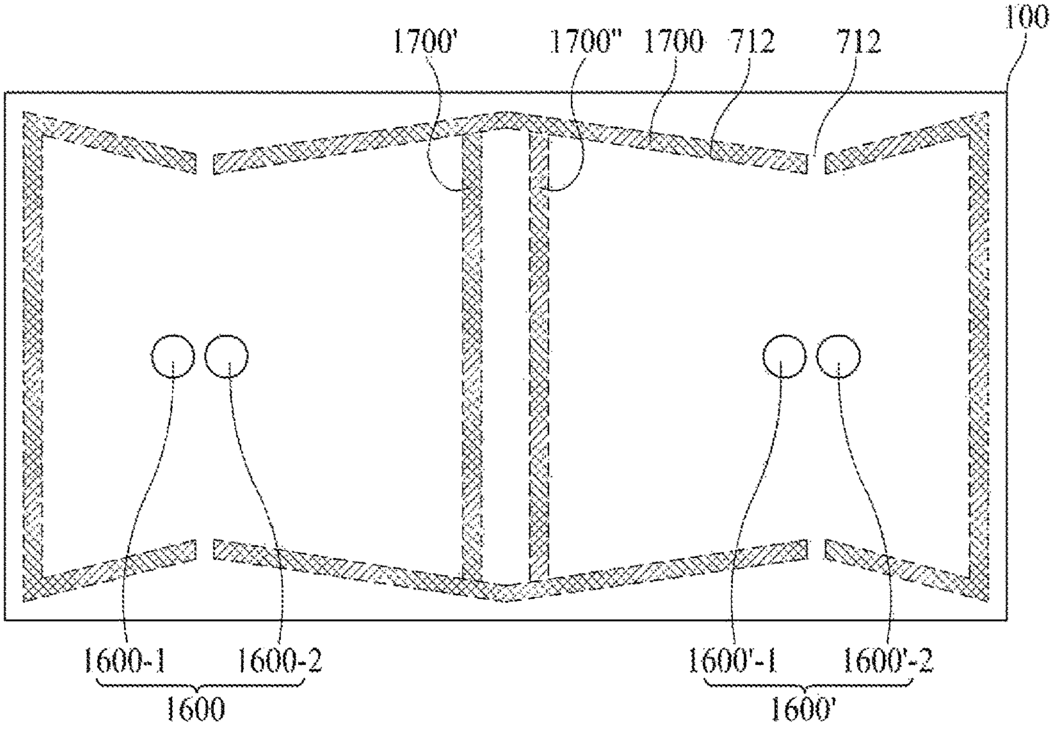
Figure 19C:
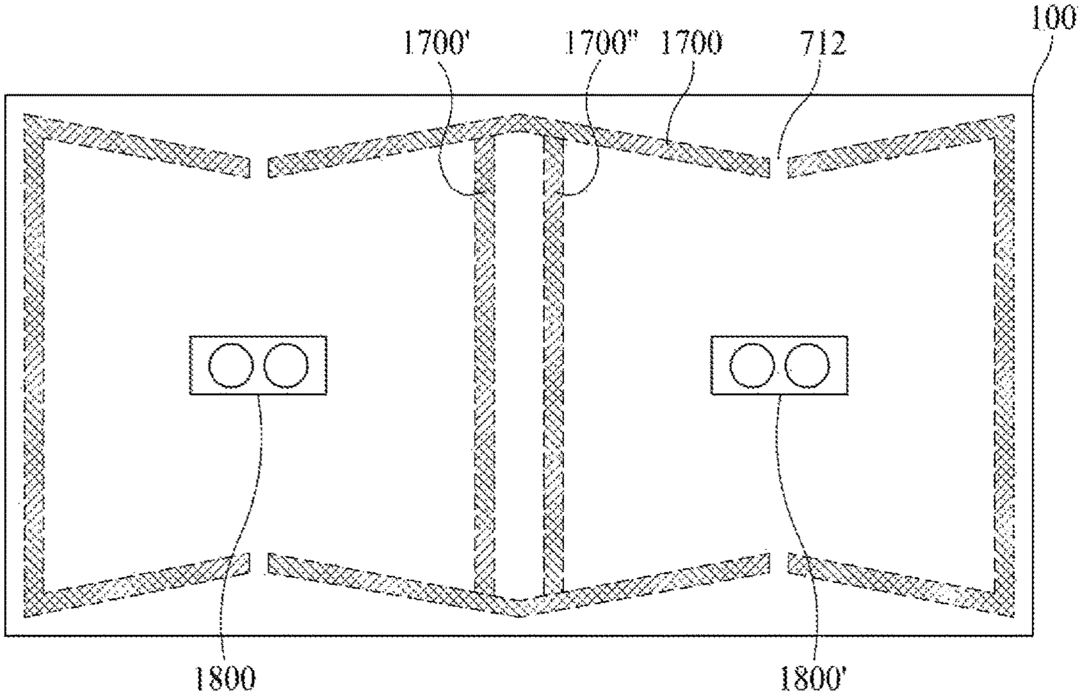
Figure 19D:
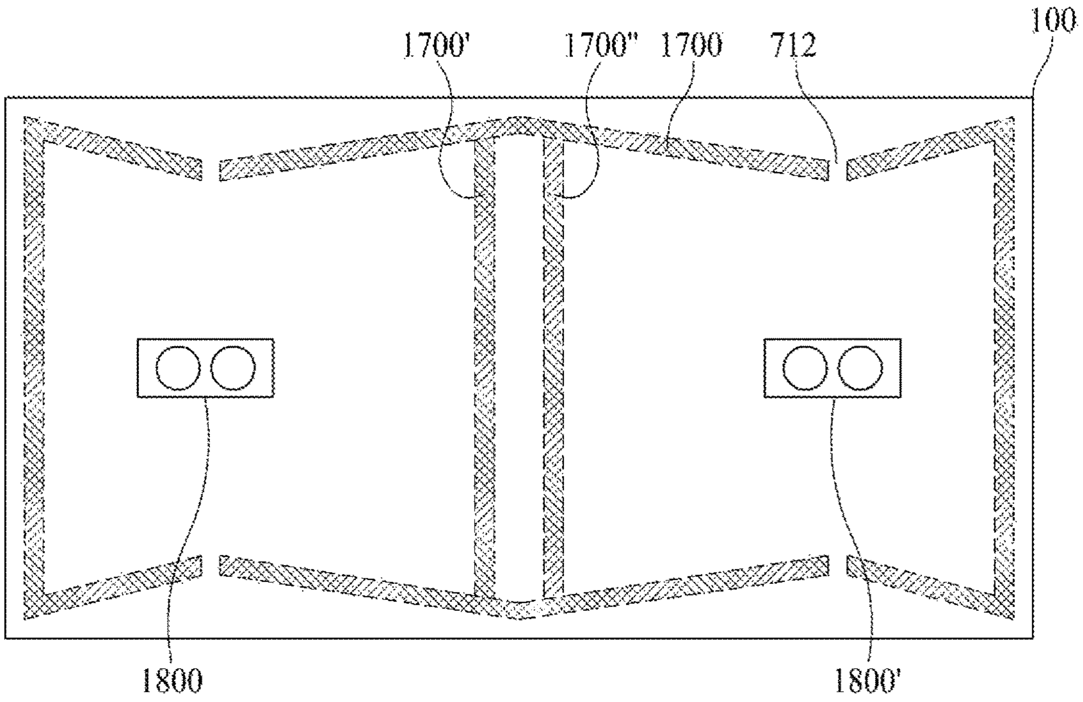

FIGS. 19A to 19D illustrate another embodiment of the sound generating device and partition in the display apparatus according to the present disclosure. In FIGS. 19A and 19B, the two sound generating devices are provided in each of the first and second areas of the display panel. In FIGS. 19C and 19D, the two sound generating devices adjacent to each other are provided in each of the first and second areas of the display panel.

In FIGS. 19A to 19D, the third partition 1700 is formed in the unsealed structure. In detail, the third partition 1700 may be formed in the zigzag shape and unsealed structure. The bent portion 712 may be formed in the unsealed structure, and the bent shape between the first partition 1700' and the second partition 1700" may be formed in the sealed structure. The bent shape disposed between the first partition 1700' and the second partition 1700" may be formed in a straight line shape, a curved line shape, or a round shape, but is not limited to these shapes.

In FIGS. 19A and 19C, the sound generating device is disposed in the center of the left area corresponding to the first area of the display panel 100 or the center of the right area corresponding to the second area of the display panel 100. In FIGS. 19B and 19D, the sound generating devices are asymmetrically disposed. In detail, in case of FIGS. 19B and 19D, the sound generating device is disposed more toward the left area or right area of the display panel 100.

In FIGS. 19A to 19D, as described in FIGS. 15E, 15G, and 15K, one or more protrusion portions may be further provided in the side which is perpendicular to the side with the bent portion 712, or one or more protrusion portions may be further provided in the side of the third partition 1700.

In FIGS. 19A to 19D, as described in FIGS. 15H and 15I, one or more protrusion portions may be further provided in each of the side which is provided with the bent portion 712 and the side which is perpendicular to the side with the bent portion 712, or one or more protrusion portions may be further provided in each side of the first partition 1700', the second partition 1700", and the third partition 1700.

In FIGS. 19A to 19D, the adhesion member for adhering the display panel and the supporting member to each other may be disposed between the periphery of the display panel and the periphery of the supporting member, as explained in FIG. 12.

FIGS. 20A to 20J illustrate another embodiment of the sound generating device and partition in the display apparatus according to the present disclosure.

With reference to FIGS. 20A to 20J, the display panel 100 includes first, second, and third areas. In this case, the first area corresponds to the left area of the display panel 100, the second area corresponds to the right area of the display panel 100, and the third area corresponds to the central area of the display panel 100. The first sound generating device disposed in the first area of the display panel 100 and the second sound generating device disposed in the second area of the display panel 100 may generate the middle-high-pitched sound band, and the third sound generating device disposed in the third area of the display panel 100 may generate the low-pitched sound band. Accordingly, the third sound generating device may be a woofer speaker, which enables the low-pitched sound output, and the first sound generating device and the second sound generating device enable the stereo sound output, whereby the display apparatus may have the sound output characteristics of 2.1 channel type.

Figure 20A:
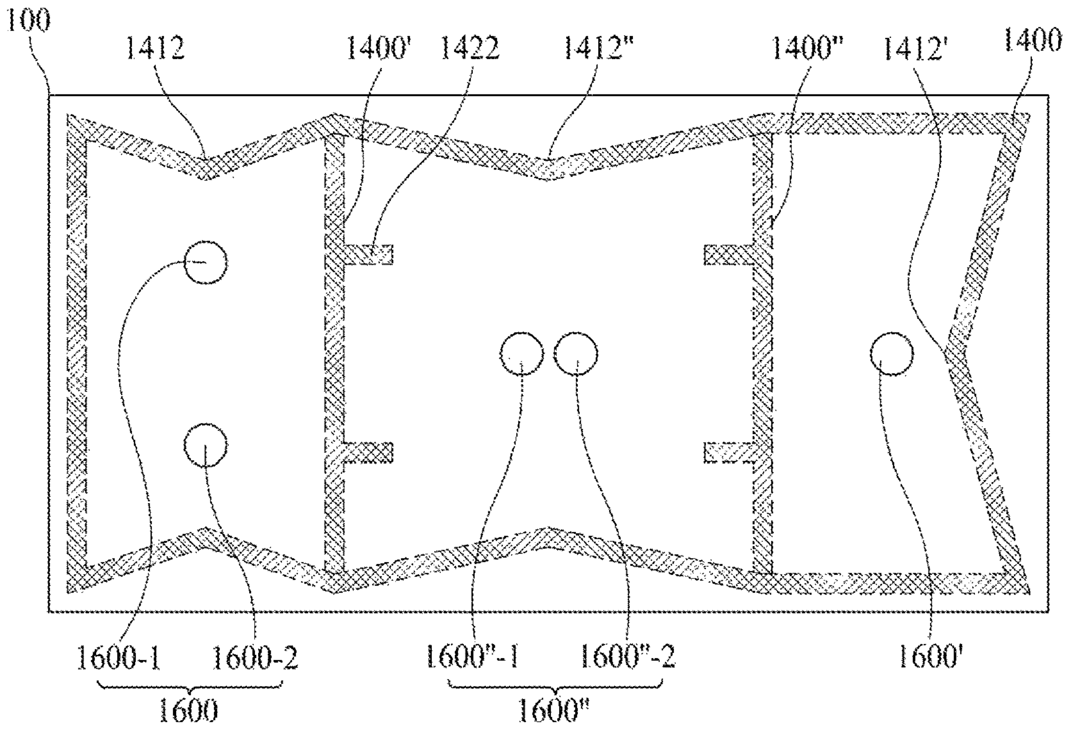
FIGS. 20A to 20J illustrate another example embodiment of the sound generating device and partition in the display apparatus according to the present disclosure.

With reference to FIG. 20A, the first sound generating device 1600 including the two sub sound generating devices 1600-1 and 1600-2 is disposed in the first area, the second sound generating device 1600' is disposed in the second area, and the third sound generating device 1600" including the two sub sound generating devices 1600"-1 and 1600"-2 is disposed in the third area. The two sub sound generating devices are adjacent to each other, and are parallel to each other in the horizontal direction or vertical direction of the display panel. In comparison to the sound generating device with the two sub sound generating devices spaced from each other, the sound generating device with the two sub sound generating devices adjacent to each other may be favorable to prevent deterioration of sound quality.

The first sound generating device 1600 disposed in the first area and the second sound generating device 1600' disposed in the second area may generate the middle-high-pitched sound band, and the third sound generating device 1600" disposed in the third area may generate the low-pitched sound band. In detail, the first sound generating device 1600 of the first area may include the 1-1 sub sound generating device 1600-1 and the 1-2 sub sound generating device 1600-2. The 1-1 sub sound generating device 1600-1 may generate the high-pitched sound band, and the 1-2 sub sound generating device 1600-2 may generate the middle-pitched sound band. The sound generated in the upper portion of the display panel 100 is relatively higher sound band than the sound generated in the lower portion of the display panel, so that it may be possible to generate the higher-pitched sound band.

The first partition 1400' is disposed between the first sound generating device 1600 and the third sound generating device 1600", and the second partition 1400" is disposed between the second sound generating device 1600' and the third sound generating device 1600". The first partition 1400' prevents the vibration of the display panel 100 from being transferred from the first area to the third area, and the second partition 1400" prevents the vibration of the display panel 100 from being transferred from the second area to the third area. The third partition 1400 is disposed in the periphery of the display panel 100, and the third partition 1400 is formed in the sealed structure.

The first bent portion 1412 is provided in the first area, and the first bent portion 1412 is provided toward the center of the two sub sound generating devices 1600-1 and 1600-2 as the first sound generating device 1600. The third bent portion 1412" is provided in the third area, and the third bent portion 1412" is provided toward the center of the two sub sound generating devices 1600"-1 and 1600"-2 as the third sound generating device 1600". If the one second sound generating device 1600' is disposed in the second area corresponding to the right area of the display panel 100, the second bent portion 1412', which is bent toward the second sound generating device 1600', is provided in the side which is perpendicular to the side with the first bent portion 1412. Herein, the second bent portion 1412' is disposed toward the center of the one second sound generating device 1600'

The protrusion portion 1422, which protrudes toward the third sound generating device 1600", is formed in the left and right sides of the third area. The protrusion portion 1422 is provided to decrease the reduction of sound pressure in the central area of the display panel 100 for the low-pitched sound band by the standing wave.

In FIG. 20A, the first sound generating device 1600 and the second sound generating device 1600' are respectively disposed in the center of the left area corresponding to the first area of the display panel 100 and the center of the right area corresponding to the second area of the display panel 100, but are not limited thereto. At least one of the first sound generating device 1600 and the second sound generating device 1600' may be disposed asymmetrically. In detail, at least one of the first sound generating device 1600 and the second sound generating device 1600' may be disposed more toward the left area or right area of the display panel 100, or each of the first sound generating device 1600 and the second sound generating device 1600' may be disposed more toward the left area and right area of the display panel 100.

Figure 20B:
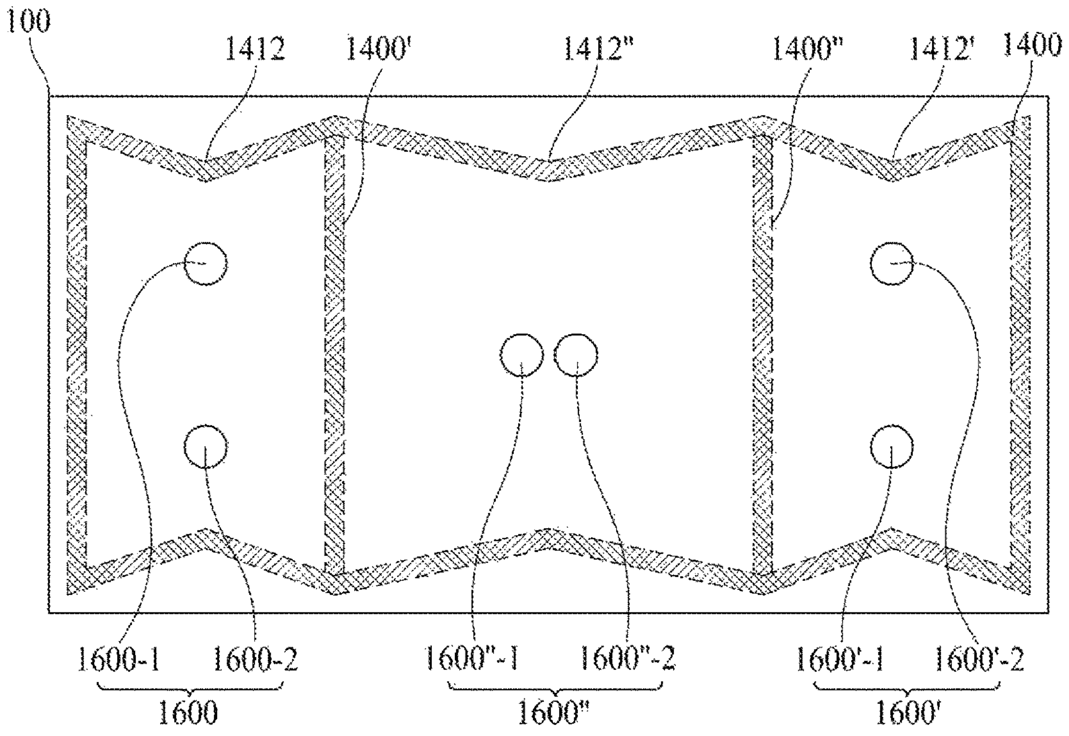

With reference to FIG. 20B, the first sound generating device 1600 including the two sub sound generating devices 1600-1 and 1600-2 is disposed in the first area, the second sound generating device 1600' including the two sub sound generating devices 1600'-1 and 1600'-2 is disposed in the second area, and the third sound generating device 1600" including the two sub sound generating devices 1600"-1 and 1600"-2 is disposed in the third area. In this case, each of the first sound generating device 1600, the second sound generating device 1600', and the third sound generating device 1600" includes the two sub sound generating devices adjacent to each other.

The first sound generating device 1600 disposed in the first area and the second sound generating device 1600' disposed in the second area may generate the middle-high-pitched sound band, and the third sound generating device 1600" disposed in the third area may generate the low-pitched sound band. In detail, the first sound generating device 1600 of the first area may include the 1-1 sub sound generating device 1600-1 and the 1-2 sub sound generating device 1600-2, and the 1-1 sub sound generating device 1600-1 may generate the high-pitched sound band, and the 1-2 sub sound generating device 1600-2 may generate the middle-pitched sound band. The second sound generating device 1600' of the second area may include the 2-1 sub sound generating device 1600'-1 and the 2-2 sub sound generating device 1600'-2, wherein the 2-1 sub sound generating device 1600'-1 may generate the high-pitched sound band, and the 2-2 sub sound generating device 1600'-2 may generate the middle-pitched sound band. The sound generated in the upper portion of the display panel 100 is relatively higher-pitched sound band than the sound generated in the lower portion of the display panel so that it may be possible to generate the higher-pitched sound band.

The first partition 1400' is disposed between the first sound generating device 1600 and the third sound generating device 1600", and the second partition 1400" is disposed between the second sound generating device 1600' and the third sound generating device 1600". The third partition 1400 is formed in the periphery of the display panel 100, and the third partition 1400 is formed in the sealed structure.

The first bent portion 1412 is provided in the first area, and the first bent portion 1412 is provided toward the center of the two sub sound generating devices 1600-1 and 1600-2 as the first sound generating device 1600. The second bent portion 1412' is provided in the second area, and the second bent portion 1412 is provided toward the center of the two sub sound generating devices 1600'-1 and 1600'-2 as the second sound generating device 1600'. The third bent portion 1412" is provided in the third area, and the third bent portion 1412" is provided toward the center of the two sub sound generating devices 1600"-1 and 1600"-2 as the third sound generating device 1600".

As described in FIG. 20A, the protrusion portion, which protrudes toward the third sound generating device 1600", may be further formed in the left and right sides of the third area, that is, in each of the first partition 1400' and the second partition 1400'.

In FIG. 20B, the first sound generating device 1600 is disposed in the center of the left area corresponding to the first area of the display panel 100, but is not limited thereto. The first sound generating device 1600 may be disposed asymmetrically. In detail, the first sound generating device 1600 may be disposed more toward the left area corresponding to the first area of the display panel 100. The second sound generating device 1600' is disposed in the center of the right area corresponding to the second area of the display panel 100, but is not limited thereto. The second sound generating device 1600' may be disposed asymmetrically. In detail, the second sound generating device 1600' may be disposed more toward the right area corresponding to the second area of the display panel 100. Accordingly, one of the first sound generating device 1600 and the second sound generating device 1600' may be disposed asymmetrically. In detail, at least one of the first sound generating device 1600 and the second sound generating device 1600' may be disposed more toward the left area or right area of the display panel 100, or each of the first sound generating device 1600 and the second sound generating device 1600' may be disposed more toward the left area and right area of the display panel 100.

Figure 20C:
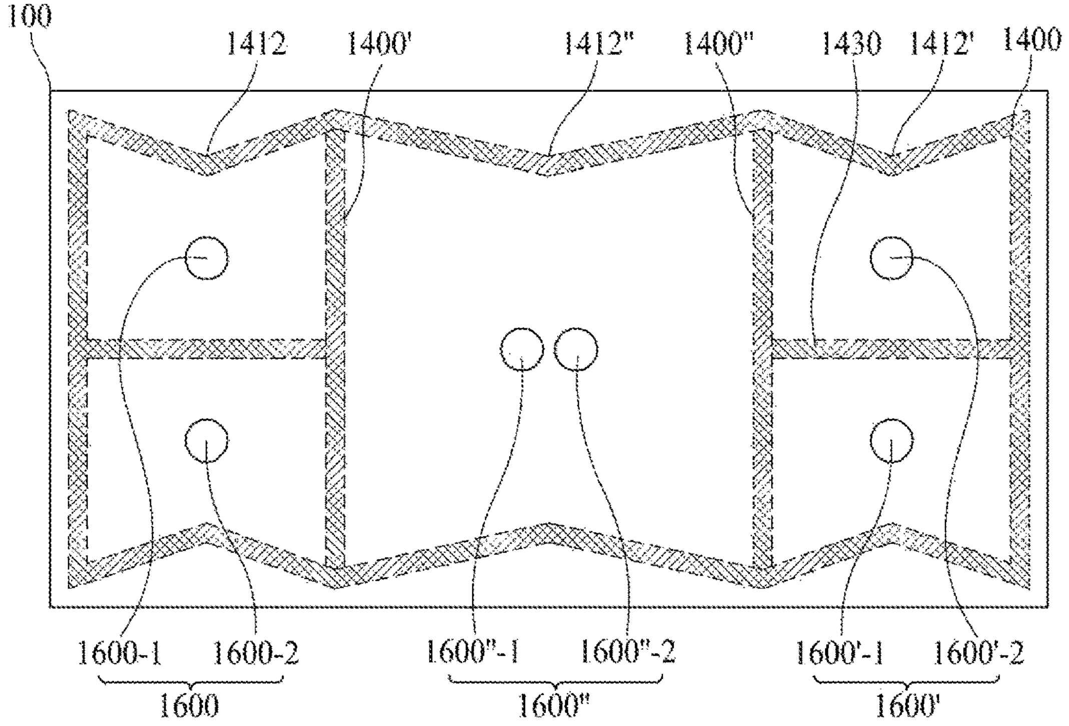

With reference to FIG. 20C, the first sound generating device 1600 including the two sub sound generating devices 1600-1 and 1600-2 is disposed in the first area, the second sound generating device 1600' including the two sub sound generating devices 1600'-1 and 1600'-2 is disposed in the second area, and the third sound generating device 1600" including the two sound generating devices being adjacent to each other is disposed in the third area.

The first partition 1400' is disposed between the first sound generating device 1600 and the third sound generating device 1600", and the second partition 1400" is disposed between the second sound generating device 1600' and the third sound generating device 1600". The third partition 1400 is formed in the periphery of the display panel 100, and the third partition 1400 is formed in the sealed structure.

And, a fourth partition 1430 is disposed between the two sub sound generating devices 1600-1 and 1600-2 included in the first sound generating device 1600 of the first area, and between the two sub sound generating devices 1600'-1 and 1600'-2 included in the second sound generating device 1600' of the second area. The fourth partition 1430 of the first area separates the high-pitched sound band and the middle-pitched sound band generated in the 1-1 sub sound generating device 1600-1 and the 1-2 sub sound generating device 1600-2 included in the first sound generating device 1600, to thereby realize the more-improved sound output characteristics. The fourth partition 1430 of the second area separates the high-pitched sound band and the middle-pitched sound band generated in the 2-1 sub sound generating device 1600'-1 and the 2-2 sub sound generating device 1600'-2 included in the second sound generating device 1600', to thereby realize the more-improved sound output characteristics.

The first bent portion 1412 is provided in the first area, and the first bent portion 1412 is disposed toward the center of the two sub sound generating devices 1600-1 and 1600-2 as the first sound generating device 1600. The second bent portion 1412' is provided in the second area, and the second bent portion 1412 is provided toward the center of the two sub sound generating devices 1600'-1 and 1600'-2 as the second sound generating device 1600'. The third bent portion 1412" is provided in the third area, and the third bent portion 1412" is provided toward the center of the two sound generating devices adjacent to each other as the third sound generating device 1600".

As shown in FIG. 20A, the protrusion portion, which protrudes toward the third sound generating device 1600", may be further formed in the left and right sides of the third area, that is, in each of the first partition 1400' and the second partition 1400".

In FIG. 20C, the first sound generating device 1600 is disposed in the center of the left area corresponding to the first area of the display panel 100, but is not limited thereto. The first sound generating device 1600 may be disposed asymmetrically. In detail, the first sound generating device 1600 may be disposed more toward the left area corresponding to the first area of the display panel 100. The second sound generating device 1600' is disposed in the center of the right area corresponding to the second area of the display panel 100, but is not limited thereto. The second sound generating device 1600' may be disposed asymmetrically. In detail, the second sound generating device 1600' may be disposed more toward the right area corresponding to the second area of the display panel 100. Accordingly, one of the first sound generating device 1600 and the second sound generating device 1600' may be disposed asymmetrically. In an example, at least one of the first sound generating device 1600 and the second sound generating device 1600' may be disposed more toward the left area or right area of the display panel 100, or each of the first sound generating device 1600 and the second sound generating device 1600' may be disposed more toward the left area and right area of the display panel 100.

In FIGS. 20B and 20C, the first sound generating device 1600 disposed in the first area, and the second sound generating device 1600' disposed in the second area may generate the middle-high-pitched sound band, and the third sound generating device 1600" disposed in the third area may generate the low-pitched sound band. In detail, the first sound generating device 1600 of the first area may include the 1-1 sub sound generating device 1600-1 and the 1-2 sub sound generating device 1600-2, the 1-1 sub sound generating device 1600-1 may generate the high-pitched sound band, and the 1-2 sub sound generating device 1600-2 may generate the middle-pitched sound band. The second sound generating device 1600' of the second area may include the 2-1 sub sound generating device 1600'-1 and the 2-2 sub sound generating device 1600'-2, the 2-1 sub sound generating device 1600'-1 may generate the high-pitched sound band, and the 2-2 sub sound generating device 1600'-2 may generate the middle-pitched sound band. The sound generated in the upper portion of the display panel 100 is a relatively higher-pitched sound band than the sound generated in the lower portion of the display panel so that it may be possible to generate the higher-pitched sound band.

Figure 20D:
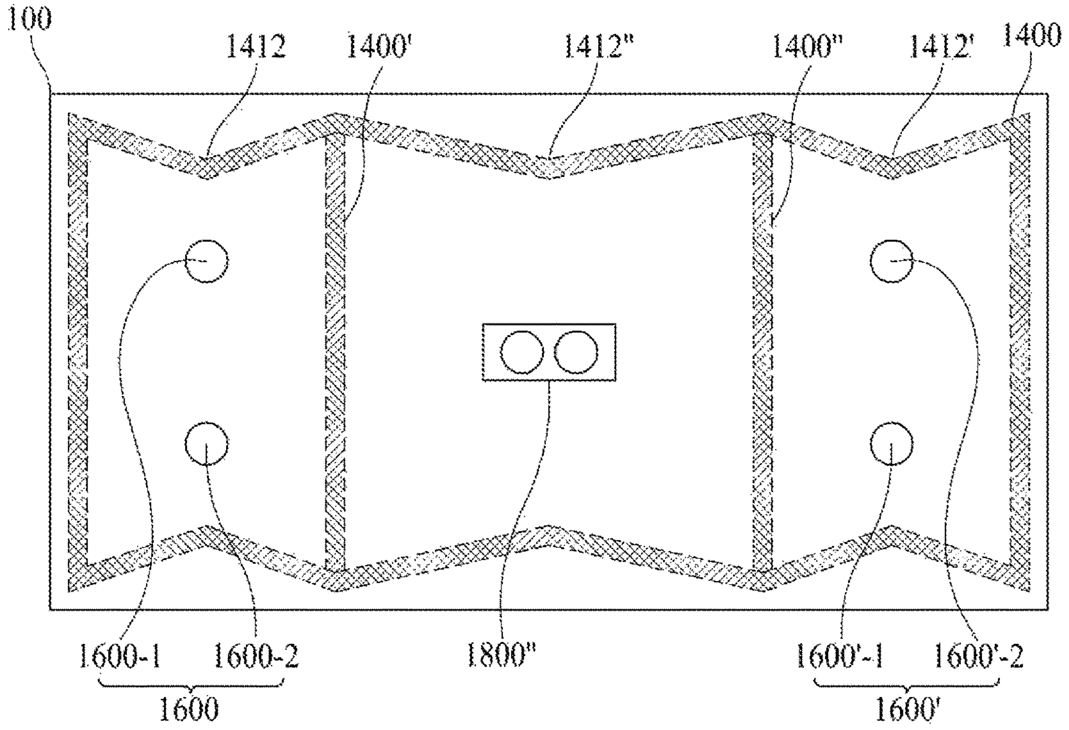

With reference to FIG. 20D, the first sound generating device 1600 including the two sub sound generating devices 1600-1 and 1600-2 is disposed in the first area, the second sound generating device 1600' including the two sub sound generating devices 1600'-1 and 1600'-2 is disposed in the second area, and the third sound generating device 1800" including a pair of third sound generating devices is disposed in the third area.

The first partition 1400' is disposed between the first sound generating device 1600 and the third sound generating device 1800", and the second partition 1400" is disposed between the second sound generating device 1600' and the third sound generating device 1800". The third partition 1400 is formed in the periphery of the display panel 100, and the third partition 1400 is formed in the sealed structure.

The first bent portion 1412 is provided in the first area, and the first bent portion 1412 is provided toward the center of the two sub sound generating devices 1600-1 and 1600-2 as the first sound generating device 1600. The second bent portion 1412' is provided in the second area, and the second bent portion 1412' is provided toward the center of the two sub sound generating devices 1600'-1 and 1600'-2 as the second sound generating device 1600'. The third bent portion 1412" is provided in the third area, and the third bent portion 1412" is provided toward the center of the two sound generating devices adjacent to each other as the third sound generating device 1800".

As shown in FIG. 20A, the protrusion portion, which protrudes toward the third sound generating device 1800", may be further formed in the left and right sides of the third area, that is, in each of the first partition 1400' and the second partition 1400".

Figure 20E:
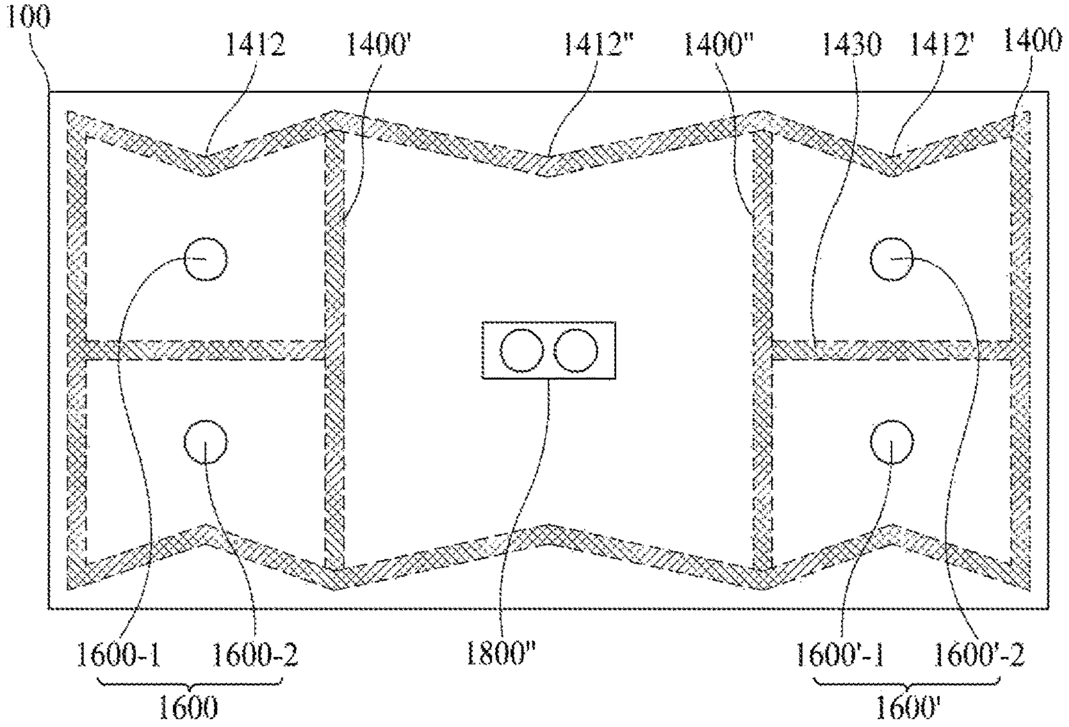

With reference to FIG. 20E, the first sound generating device 1600 including the two sub sound generating devices 1600-1 and 1600-2 is disposed in the first area, the second sound generating device 1600' including the two sub sound generating devices 1600'-1 and 1600'-2 is disposed in the second area, and the third sound generating device 1800" with one pair of sound generating devices is disposed in the third area. The first partition 1400' is disposed between the first sound generating device 1600 and the third sound generating device 1800", and the second partition 1400" is disposed between the second sound generating device 1600' and the third sound generating device 1800". The third partition 1400 is formed in the periphery of the display panel 100, and the third partition 1400 is formed in the sealed structure.

A fourth partition 1430 is disposed between the two sub sound generating devices 1600-1 and 1600-2 included in the first sound generating device 1600 of the first area, and between the two sub sound generating devices 1600'-1 and 1600'-2 included in the second sound generating device 1600' of the second area. The fourth partition 1430 of the first area separates the high-pitched sound band and the middle-pitched sound band generated in the 1-1 sub sound generating device 1600-1 and the 1-2 sub sound generating device 1600-2 included in the first sound generating device 1600, to thereby realize more improved sound output characteristics. The fourth partition 1430 of the second area separates the high-pitched sound band and the middle-pitched sound band generated in the 2-1 sub sound generating device 1600'-1 and the 2-2 sub sound generating device 1600'-2 included in the second sound generating device 1600', to thereby realize more improved sound output characteristics.

The first bent portion 1412 is provided in the first area, and the first bent portion 1412 is provided toward the center of the two sub sound generating devices 1600-1 and 1600-2 as the first sound generating device 1600. The second bent portion 1412' is provided in the second area, and the second bent portion 1412 is provided toward the center of the two sub sound generating devices 1600'-1 and 1600'-2 as the second sound generating device 1600'. The third bent portion 1412" is provided in the third area, and the third bent portion 1412" is provided toward the center of the two sound generating devices adjacent to each other as the third sound generating device 1800".

As shown in FIG. 20A, the protrusion portion, which protrudes toward the third sound generating device 1800", may be further formed in the left and right sides of the third area, that is, in each of the first partition 1400' and the second partition 1400".

In FIGS. 20D and 20E, the first sound generating device 1600 is disposed in the center of the left area corresponding to the first area of the display panel 100, but is not limited thereto. The first sound generating device 1600 may be disposed asymmetrically. In detail, the first sound generating device 1600 may be disposed more toward the left area corresponding to the first area of the display panel 100. The second sound generating device 1600' is disposed in the center of the right area corresponding to the second area of the display panel 100, but is not limited thereto. The second sound generating device 1600' may be disposed asymmetrically. In detail, the second sound generating device 1600' may be disposed more toward the right area corresponding to the second area of the display panel 100. Accordingly, one of the first sound generating device 1600 and the second sound generating device 1600' may be disposed asymmetrically. In an example, at least one of the first sound generating device 1600 and the second sound generating device 1600' may be disposed more toward the left area or right area of the display panel 100, or each of the first sound generating device 1600 and the second sound generating device 1600' may be disposed more toward the left area and right area of the display panel 100.

In FIGS. 20D and 20E, the first sound generating device 1600 disposed in the first area and the second sound generating device 1600' disposed in the second area may generate the middle-high-pitched sound band, and the third sound generating device 1800" disposed in the third area may generate the low-pitched sound band. In detail, the first sound generating device 1600 of the first area may include the 1-1 sub sound generating device 1600-1 and the 1-2 sub sound generating device 1600-2, the 1-1 sub sound generating device 1600-1 may generate the high-pitched sound band, and the 1-2 sub sound generating device 1600-2 may generate the middle-pitched sound band. The second sound generating device 1600' of the second area may include the 2-1 sub sound generating device 1600'-1 and the 2-2 sub sound generating device 1600'-2, the 2-1 sub sound generating device 1600'-1 may generate the high-pitched sound band, and the 2-2 sub sound generating device 1600'-2 may generate the middle-pitched sound band. The sound generated in the upper portion of the display panel 100 is a relatively higher-pitched sound band than the sound generated in the lower portion of the display panel so that it may be possible to generate the higher-pitched sound band.

Figure 20F:
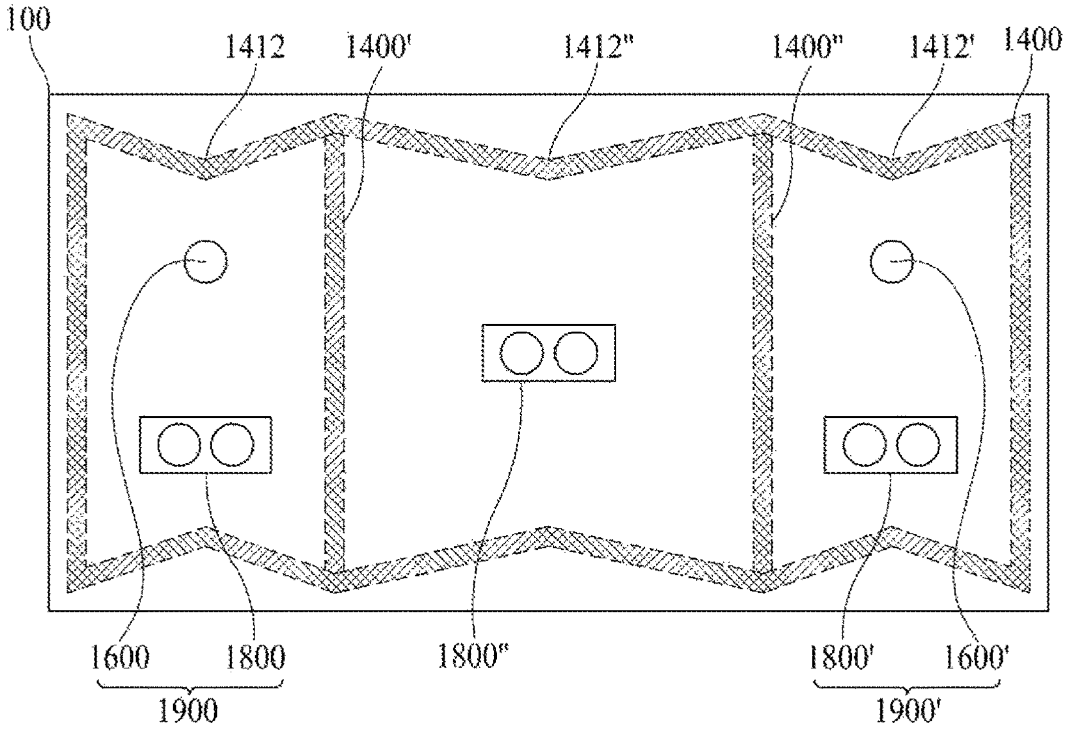

With reference to FIG. 20F, the first sound generating device 1900, which includes the first sub sound generating device 1600 with one sound generating device, and the second sub sound generating device 1800 with one pair of sound generating devices, is disposed in the first area. The second sound generating device 1900', which includes the third sub sound generating device 1600' with one sound generating device, and the fourth sub sound generating device 1800' with one pair of sound generating devices, is disposed in the second area. The third sound generating device 1800" including one pair of sound generating devices is disposed in the third area.

The first partition 1400' is disposed between the first sound generating device 1900 and the third sound generating device 1800", and the second partition 1400" is disposed between the second sound generating device 1900' and the third sound generating device 1800". The third partition 1400 is formed in the periphery of the display panel 100, and the third partition 1400 is formed in the sealed structure.

The first bent portion 1412 is provided in the first area, and the first bent portion 1412 is provided toward the center of the first sub sound generating device 1600 and the center of the second sub sound generating device 1800 including one pair of sound generating devices. The second bent portion 1412' is provided in the second area, and the second bent portion 1412' is provided toward the center of the third sub sound generating device 1600' and the center of the fourth sub sound generating device 1800' including one pair of sound generating devices. The third bent portion 1412" is provided in the third area, and the third bent portion 1412" is provided toward the center of the one pair of sound generating devices as the third sound generating device 1800".

As shown in FIG. 20A, the protrusion portion, which protrudes toward the third sound generating device 1800", may be further formed in the left and right sides of the third area, that is, in each of the first partition 1400' and the second partition 1400".

Figure 20G:
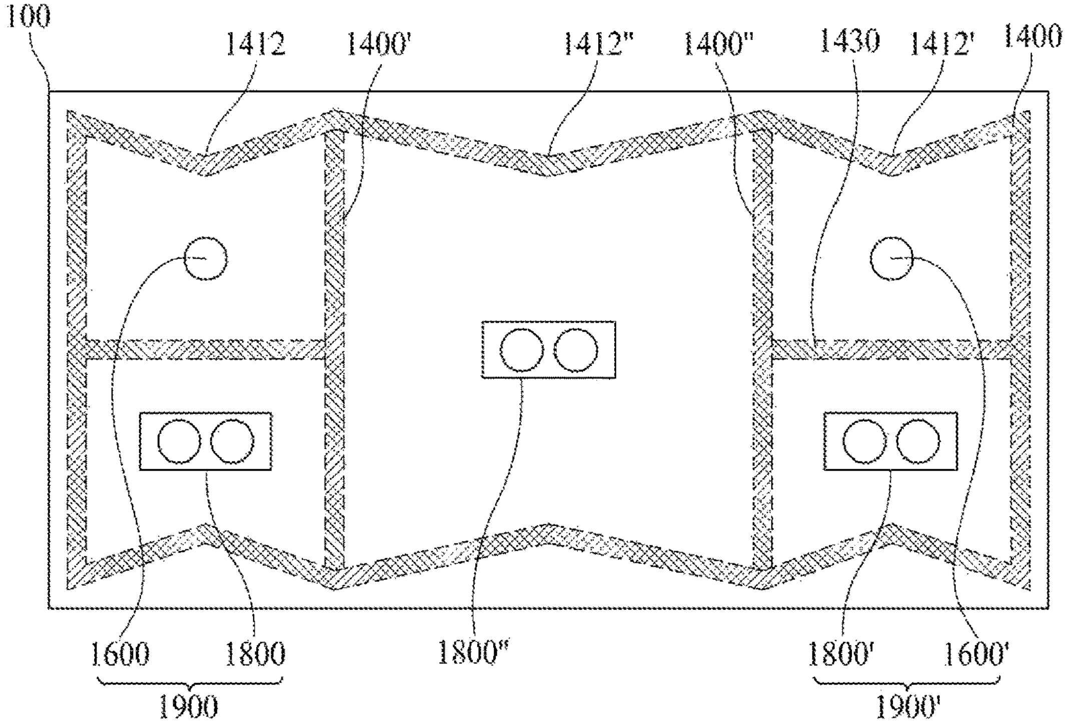

With reference to FIG. 20G, the first sound generating device 1900, which includes the first sub sound generating device 1600 with one sound generating device, and the second sub sound generating device 1800 with one pair of sound generating devices, is disposed in the first area. The second sound generating device 1900', which includes the third sub sound generating device 1600' with one sound generating device, and the fourth sub sound generating device 1800' with one pair of sound generating devices, is disposed in the second area. The third sound generating device 1800" including one pair of sound generating devices is disposed in the third area.

The first partition 1400' is disposed between the first sound generating device 1900 and the third sound generating device 1800", and the second partition 1400" is disposed between the second sound generating device 1900' and the third sound generating device 1800". The third partition 1400 is formed in the periphery of the display panel 100, and the third partition 1400 is formed in the sealed structure.

A fourth partition 1430 is disposed between the first sub sound generating device 1600 and the second sub sound generating device 1800 in the first area, and between the third sub sound generating device 1600' and the fourth sub sound generating device 1800' in the second area. The fourth partition 1430 of the first area separates the high-pitched sound band and the middle-pitched sound band generated in the first sub sound generating device 1600 and the second sub sound generating device 1800 of the first sound generating device 1900 of the first area, to thereby realize more improved sound output characteristics. The fourth partition 1430 of the second area separates the high-pitched sound band and the middle-pitched sound band generated in the third sub sound generating device 1600' and the fourth sub sound generating device 1800' of the second area, to thereby realize more improved sound output characteristics.

The first bent portion 1412 is provided in the first area, and the first bent portion 1412 is provided toward the center of the first sub sound generating device 1600 and the center of the second sub sound generating device 1800 including one pair of sound generating devices. The second bent portion 1412' is provided in the second area, and the second bent portion 1412' is provided toward the center of the third sub sound generating device 1600' and the center of the fourth sub sound generating device 1800' including one pair of sound generating devices. The third bent portion 1412" is provided in the third area, and the third bent portion 1412"

is provided toward the center of the one pair of sound generating devices as the third sound generating device 1800".

As shown in FIG. 20A, the protrusion portion, which protrudes toward the third sound generating device 1800", may be further formed in the left and right sides of the third area, that is, in each of the first partition 1400' and the second partition 1400".

In FIGS. 20F and 20G, the first sound generating device 1900 is disposed in the center of the left area corresponding to the first area of the display panel 100, but is not limited thereto. The first sound generating device 1900 may be disposed asymmetrically. In detail, the first sound generating device 1900 may be disposed more toward the left area corresponding to the first area of the display panel 100. The second sound generating device 1900' is disposed in the center of the right area corresponding to the second area of the display panel 100, but is not limited thereto. The second sound generating device 1900' may be disposed asymmetrically. In detail, the second sound generating device 1900' may be disposed more toward the right area corresponding to the second area of the display panel 100. Accordingly, one of the first sound generating device 1900 and the second sound generating device 1900' may be disposed asymmetrically. In detail, at least one of the first sound generating device 1900 and the second sound generating device 1900' may be disposed more toward the left area or right area of the display panel 100, or each of the first sound generating device 1900 and the second sound generating device 1900' may be disposed more toward the left area and right area of the display panel 100.

In FIGS. 20F and 20G, the first sound generating device 1900 disposed in the first area, and the second sound generating device 1900' disposed in the second area may generate the middle-high-pitched sound band, and the third sound generating device 1800" disposed in the third area may generate the low-pitched sound band. In detail, the first sub sound generating device 1600 included in the first sound generating device 1900 of the first area may generate the high-pitched sound band, and the second sub sound generating device 1800 included in the first sound generating device 1900 of the first area may generate the middle-pitched sound band. The third sub sound generating device 1600' included in the second sound generating device 1900' of the second area may generate the high-pitched sound band, and the fourth sub sound generating device 1800' included in the second sound generating device 1900' of the second area may generate the middle-pitched sound band. The sound generated in the upper portion of the display panel 100 is a relatively higher-pitched sound band than the sound generated in the lower portion of the display panel so that it may be possible to generate the higher-pitched sound band.

Figure 20H:
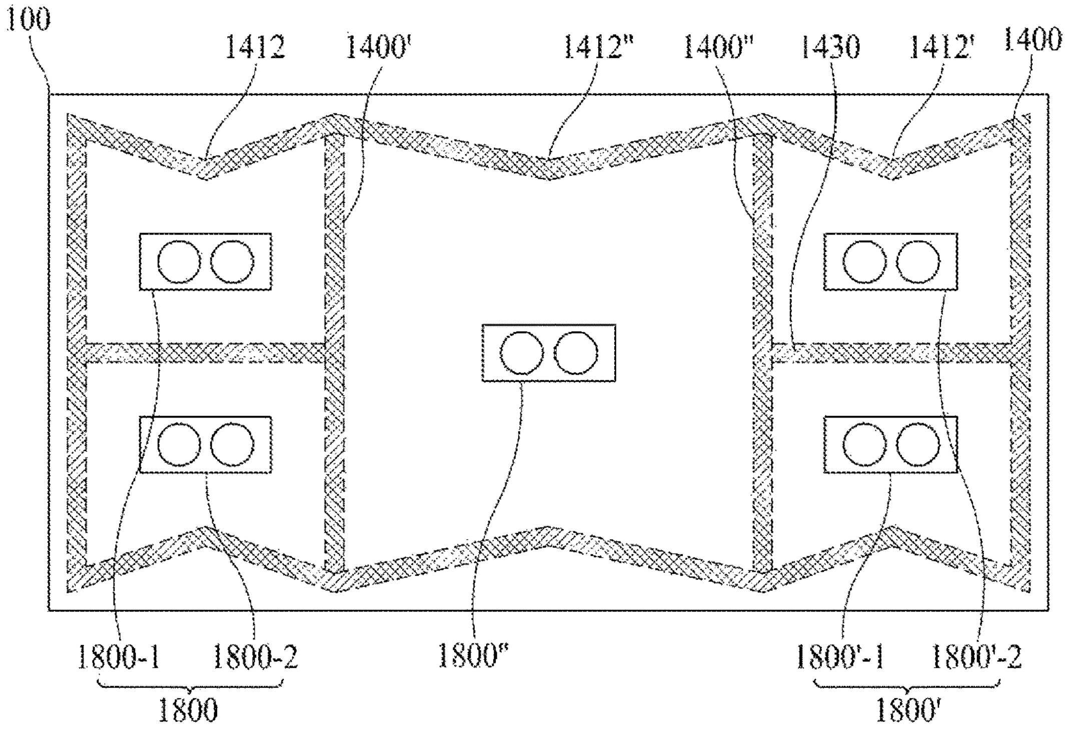

With reference to FIG. 20H, the first sound generating device 1800 including one pair of sub sound generating devices 1800-1 and 1800-2 is disposed in the first area. The second sound generating device 1800' including one pair of sub sound generating devices 1800'-1 and 1800'-2 is disposed in the second area. The third sound generating device 1800" including one pair of sound generating devices is disposed in the third area.

The first partition 1400' is disposed between the first sound generating device 1800 and the third sound generating device 1800", and the second partition 1400" is disposed between the second sound generating device 1800' and the third sound generating device 1800". The third partition 1400 is formed in the periphery of the display panel 100, and the third partition 1400 is formed in the sealed structure.

A fourth partition 1430 is disposed between the two sub sound generating devices 1800-1 and 1800-2 included in the first sound generating device 1800 of the first area, and between the two sub sound generating devices 1800'-1 and 1800'-2 included in the second sound generating device 1800' of the second area. The fourth partition 1430 of the first area separates the high-pitched sound band and the middle-pitched sound band generated in the 1-1 sub sound generating device 1800-1 and the 1-2 sub sound generating device 1800-2 included in the first sound generating device 1800, to thereby realize more improved sound output characteristics. The fourth partition 1430 of the second area separates the high-pitched sound band and the middle-pitched sound band generated in the 2-1 sub sound generating device 1800'-1 and the 2-2 sub sound generating device 1800'-2 included in the second sound generating device 1800', to thereby realize more improved sound output characteristics.

The first bent portion 1412 is provided in the first area, and the first bent portion 1412 is provided toward the center of the two sub sound generating devices 1800-1 and 1800-2. The second bent portion 1412' is provided in the second area, and the second bent portion 1412 is provided toward the center of the two sub sound generating devices 1800'-1 and 1800'-2. The third bent portion 1412" is provided in the third area, and the third bent portion 1412" is provided toward the center of the one pair of sound generating devices as the third sound generating device 1800".

As described in FIG. 20A, the protrusion portion, which protrudes toward the third sound generating device 1800", may be further formed in the left and right sides of the third area, that is, in each of the first partition 1400' and the second partition 1400".

In FIG. 20H, the first sound generating device 1800 is disposed in the center of the left area corresponding to the first area of the display panel 100, but is not limited thereto. The first sound generating device 1800 may be disposed asymmetrically. In detail, the first sound generating device 1800 may be disposed more toward the left area corresponding to the first area of the display panel 100. The second sound generating device 1800' is disposed in the center of the right area corresponding to the second area of the display panel 100, but is not limited thereto. The second sound generating device 1800' may be disposed asymmetrically. In detail, the second sound generating device 1800' may be disposed more toward the right area corresponding to the second area of the display panel 100. Accordingly, one of the first sound generating device 1800 and the second sound generating device 1800' may be disposed asymmetrically. In detail, at least one of the first sound generating device 1800 and the second sound generating device 1800' may be disposed more toward the left area or right area of the display panel 100, or each of the first sound generating device 1800 and the second sound generating device 1800' may be disposed more toward the left area and right area of the display panel 100.

With reference to FIG. 20H, the first sound generating device 1800 disposed in the first area, and the second sound generating device 1800' disposed in the second area may generate the middle-high-pitched sound band, and the third sound generating device 1800" disposed in the third area may generate the low-pitched sound band. In an example, each of the two sub sound generating devices 1800-1 and 1800-2 included in the first sound generating device 1800 of the first area may include the 1-1 sub sound generating device 1800-1 and the 1-2 sub sound generating device 1800-2, wherein the 1-1 sub sound generating device 1800-1 may generate the high-pitched sound band, and the 1-2 sub sound generating device 1800-2 may generate the middle-pitched sound band. Each of the two sub sound generating devices 1800'-1 and 1800'-2 included in the second sound generating device 1800' of the second area may include the 2-1 sub sound generating device 1800'-1 and the 2-2 sub sound generating device 1800'-2, wherein the 2-1 sub sound generating device 1800'-1 may generate the high-pitched sound band, and the 2-2 sub sound generating device 1800'-2 may generate the middle-pitched sound band. The sound generated in the upper portion of the display panel 100 is a relatively higher-pitched sound band than the sound generated in the lower portion of the display panel so that it may be possible to generate the higher-pitched sound band.

Figure 20I:
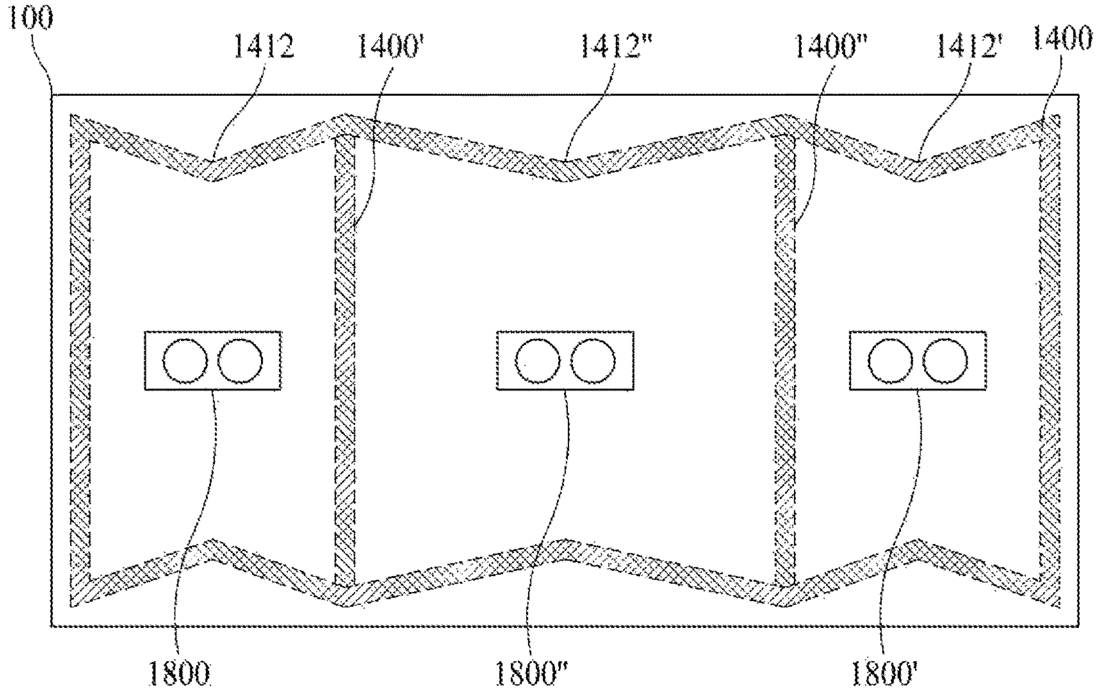

With reference to FIG. 20I, the first sound generating device 1800 including one pair of sound generating devices is disposed in the first area, the second sound generating device 1800' including one pair of sound generating devices is disposed in the second area, and the third sound generating device 1800" including one pair of sound generating devices is disposed in the third area.

The first sound generating device 1800 disposed in the first area, and the second sound generating device 1800' disposed in the second area may generate the middle-high-pitched sound band, and the third sound generating device 1800" disposed in the third area may generate the low-pitched sound band.

The first partition 1400' is disposed between the first sound generating device 1800 and the third sound generating device 1800", and the second partition 1400" is disposed between the second sound generating device 1800' and the third sound generating device 1800". The third partition 1400 is formed in the periphery of the display panel 100, and the third partition 1400 is formed in the sealed structure.

The first bent portion 1412 is provided in the first area, and the first bent portion 1412 is provided toward the center of the one pair of sound generating devices as the first sound generating device 1600. The second bent portion 1412' is provided in the second area, and the second bent portion 1412' is provided toward the center of the one pair of sound generating devices as the second sound generating device 1800'. The third bent portion 1412" is provided in the third area, and the third bent portion 1412" is provided toward the center of the one pair of sound generating devices as the third sound generating device 1800".

As shown in FIG. 20A, the protrusion portion, which protrudes toward the third sound generating device 1800", may be further formed in the left and right sides of the third area, that is, in each of the first partition 1400' and the second partition 1400".

In FIG. 20I, the first sound generating device 1800 is disposed in the center of the left area corresponding to the first area of the display panel 100, but is not limited thereto. The first sound generating device 1800 may be disposed asymmetrically. In an example, the first sound generating device 1800 may be disposed more toward the left area corresponding to the first area of the display panel 100. The second sound generating device 1800' is disposed in the center of the right area corresponding to the second area of the display panel 100, but is not limited thereto. The second sound generating device 1800' may be disposed asymmetrically. In detail, the second sound generating device 1800' may be disposed more toward the right area corresponding to the second area of the display panel 100. Accordingly, one of the first sound generating device 1800 and the second sound generating device 1800' may be disposed asymmetrically. In detail, at least one of the first sound generating device 1800 and the second sound generating device 1800' may be disposed more toward the left area or right area of the display panel 100, or each of the first sound generating device 1800 and the second sound generating device 1800' may be disposed more toward the left area and right area of the display panel 100.

Figure 20J:
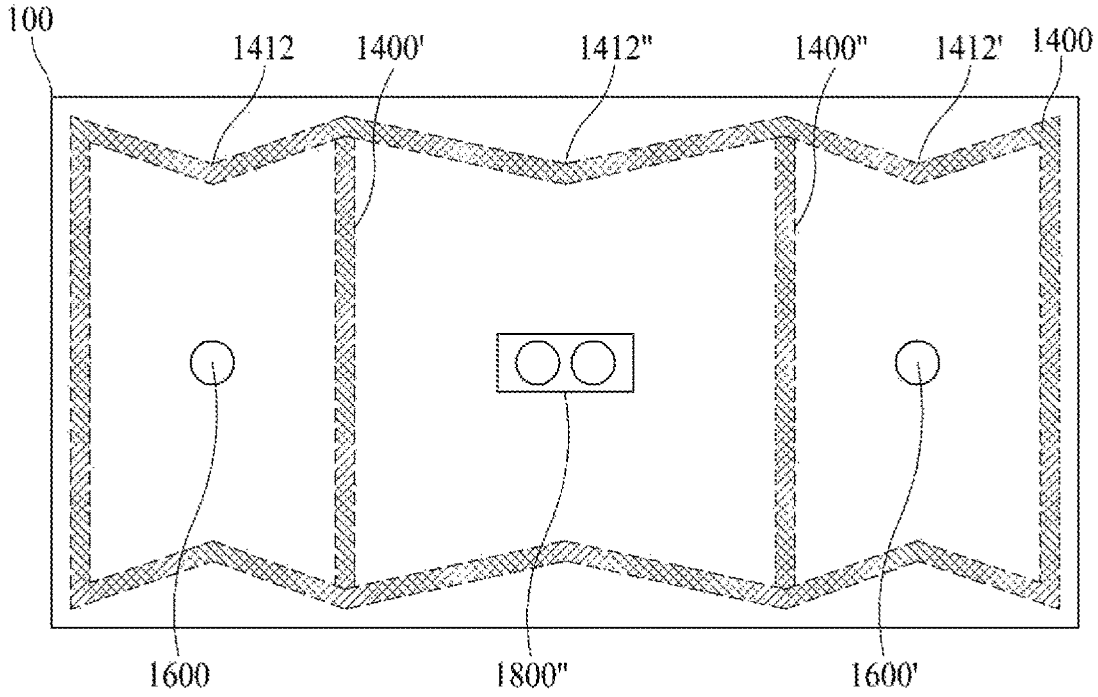

With reference to FIG. 20J, the first sound generating device 1600 is disposed in the first area, the second sound generating device 1600' is disposed in the second area, and the third sound generating device 1800" including one pair of sound generating devices is disposed in the third area.

The first sound generating device 1600 disposed in the first area, and the second sound generating device 1600' disposed in the second area may generate the middle-high-pitched sound band, and the third sound generating device 1800" disposed in the third area may generate the low-pitched sound band.

The first partition 1400' is disposed between the first sound generating device 1600 and the third sound generating device 1800", and the second partition 1400" is disposed between the second sound generating device 1600' and the third sound generating device 1800". The third partition 1400 is formed in the periphery of the display panel 100, and the third partition 1400 is formed in the sealed structure.

The first bent portion 1412 is provided in the first area, and the first bent portion 1412 is provided toward the center of the first sound generating device 1800. The second bent portion 1412' is provided in the second area, and the second bent portion 1412' is provided toward the center of the second sound generating device 1600'. The third bent portion 1412" is provided in the third area, and the third bent portion 1412" is provided toward the center of the one pair of sound generating devices as the third sound generating device 1800".

As shown in FIG. 20A, the protrusion portion, which protrudes toward the third sound generating device 1800", may be further formed in the left and right sides of the third area, that is, in each of the first partition 1400' and the second partition 1400".

In FIG. 20I, the first sound generating device 1600 is disposed in the center of the left area corresponding to the first area of the display panel 100, but is not limited thereto. The first sound generating device 1600 may be disposed asymmetrically. In an example, the first sound generating device 1600 may be disposed more toward the left area corresponding to the first area of the display panel 100. The second sound generating device 1600' is disposed in the center of the right area corresponding to the second area of the display panel 100, but is not limited thereto. The second sound generating device 1600' may be disposed asymmetrically. In detail, the second sound generating device 1600' may be disposed more toward the right area corresponding to the second area of the display panel 100. Accordingly, one of the first sound generating device 1600 and the second sound generating device 1600' may be disposed asymmetrically. In detail, at least one of the first sound generating device 1600 and the second sound generating device 1600' may be disposed more toward the left area or right area of the display panel 100, or each of the first sound generating device 1600 and the second sound generating device 1600' may be disposed more toward the left area and right area of the display panel 100.

In FIGS. 20A to 20J, the adhesion member for adhering the display panel and the supporting member to each other may be disposed between the periphery of the display panel and the periphery of the supporting member, as explained in FIG. 12.

FIGS. 21A to 21J illustrate another example embodiment of the sound generating device and partition in the display apparatus according to the present disclosure. With reference to FIGS. 21A to 21J, the display panel 100 includes first, second, and third areas. In this case, the first area corresponds to the left area of the display panel 100, the second area corresponds to the right area of the display panel 100, and the third area corresponds to the central area of the display panel 100. The first sound generating device disposed in the first area of the display panel 100, and the second sound generating device disposed in the second area of the display panel 100 may generate the middle-high-pitched sound band, and the third sound generating device disposed in the third area of the display panel 100 may generate the low-pitched sound band. Accordingly, the third sound generating device may be a woofer speaker, which enables the low sound output, and the first sound generating device and the second sound generating device enable the stereo sound output, whereby the display apparatus according to an example embodiment of the present disclosure may have the sound output characteristics of 2.1 channel type.

Figure 21A:
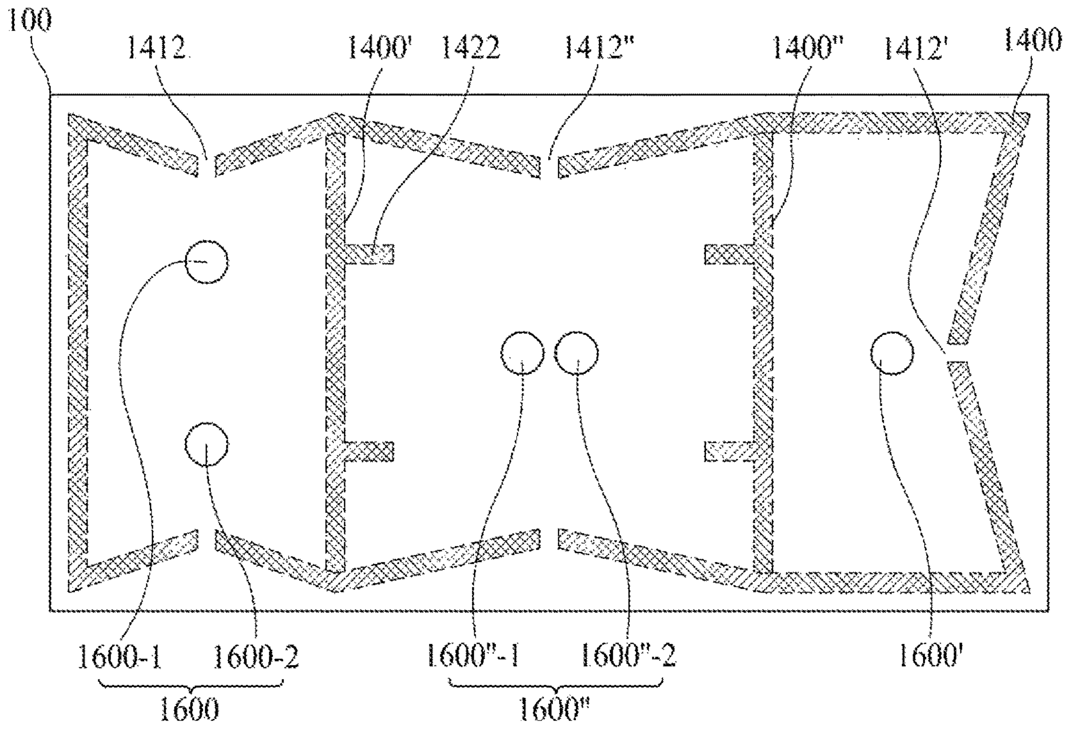
FIG. 21A to 21J illustrate another example embodiment of the sound generating device and partition in the display apparatus according to the present disclosure.
Figure 21B:
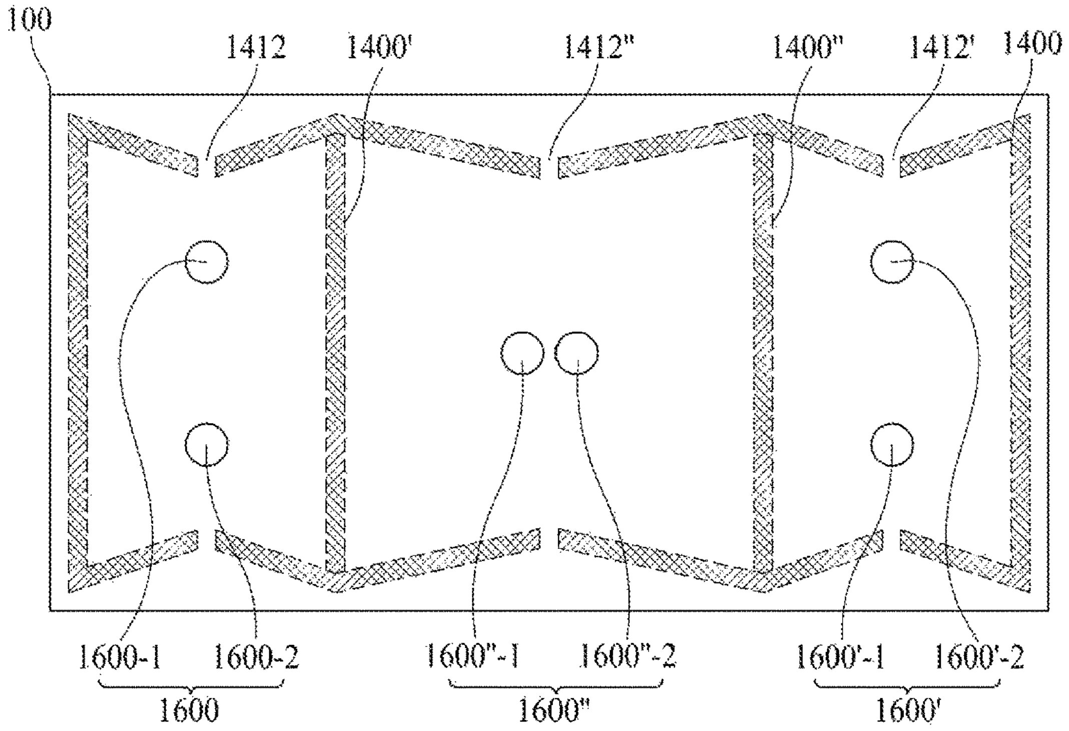
Figure 21C:
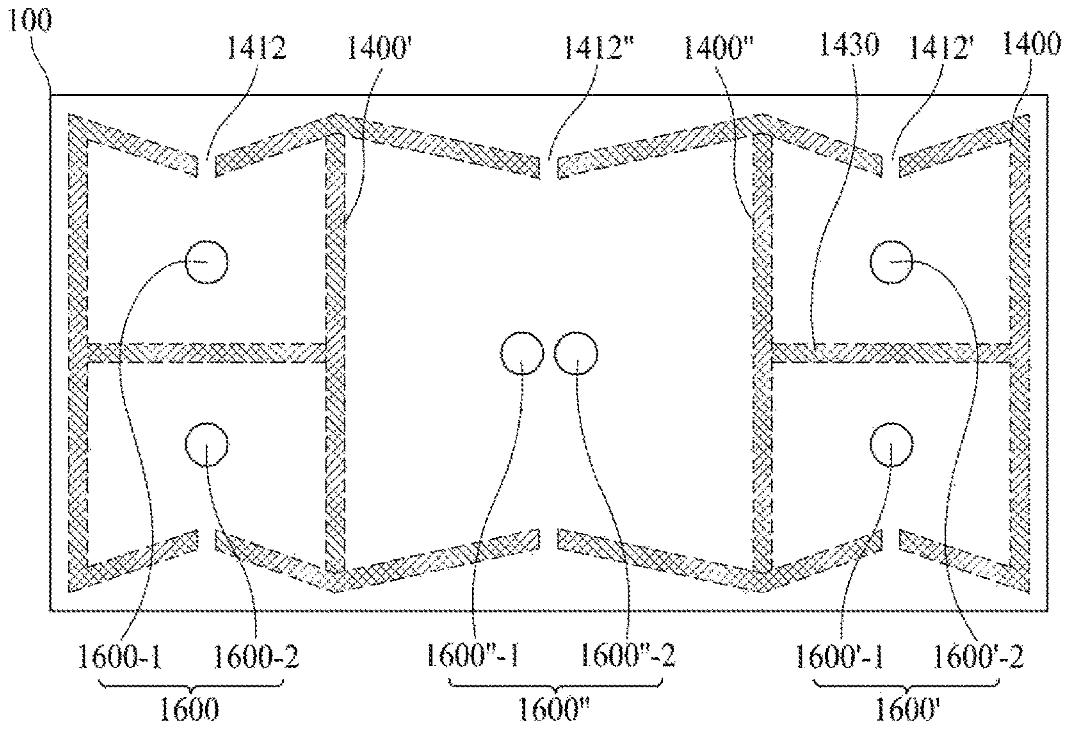
Figure 21D:
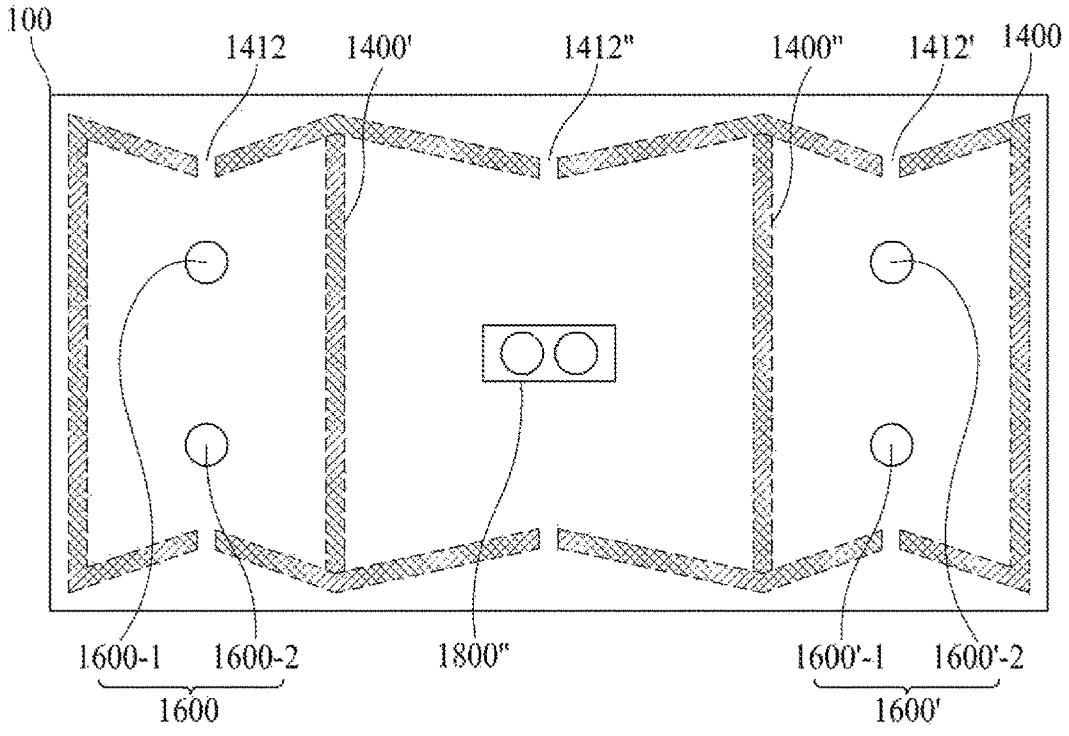
Figure 21E:
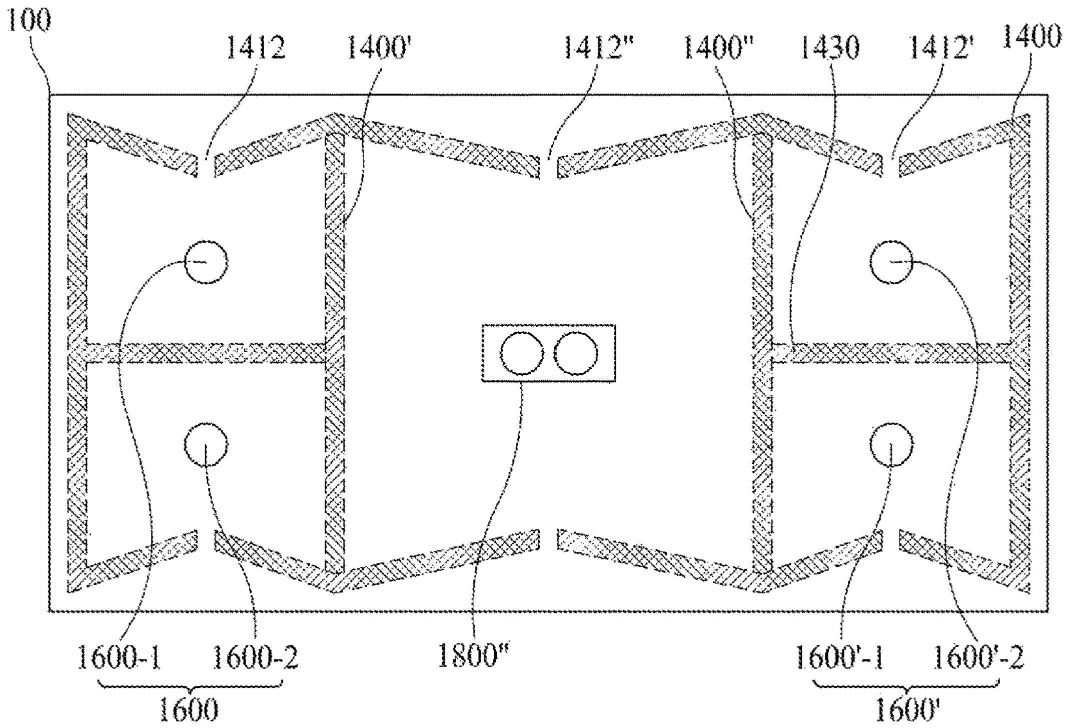

With reference to FIG. 21A, the first sound generating device 1600 including the two sub sound generating devices 1600-1 and 1600-2 is disposed in the first area, the second sound generating device 1600' is disposed in the second area, and the third sound generating device 1600" including the two sub sound generating devices 1600"-1 and 1600"-2 is disposed in the third area. The two sub sound generating devices are adjacent to each other, and are parallel to each other in the horizontal direction or vertical direction of the display panel. In comparison to the sound generating device with the two sub sound generating devices spaced from each other, the sound generating device with the two sub sound generating devices adjacent to each other may be favorable to prevent deterioration of sound quality.

The first sound generating device 1600 disposed in the first area, and the second sound generating device 1600' disposed in the second area may generate the middle-high-pitched sound band, and the third sound generating device 1600" disposed in the third area may generate the low-pitched sound band. In detail, the first sound generating device 1600 of the first area may include the 1-1 sub sound generating device 1600-1 and the 1-2 sub sound generating device 1600-2, and the 1-1 sub sound generating device 1600-1 may generate the high-pitched sound band, and the 1-2 sub sound generating device 1600-2 may generate the middle-pitched sound band. The sound generated in the upper portion of the display panel 100 is a relatively higher sound band than the sound generated in the lower portion of the display panel so that it may be possible to generate the higher sound band.

The first partition 1400' is disposed between the first sound generating device 1600 and the third sound generating device 1600", and the second partition 1400" is disposed between the second sound generating device 1600' and the third sound generating device 1600". The first partition 1400' may prevent the vibration of the display panel 100 from being transferred from the first area to the third area, and the second partition 1400" may prevent the vibration of the display panel 100 from being transferred from the second area to the third area. The third partition 1400 is disposed in the periphery of the display panel 100, and the third partition 1400 is formed in the unsealed structure. In detail, the first bent portion 1412, the second bent portion 1412' and the third bent portion 1412" are formed in the unsealed structure, or at least one of the first bent portion 1412, the second bent portion 1412' and the third bent portion 1412" may be formed in the unsealed structure.

The first bent portion 1412 is provided in the first area, and the first bent portion 1412 is provided toward the center of the two sub sound generating devices 1600-1 and 1600-2 as the first sound generating device 1600. The third bent portion 1412" is provided in the third area, and the third bent portion 1412" is provided toward the center of the two sub sound generating devices 1600"-1 and 1600"-2 as the third sound generating device 1600". If the second sound generating device 1600' is disposed in the second area corresponding to the right area of the display panel 100, the second bent portion 1412', which is bent toward the second sound generating device 1600', is provided in the side which is perpendicular to the side with the first bent portion 1412.

The protrusion portion 1422, which protrudes toward the third sound generating device 1600", is formed in the left and right sides of the third area. The protrusion portion 1422 is provided to decrease the reduction of sound pressure level in the central area of the display panel 100 for the low sound by the standing wave.

As described in FIG. 21A, the protrusion portion, which protrudes toward the third sound generating device 1600", may be further formed in the left and right sides of the third area of the structure shown in FIGS. 21B to 21J, that is, in each of the first partition 1400' and the second partition 1400".

In FIG. 21A, the first sound generating device 1600 is disposed in the center of the left area corresponding to the first area of the display panel 100, but is not limited thereto. The first sound generating device 1600 may be disposed asymmetrically. In detail, the first sound generating device 1600 may be disposed more toward the left area corresponding to the first area of the display panel 100.

The descriptions of FIGS. 21B to 21J may be the same as those of FIGS. 20B to 20J. In FIGS. 21B to 21J, the first bent portion 1412, the second portion 1412' and the third bent portion 1412" are formed in the unsealed structure, or at least one of the first bent portion 1412, the second portion 1412' and the third bent portion 1412" may be formed in the unsealed structure.

In FIGS. 21B to 21E, the first sound generating device 1600 is disposed in the center of the left area corresponding to the first area of the display panel 100, but is not limited thereto. The first sound generating device 1600 may be disposed asymmetrically. In detail, the first sound generating device 1600 may be disposed more toward the left area corresponding to the first area of the display panel 100. The second sound generating device 1600' is disposed in the center of the right area corresponding to the second area of the display panel 100, but is not limited thereto. The second sound generating device 1600' may be disposed asymmetrically. In an example, the second sound generating device 1600' may be disposed more toward the right area corresponding to the second area of the display panel 100. Accordingly, one of the first sound generating device 1600 and the second sound generating device 1600' may be disposed asymmetrically. In an example, at least one of the first sound generating device 1600 and the second sound generating device 1600' may be disposed more toward the left area or right area of the display panel 100, or each of the first sound generating device 1600 and the second sound generating device 1600' may be disposed more toward the left area and right area of the display panel 100.

Figure 21F:
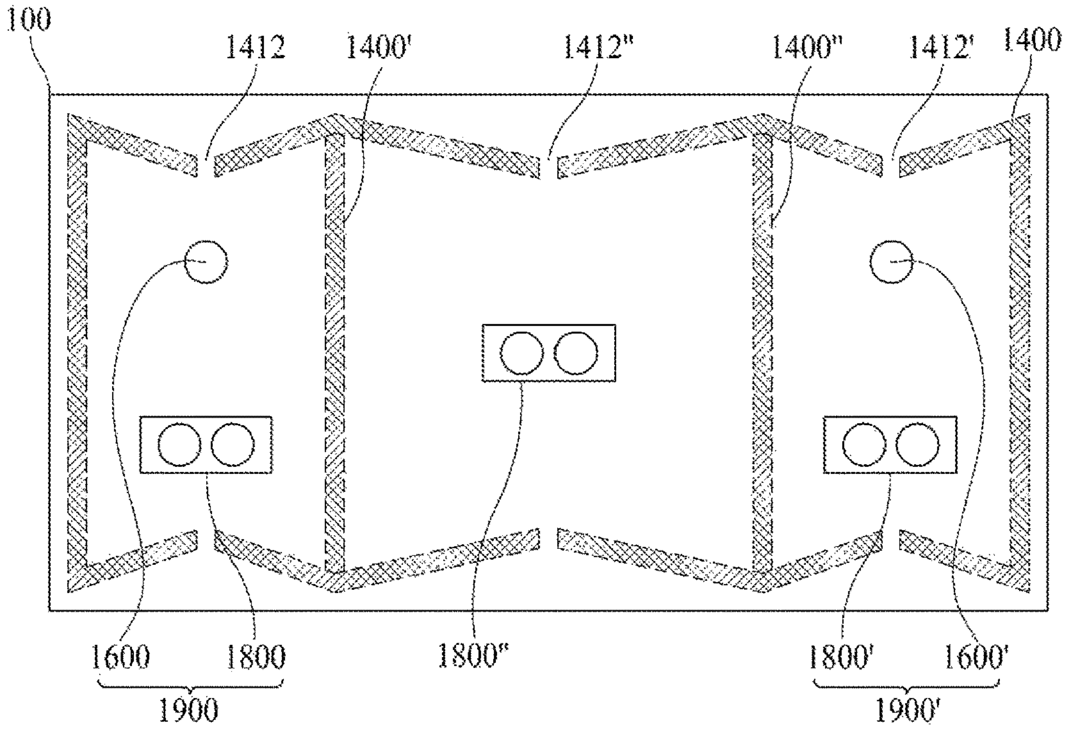
Figure 21G:
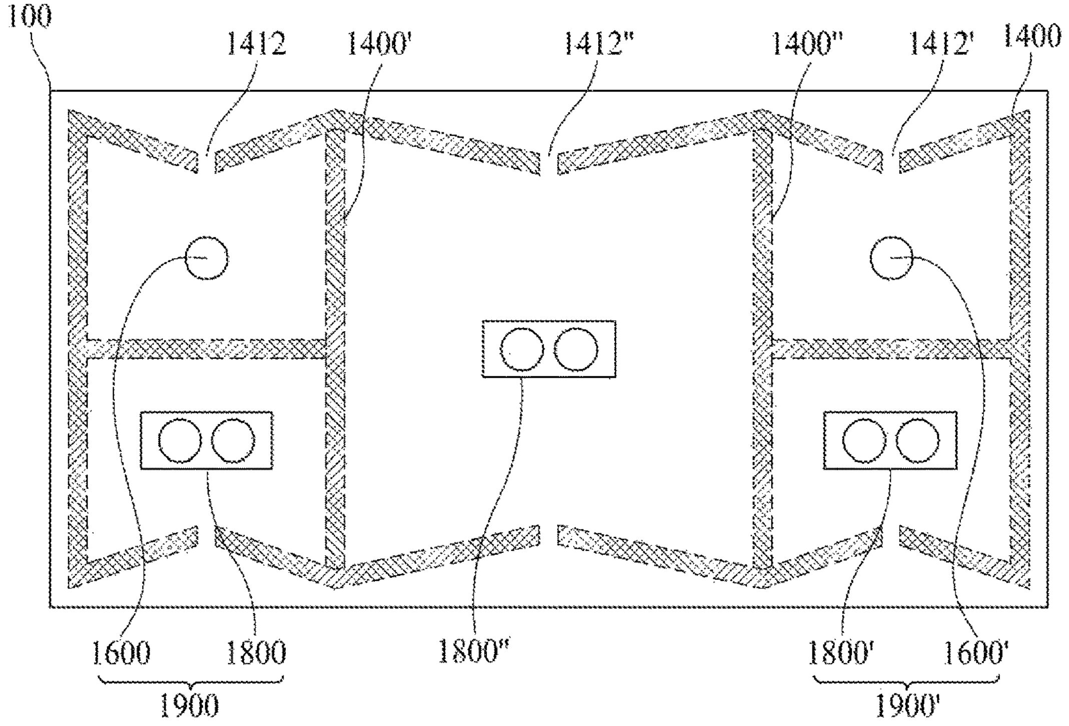

In FIGS. 21F to 21G, the first sound generating device 1900 is disposed in the center of the left area corresponding to the first area of the display panel 100, but is not limited thereto. The first sound generating device 1900 may be disposed asymmetrically. In an example, the first sound generating device 1900 may be disposed more toward the left area corresponding to the first area of the display panel 100. The second sound generating device 1900' is disposed in the center of the right area corresponding to the second area of the display panel 100, but is not limited thereto. The second sound generating device 1900' may be disposed asymmetrically. In an example, the second sound generating device 1900' may be disposed more toward the right area corresponding to the second area of the display panel 100. Accordingly, one of the first sound generating device 1900 and the second sound generating device 1900' may be disposed asymmetrically. In an example, at least one of the first sound generating device 1900 and the second sound generating device 1900' may be disposed more toward the left area or right area of the display panel 100, or each of the first sound generating device 1900 and the second sound generating device 1900' may be disposed more toward the left area and right area of the display panel 100.

Figure 21H:
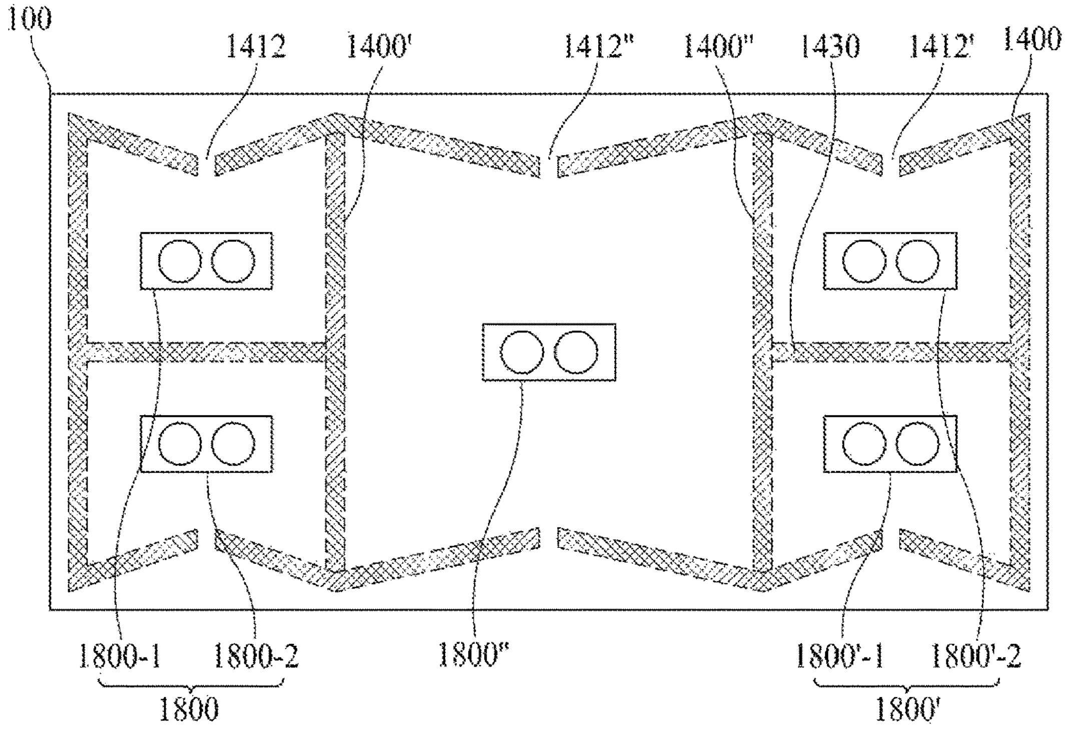

In FIG. 21H, the first sound generating device 1800 is disposed in the center of the left area corresponding to the first area of the display panel 100, but is not limited thereto. The first sound generating device 1800 may be disposed asymmetrically. In an example, the first sound generating device 1800 may be disposed more toward the left area corresponding to the first area of the display panel 100. The second sound generating device 1800' is disposed in the center of the right area corresponding to the second area of the display panel 100, but is not limited thereto. The second sound generating device 1800' may be disposed asymmetrically. In an example, the second sound generating device 1800' may be disposed more toward the right area corresponding to the second area of the display panel 100. Accordingly, one of the first sound generating device 1800 and the second sound generating device 1800' may be disposed asymmetrically. In an example, at least one of the first sound generating device 1800 and the second sound generating device 1800' may be disposed more toward the left area or right area of the display panel 100, or each of the first sound generating device 1800 and the second sound generating device 1800' may be disposed more toward the left area and right area of the display panel 100.

Figure 21I:
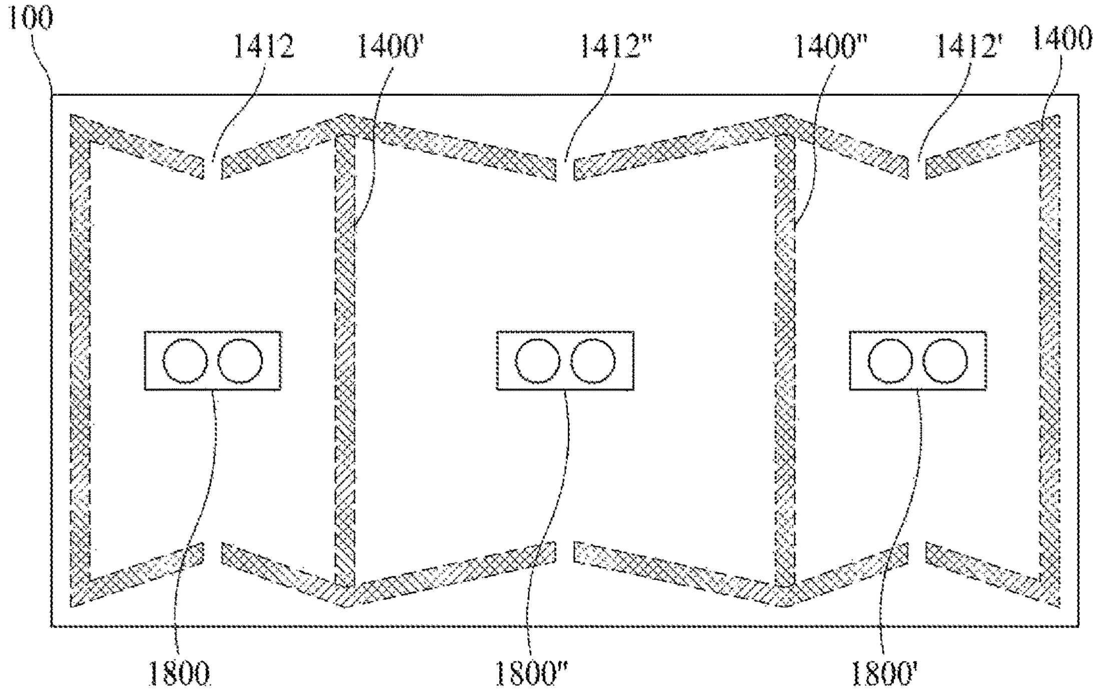

In FIG. 21I, the first sound generating device 1800 is disposed in the center of the left area corresponding to the first area of the display panel 100, but is not limited thereto. The first sound generating device 1800 may be disposed asymmetrically. In an example, the first sound generating device 1800 may be disposed more toward the left area corresponding to the first area of the display panel 100. The second sound generating device 1800' is disposed in the center of the right area corresponding to the second area of the display panel 100, but is not limited thereto. The second sound generating device 1800' may be disposed asymmetrically. In an example, the second sound generating device 1800' may be disposed more toward the right area corresponding to the second area of the display panel 100. Accordingly, one of the first sound generating device 1800 and the second sound generating device 1800' may be disposed asymmetrically. In an example, at least one of the first sound generating device 1800 and the second sound generating device 1800' may be disposed more toward the left area or right area of the display panel 100, or each of the first sound generating device 1800 and the second sound generating device 1800' may be disposed more toward the left area and right area of the display panel 100.

Figure 21J:
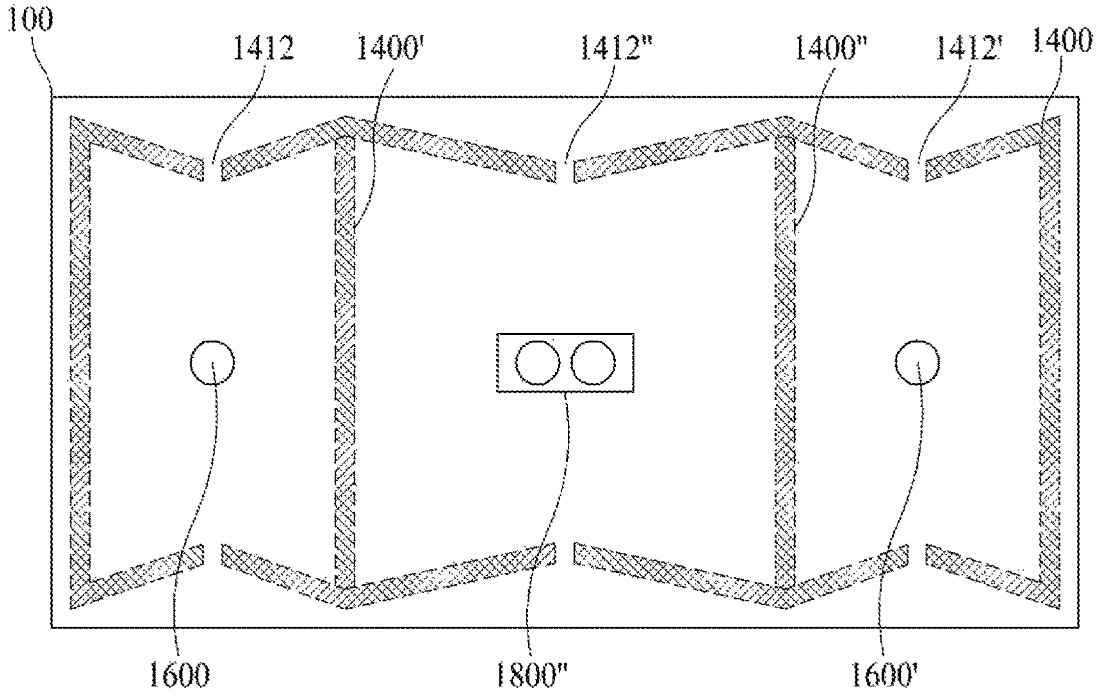

In FIG. 21J, the first sound generating device 1600 is disposed in the center of the left area corresponding to the first area of the display panel 100, but is not limited thereto. The first sound generating device 1600 may be disposed asymmetrically. In an example, the first sound generating device 1600 may be disposed more toward the left area corresponding to the first area of the display panel 100. The second sound generating device 1600' is disposed in the center of the right area corresponding to the second area of the display panel 100, but is not limited thereto. The second sound generating device 1600' may be disposed asymmetrically. In an example, the second sound generating device 1600' may be disposed more toward the right area corresponding to the second area of the display panel 100. Accordingly, one of the first sound generating device 1600 and the second sound generating device 1600' may be disposed asymmetrically. In an example, at least one of the first sound generating device 1600 and the second sound generating device 1600' may be disposed more toward the left area or right area of the display panel 100, or each of the first sound generating device 1600 and the second sound generating device 1600' may be disposed more toward the left area and right area of the display panel 100.

In FIGS. 21A to 21J, the adhesion member for adhering the display panel and the supporting member to each other may be disposed between the periphery of the display panel and the periphery of the supporting member, as explained in FIG. 12.

According to an example embodiment of the present disclosure, a display apparatus comprises a display panel configured to display an image; and a sound generating device on the rear surface of the display panel, the sound generating device includes a plate; a magnet and a center pole disposed on the plate; a bobbin disposed around the center pole; and a protection member disposed on the bobbin.

According to one or more embodiments of the present disclosure, the protection member may be formed of one among fiber reinforced materials, complex resin having fiber reinforced materials, and metal materials, or the combination thereof.

According to one or more embodiments of the present disclosure, the first adhesion member may be disposed between the bobbin and the protection member.

According to one or more embodiments of the present disclosure, the first adhesion member may be formed of epoxy resin or acryl resin.

According to one or more embodiments of the present disclosure, the second adhesion member may be disposed between the protection member and the display panel.

According to one or more embodiments of the present disclosure, the second adhesion member may be formed of double-sided tape.

According to one or more embodiments of the present disclosure, the display apparatus may further include a heat-dissipation member disposed between the display panel and the sound generating device.

According to one or more embodiments of the present disclosure, the display apparatus may further include a supporting member disposed on the rear surface of the display panel and configured to support the sound generating device.

According to one or more embodiments of the present disclosure, the supporting member may be formed of one among metal, glass and plastic materials, or at least two among metal, glass and plastic materials.

According to one or more embodiments of the present disclosure, a display apparatus includes a display panel configured to display an image, the display panel having a first area and a second area; a sound generating device disposed on the first and second areas; a protection member disposed on the sound generating device; and at least one partition disposed between the first and second areas.

According to one or more embodiments of the present disclosure, the sound generating device may include the magnet, the center pole, the bobbin and the coil, and the protection member is disposed on the bobbin.

According to one or more embodiments of the present disclosure, the sound generating device may include at least one sound generating device, and the at least one sound generating device is disposed in each of the first and second areas.

According to one or more embodiments of the present disclosure, the sound generating device may include one pair of sound generating devices, and the one pair of sound generating devices is disposed in each of the first and second areas.

According to one or more embodiments of the present disclosure, the display apparatus may further include at least one low sound generating device disposed at an outer portion of the display panel.

According to one or more embodiments of the present disclosure, the display apparatus may further includes at least one low sound generating device disposed at an outer portion of the display panel corresponding to each of the first and second areas.

According to one or more embodiments of the present disclosure, the display apparatus may further include a heat-dissipation member disposed between the display panel and the protection member.

According to one or more embodiments of the present disclosure, the display apparatus may further include a third partition in the periphery of the display panel, wherein the bent portion that is bent toward the sound generating device may be in at least one of a first side among four sides of the third partition.

According to one or more embodiments of the present disclosure, the display apparatus may further include a third partition in the periphery of the display panel, wherein a bent portion that is bent toward the sound generating device may be in at least one of a first side among four sides of the third partition, and one or more protrusion may be in at least one of a second side that is perpendicular to the first side.

According to one or more embodiments of the present disclosure, the sound generating device may vibrate the display panel so as to generate middle-high-pitched sound band in the first and second areas.

According to an embodiment of the present disclosure, the display apparatus includes a display panel configured to display an image, the display panel having first, second and third areas; a sound generating device disposed on at least one of the first, second and third areas; a protection member disposed on the sound generating device; at least one of a first partition between the first area and the third area; and at least one of a second partition between the second area and the third area.

According to one or more embodiments of the present disclosure, the sound generating device may include the magnet, the center pole, the bobbin and the coil, and the protection member may be disposed on the bobbin.

According to one or more embodiments of the present disclosure, first area may correspond to a right area of the display panel, the second area may correspond to a left area of the display panel, and the third area may correspond to a central area of the display panel.

According to one or more embodiments of the present disclosure, the display apparatus may further include a third partition in the periphery of the display panel, wherein the bent portion which is bent toward the sound generating device may be formed in at least one of a first side among four sides of the third partition.

According to one or more embodiments of the present disclosure, the display apparatus may further include a third partition in the periphery of the display panel, wherein the bent portion that is bent toward the sound generating device is in at least one of a first side among four sides of the third partition, and one or more protrusion is in at least one of a second side that is perpendicular to the first side.

According to one or more embodiments of the present disclosure, the display panel may include a first side, and a second side that is perpendicular to the first side, and one or more protrusions that protrude toward the sound generating device may be in at least one of the second side of the first partition and the second side of the second partition.

According to one or more embodiments of the present disclosure, the sound generating device may include at least one sound generating device or at least one pair of sound generating devices, and at least one sound generating device or at least one pair of sound generating devices may be disposed in each of the first area and the second area.

According to one or more embodiments of the present disclosure, at least one sound generating device may be disposed in the first area and the second area, and at least one pair of sound generating devices may be disposed in the third area.

According to one or more embodiments of the present disclosure, at least one sound generating device may include two sub sound generating devices, wherein the two sub sound generating devices respectively may generate middle-pitched sound band and high-pitched sound band, and at least one pair of sound generating devices may generate low-pitched sound band.

According to one or more embodiments of the present disclosure, at least one sound generating device and at least one pair of sound generating devices may be disposed in the first area and the second area, and at least one pair of sound generating devices may be disposed in the third area.

According to one or more embodiments of the present disclosure, at least one sound generating device in the first area and the second area may generate high-pitched sound band, at least one pair of sound generating devices in the first area and the second area may generates middle-pitched sound band, and at least one pair of sound generating devices in the third area may generate low-pitched sound band.

According to one or more embodiments of the present disclosure, at least one sound generating device and at least one pair of sound generating devices may be e disposed in the first area and the second area, at least one pair of sound generating devices may be disposed in the third area, and a fourth partition may be disposed between at least one sound generating device and at least one pair of sound generating devices in one of the first area and the second area.

According to one or more embodiments of the present disclosure, at least one sound generating device may be disposed in each of the first, second and third areas.

According to one or more embodiments of the present disclosure, at least one pair of sound generating devices may be disposed in each of the first, second and third areas.

According to an example embodiment of the present disclosure, a display apparatus may comprise a display panel configured to display an image by emitting light; and a sound generating device on a rear surface of the display panel and configured to vibrate the display panel to generate sound, wherein the sound generating device includes: a bobbin; and a protection member on the bobbin.

According to one or more embodiments of the present disclosure, the protection member may be formed of at least one among fiber reinforced materials, complex resin having fiber reinforced materials, and metal.

According to one or more embodiments of the present disclosure, a first adhesion member may be between the bobbin and the protection member.

According to one or more embodiments of the present disclosure, the first adhesion member may be formed of epoxy resin or acryl resin.

According to one or more embodiments of the present disclosure, a second adhesion member may be between the protection member and the display panel.

According to one or more embodiments of the present disclosure, the second adhesion member may be formed of a double-sided tape.

According to one or more embodiments of the present disclosure, the display apparatus may further include a heat-dissipation member between the display panel and the sound generating device.

According to one or more embodiments of the present disclosure, the display apparatus may further include a supporting member on the rear surface of the display panel that is configured to support the sound generating device, wherein the supporting member is formed of at least one among metal, glass, and plastic materials.

According to one or more embodiments of the present disclosure, a display apparatus may comprise a display panel configured to display an image by emitting light, the display panel having a first area and a second area; at least one sound generator including a sound generating device configured to vibrate the display panel to generate sound and a protection member on the sound generating device; and at least one partition between the first and second areas, wherein a first of the at least one sound generator is in one of the first and second areas of the display panel.

According to one or more embodiments of the present disclosure, the sound generating device may include a magnet, a center pole, a bobbin, and a coil, and the protection member is on the bobbin.

According to one or more embodiments of the present disclosure, a second of the at least one sound generator may be disposed in the other of the first and second areas.

According to one or more embodiments of the present disclosure, the sound generating device in each of the first area and the second area may include a pair of sub sound generating devices.

According to one or more embodiments of the present disclosure, the display apparatus may further include at least one low sound generating device at an outer portion of the display panel.

According to one or more embodiments of the present disclosure, the display apparatus may further include a low sound generating device at an outer portion of the display panel in each of the first and second areas.

According to one or more embodiments of the present disclosure, the display apparatus may further include a heat-dissipation member between the display panel and the protection member of the at least one sound generator.

According to one or more embodiments of the present disclosure, the display apparatus may further include a third partition in a periphery of the display panel, at least a first side among four sides of the third partition having a bent portion that is bent toward the first of the at least one sound generator.

According to one or more embodiments of the present disclosure, the display apparatus may further include one or more protrusions disposed toward the first of the at least one sound generator from at least one side among the four sides of the third partition that is perpendicular to the first side.

According to one or more embodiments of the present disclosure, the sound generating device may be configured to vibrate the display panel to generate a middle-high-pitched sound band in the first and second areas.

According to one or more embodiments of the present disclosure, a display apparatus may comprise a display panel configured to display an image by emitting light, the display panel having first, second, and third areas; a sound generating device in each of the first and second areas of the display panel and configured to vibrate the display panel to generate sound; a protection member on the sound generating device; at least one first partition between the first area and the third area; and at least one second partition between the second area and the third area.

According to one or more embodiments of the present disclosure, the sound generating device may include a magnet, a center pole, a bobbin, and a coil, and the protection member is on the bobbin.

According to one or more embodiments of the present disclosure, the display apparatus may further include a third partition in a periphery of the display panel, at least a first side among four sides of the third partition having a bent portion that is bent toward the sound generating device.

According to one or more embodiments of the present disclosure, the display apparatus may further include one or more protrusions disposed toward the sound generating device from at least one side among the four sides of the third partition that is perpendicular to the first side.

According to one or more embodiments of the present disclosure, each of the first and second partitions may include a first side and a second side that is perpendicular to the first side, and one or more protrusions protrude toward the sound generating device from at least one of the second side of the first partition and the second side of the second partition.

According to one or more embodiments of the present disclosure, the display apparatus may further include a sound generating device in the third area.

According to one or more embodiments of the present disclosure, the sound generating device in the third area may include a pair of sub sound generating devices.

According to one or more embodiments of the present disclosure, the display apparatus may include another sound generating device in at least one of the first and second areas.

According to one or more embodiments of the present disclosure, the sound generating device and the another sound generating device may be respectively configured to generate a high-pitched sound band and a middle-pitched sound band.

According to one or more embodiments of the present disclosure, the display apparatus may further include a sound generating device in the third area, the sound generating device in the third area is configured to generate a low-pitched sound band.

According to one or more embodiments of the present disclosure, the another sound generating device in at least one of the first area and the second area may include a pair of sub sound generating devices.

According to one or more embodiments of the present disclosure, the display apparatus may further include a third partition in a periphery of the display panel; and a fourth partition between the sound generating device and the another sound generating device in at least one of the first area and the second area.

According to example embodiments of the present disclosure, the display apparatus includes the sound generating device capable of generating sound by vibrating the display panel, whereby the sound is output to the front direction of the display panel, to thereby improve a user's immersion.

And, the display apparatus according to example embodiments of the present disclosure includes the sound generating device capable of generating sound by vibrating the display panel. Thus, there is no need for a separate speaker, enabling improvements on the degree of freedom in the design of the set apparatus as it relates to disposition of the speaker.

In case of the display apparatus according to example embodiments of the present disclosure, the supporting member and the sound generating device are fixed by the use of screw and nut in the supporting member, to thereby reduce the thickness of the display panel.

According as the display apparatus according to example embodiments of the present disclosure includes the fixing device for fixing the two sound generating devices, it is possible to generate the uniform sound pressure in the entire frequency range.

And, the display apparatus according to example embodiments of the present disclosure includes the fixing device for fixing the two sound generating devices, and the plurality of rib portions disposed in the periphery of the sound generating device so that it is possible to maintain hardness of the sound generating device, and to reduce and/or minimize the change of sound output characteristics even in a case of long-time use.

And, as the display apparatus according to example embodiments of the present disclosure includes the protection member disposed on the sound generating device, the protection member and the display panel are adhered to each other, to thereby improve the adhesive strength between the sound generating device and the display panel.

And, the display apparatus according to example embodiments of the present disclosure includes the heat-dissipation member disposed on the display panel so that it may be possible to improve the sound output characteristics in the low sound, and to prevent picture quality of the display panel from being deteriorated by the heat generated in accordance with the driving of the sound generating device.

As the display apparatus according to example embodiments of the present disclosure includes at least one partition disposed between the sound generating devices, it enables the separation of sound by the partition, so that it may be possible to realize the stereo sound, and to improve the sound output characteristics.

And, the display apparatus according to example embodiments of the present disclosure includes the sound generating device for generating the middle-high-pitched sound band by vibrating the display panel, and the low sound generating device for generating the low-pitched sound band so that it is possible to realize the good sound output characteristics in the entire frequency range.

In the display apparatus according to example embodiments of the present disclosure, the low sound generating device is disposed in the central area of the display panel, and the middle-high-pitched sound band generating devices are respectively disposed in the left and right areas of the display panel, so that it is possible to realize the good sound output characteristics in the wide sound range, and to realize the stereo sound output, and the sound output characteristics of 2.1 channel type.

And, the display apparatus according to example embodiments of the present disclosure includes the partition with the bent portion or the protrusion portion so that it is possible to prevent deterioration of sound quality caused by the standing wave or reflected wave in the display panel, and to improve the sound output characteristics.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A display apparatus, comprising:
- a display panel configured to display an image by emitting light;
- a sound generating device on a rear surface of the display panel and configured to vibrate the display panel to generate sound,
- wherein the sound generating device includes:
  - a bobbin;
  - a protection member on the bobbin; and
  - a first adhesion member between the bobbin and the protection member; and
- a heat-dissipation member between the display panel and the sound generating device.

2. The display apparatus according to claim 1, wherein the protection member is formed of at least one among fiber reinforced materials, complex resin having fiber reinforced materials, and metal.

3. The display apparatus according to claim 1, wherein the first adhesion member is formed of epoxy resin or acryl resin.

4. The display apparatus according to claim 1, wherein a second adhesion member is between the protection member and the display panel.

5. The display apparatus according to claim 4, wherein the second adhesion member is formed of a double-sided tape.

6. The display apparatus according to claim 1, further comprising a supporting member on the rear surface of the display panel that is configured to support the sound generating device, wherein the supporting member is formed of at least one among metal, glass, and plastic materials.

7. A display apparatus, comprising:
- a display panel configured to display an image by emitting light, the display panel having a first area and a second area;
- at least one sound generator including a sound generating device configured to vibrate the display panel to generate sound and a protection member on the sound generating device,
- wherein a first adhesion member is between the sound generating device and the protection member;
- at least one partition between the first and second areas,
- wherein a first of the at least one sound generator is in one of the first and second areas of the display panel; and a heat-dissipation member between the display panel and the protection member of the at least one sound generator.

8. The display apparatus according to claim 7, wherein the sound generating device includes a magnet, a center pole, a bobbin, and a coil, and the protection member is on the bobbin.

9. The display apparatus according to claim 7, wherein a second of the at least one sound generator is disposed in the other of the first and second areas.

10. The display apparatus according to claim 9, wherein the sound generating device in each of the first area and the second area includes a pair of sub sound generating devices.

11. The display apparatus according to claim 7, further comprising at least one low sound generating device at an outer portion of the display panel.

12. The display apparatus according to claim 7, further comprising a low sound generating device at an outer portion of the display panel in each of the first and second areas.

13. The display apparatus according to claim 7, further comprising:

a third partition in a periphery of the display panel, at least a first side among four sides of the third partition having a bent portion that is bent toward the first of the at least one sound generator.

14. The display apparatus according to claim 13, further comprising:

one or more protrusions disposed toward the first of the at least one sound generator from at least one side among the four sides of the third partition that is perpendicular to the first side.

15. The display apparatus according to claim 7, wherein the sound generating device is configured to vibrate the display panel to generate a middle-high-pitched sound band in the first and second areas.

16. A display apparatus, comprising:

a display panel configured to display an image by emitting light, the display panel having first, second, and third areas;

a sound generating device in each of the first and second areas of the display panel and configured to vibrate the display panel to generate sound;

a protection member on the sound generating device;

a first adhesion member between the sound generating device and the protection member;

at least one first partition between the first area and the third area;

at least one second partition between the second area and the third area; and a heat-dissipation member between the display panel and the sound generating device.

17. The display apparatus according to claim 16, wherein the sound generating device includes a magnet, a center pole, a bobbin, and a coil, and the protection member is on the bobbin.

18. The display apparatus according to claim 16, further comprising a third partition in a periphery of the display panel, at least a first side among four sides of the third partition having a bent portion that is bent toward the sound generating device.

19. The display apparatus according to claim 18, further comprising:

one or more protrusions disposed toward the sound generating device from at least one side among the four sides of the third partition that is perpendicular to the first side.

20. The display apparatus according to claim 16, wherein:

each of the first and second partitions includes a first side and a second side that is perpendicular to the first side, and one or more protrusions protrude toward the sound generating device from at least one of the second side of the first partition and the second side of the second partition.

21. The display apparatus according to claim 16, further comprising: a sound generating device in the third area.

22. The display apparatus according to claim 21, wherein the sound generating device is in the third area includes a pair of sub sound generating devices.

23. The display apparatus according to claim 16, further comprising:

another sound generating device in at least one of the first and second areas.

24. The display apparatus according to claim 23, wherein the sound generating device and the another sound generating device are respectively configured to generate a high-pitched sound band and a middle-pitched sound band.

25. The display apparatus according to claim 24, further comprising a sound generating device in the third area, wherein the sound generating device in the third area is configured to generate a low-pitched sound band.

26. The display apparatus according to claim 23, wherein the another sound generating device in at least one of the first area and the second area includes a pair of sub sound generating devices.

27. The display apparatus according to claim 23, further comprising:

a third partition in a periphery of the display panel; and a fourth partition between the sound generating device and the another sound generating device in at least one of the first area and the second area.

* * * * *